(12) United States Patent
Ushikubo et al.

(10) Patent No.: US 8,251,765 B2
(45) Date of Patent: Aug. 28, 2012

(54) LIGHT-EMITTING DEVICE

(75) Inventors: Takahiro Ushikubo, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/272,715

(22) Filed: Oct. 13, 2011

(65) Prior Publication Data

US 2012/0040482 A1    Feb. 16, 2012

Related U.S. Application Data

(63) Continuation of application No. 12/251,644, filed on Oct. 15, 2008, now Pat. No. 8,040,047.

(30) Foreign Application Priority Data

Oct. 19, 2007   (JP) .................................. 2007-272227

(51) Int. Cl.
*H01L 51/54* (2006.01)
*H01L 51/56* (2006.01)

(52) U.S. Cl. ........... 445/24; 313/503; 313/504; 428/690

(58) Field of Classification Search .................... 445/24, 445/25; 313/500–512; 427/66; 428/690
See application file for complete search history.

(56) References Cited

U.S. PATENT DOCUMENTS

| | | | |
|---|---|---|---|
| 6,603,150 B2 | 8/2003 | Liao et al. | |
| 6,803,120 B2 | 10/2004 | Fukuoka et al. | |
| 6,998,487 B2 | 2/2006 | Kim et al. | |
| 7,163,831 B2 | 1/2007 | Hasegawa et al. | |
| 7,173,370 B2 | 2/2007 | Seo et al. | |
| 7,192,659 B2 | 3/2007 | Ricks et al. | |
| 7,196,360 B2 | 3/2007 | Seo et al. | |
| 7,268,484 B2 | 9/2007 | Nakamura | |
| 7,365,360 B2 | 4/2008 | Kang et al. | |
| 8,040,047 B2 * | 10/2011 | Ushikubo et al. | 313/504 |

(Continued)

FOREIGN PATENT DOCUMENTS

EP    1 718 122 A1    11/2006

(Continued)

OTHER PUBLICATIONS

Zhang, Z.-L. et al, "Blue/White Organic Light Emitting Diodes and Passive Matrix Display," Proceedings of SPIE, vol. 5632, 2005, pp. 45-52.

(Continued)

*Primary Examiner* — Mariceli Santiago
(74) *Attorney, Agent, or Firm* — Husch Blackwell LLP

(57) ABSTRACT

To provide a long lifetime light-emitting element, in particular, to provide a long lifetime white light-emitting element, and to provide a light-emitting element having high luminous efficiency, in particular, to provide a white light-emitting element having high luminous efficiency. In a light-emitting element having, between an anode and a cathode, a first light-emitting layer containing a first light-emitting substance and a second light-emitting layer containing a second light-emitting substance which is provided to be in contact with the first light-emitting layer, the first light-emitting layer is divided into a layer provided on the anode side and a layer provided on the cathode side. At this time, a host material having a hole-transporting property is used for the layer provided on the anode side, and a host material having an electron-transporting property is used for the layer provided on the cathode side.

18 Claims, 46 Drawing Sheets

U.S. PATENT DOCUMENTS

| | | |
|---|---|---|
| 2002/0086180 A1 | 7/2002 | Seo et al. |
| 2002/0093283 A1 | 7/2002 | Seo et al. |
| 2002/0109136 A1 | 8/2002 | Seo et al. |
| 2002/0113546 A1 | 8/2002 | Seo et al. |
| 2002/0121860 A1 | 9/2002 | Seo et al. |
| 2002/0139303 A1 | 10/2002 | Yamazaki et al. |
| 2002/0155632 A1 | 10/2002 | Yamazaki et al. |
| 2003/0010288 A1 | 1/2003 | Yamazaki et al. |
| 2004/0154542 A1 | 8/2004 | Yamazaki et al. |
| 2004/0241491 A1 | 12/2004 | Hatwar |
| 2005/0100760 A1 | 5/2005 | Yokoyama |
| 2005/0179378 A1 | 8/2005 | Oooka et al. |
| 2005/0260440 A1 | 11/2005 | Seo et al. |
| 2006/0210828 A1 | 9/2006 | Nakayama et al. |
| 2006/0243967 A1 | 11/2006 | Nomura et al. |
| 2006/0243970 A1 | 11/2006 | Seo et al. |
| 2006/0292394 A1 | 12/2006 | Iwaki et al. |
| 2007/0015006 A1 | 1/2007 | Lee et al. |
| 2007/0020483 A1 | 1/2007 | Park et al. |
| 2007/0020484 A1 | 1/2007 | Kim et al. |
| 2007/0108892 A1 | 5/2007 | Bae et al. |
| 2007/0122656 A1 | 5/2007 | Klubek et al. |
| 2007/0159083 A1 | 7/2007 | Matsuura et al. |
| 2007/0200490 A1 | 8/2007 | Kawamura et al. |
| 2007/0216292 A1 | 9/2007 | Seo et al. |
| 2008/0006822 A1 | 1/2008 | Ohsawa |
| 2008/0130278 A1 | 6/2008 | Ushikubo et al. |
| 2009/0053559 A1 | 2/2009 | Spindler et al. |
| 2009/0058278 A1 | 3/2009 | Ushikubo et al. |
| 2009/0085479 A1 | 4/2009 | Ushikubo |
| 2009/0140634 A1 | 6/2009 | Nomura et al. |
| 2009/0146552 A1 | 6/2009 | Spindler et al. |

FOREIGN PATENT DOCUMENTS

| | | |
|---|---|---|
| JP | 6-158038 | 6/1994 |
| JP | 2001-319779 | 11/2001 |
| JP | 2004-6165 | 1/2004 |
| JP | 2005-11734 | 1/2005 |
| JP | 2005-11735 | 1/2005 |
| JP | 2005-235403 | 9/2005 |
| JP | 2006-49057 | 2/2006 |
| JP | 2007-201491 | 8/2007 |
| WO | WO 2005/079118 A1 | 8/2005 |
| WO | WO 2007/139124 A1 | 12/2007 |

OTHER PUBLICATIONS

Kajii, H. et al, "Study of Transient Electroluminescence Process Using Organic Light-Emitting Diode with Partial Doping Layer," Japanese Journal of Applied Physics, vol. 45, No. 4B, 2006, pp. 3721-3724.

International Search Report re application No. PCT/JP2007/060940, dated Aug. 21, 2007.

Written Opinion re application No. PCT/JP2007/060940, dated Aug. 21, 2007.

European Search Report re application No. EP 08018185.2, dated Mar. 16, 2009.

\* cited by examiner

—◇— Light-Emitting Element 5

—◇— Light-Emitting Element 5

LIGHT-EMITTING DEVICE

This application is a continuation of U.S. application Ser. No. 12/251,644 filed on Oct. 15, 2008 now U.S. Pat. No. 8,040,047.

BACKGROUND OF THE INVENTION

1. Field of the Invention

The present invention relates to a current-excitation light-emitting element. In addition, the present invention relates to a light-emitting device and an electronic device having the light-emitting element.

2. Description of the Related Art

In recent years, research and development have been actively conducted on light-emitting elements using electroluminescence. In a basic structure of such a light-emitting element, a layer containing a light-emitting substance is interposed between a pair of electrodes. By applying voltage to this element, light emission from the light-emitting substance can be obtained.

Light-emitting elements using electroluminescence are broadly classified according to whether the light-emitting substance is an organic compound or an inorganic compound.

In the case where an organic compound is used for the light-emitting substance, by applying voltage to a light-emitting element, electrons and holes are injected from a pair of electrodes into a layer containing a light-emitting substance, so that current flows therethrough. Then, by recombination of these carriers (electrons and holes), the light-emitting substance forms an excited state, and emits light when the excited state returns to a ground state. Because of such a mechanism, such a light-emitting element is called a current-excitation light-emitting element.

In such a manner, the current-excitation light-emitting element using an organic compound as a light-emitting substance can be manufactured to be thin and lightweight and can be driven at low voltage. Therefore, the current-excitation light-emitting element is thought to be suitable for a next-generation flat panel display element. In addition, response speed being extremely fast is also one of the characteristics, and it is also an advantage to realize high image quality with the application to the display.

Moreover, since these light-emitting elements are formed in film forms, planar light emission in a large area can be easily obtained. This implies that a "surface light source" which is difficult to obtain by a point light source typified by incandescent lamps and LEDs or by a line light source typified by fluorescent lights can be formed easily. Therefore, utility value as a surface light source that can be applied to lighting or the like is also high.

However, although these light-emitting elements can provide various emission colors depending on kinds of light-emitting substances, development of a light-emitting element emitting white light is important in consideration of application to a flat panel display or lighting. This is because, with combination of a white light-emitting element and a color filter, not only a full-color display can be realized but also white light is an emission color with the highest demand in lighting.

A plurality of organic compounds which show different emission colors are combined, so that light emission having a broad spectrum or white light emission can be obtained. However, luminous efficiency or lifetime of the light-emitting element as described above is a great problem, which is similar to those in a white light-emitting element.

In order to solve these problems, luminous efficiency or lifetime of the white light-emitting element is improved by applying a specific substance in, for example, Patent Document 1: Japanese Published Patent Application No. 2007-201491. However, the measure is yet inadequate in consideration of practical application.

SUMMARY OF THE INVENTION

In view of the above-described problems, an object of the present invention is to provide a long lifetime light-emitting element, in particular, to provide a long lifetime white light-emitting element. In addition, another object of the present invention is to provide a light-emitting element having high luminous efficiency, in particular, to provide a white light-emitting element having high luminous efficiency.

Further, another object of the present invention is to provide a light-emitting device or an electronic device which is highly reliable by applying a light-emitting element of the present invention to a light-emitting device or an electronic device. Furthermore, another object of the present invention is to provide a light-emitting device or an electronic device having low power consumption.

A first light-emitting layer containing a first light-emitting substance is provided between an anode and a cathode and a second light-emitting layer containing a second light-emitting substance which is provided in contact with the first light-emitting layer is further provided, so that a light-emitting element in which both light emission from the first light-emitting substance and light emission from the second light-emitting substance can be obtained can be manufactured.

In the above element structure, as a result of diligent study, the present inventors have found that the problem can be solved in the following manner: the first light-emitting layer is divided into two layers of a layer provided on the anode side and a layer provided on the cathode side, a first organic compound and the first light-emitting substance are contained in the layer provided on the anode side, a second organic compound which is different from the first organic compound and the first light-emitting substance are contained in the layer provided on the cathode side, and further not only the second light-emitting substance but also a third organic compound are contained in the second light-emitting layer which is provided in contact with the first light-emitting layer.

Further, the second light-emitting layer provided in contact with the first light-emitting layer contains not only the second light-emitting substance but also the third organic compound; therefore, a carrier-transporting property can be controlled. Accordingly, the second light-emitting layer can be provided on the anode side or the cathode side of the first light-emitting layer.

Therefore, according to one of structures of the present invention, a light-emitting element includes a first light-emitting layer between an anode and a cathode; and a second light-emitting layer which is provided in contact with the anode side of the first light-emitting layer, in which the first light-emitting layer includes a layer provided on the anode side and a layer provided on the cathode side, the layer provided on the anode side contains a first organic compound and a first light-emitting substance, the layer provided on the cathode side contains a second organic compound and the first light-emitting substance, the second light-emitting layer contains a third organic compound and a second light-emitting substance, and light emission from the first light-emitting substance and light emission from the second light-emitting substance can be obtained.

In this case, a carrier recombination region in the first light-emitting layer is preferably inside the first light-emitting layer instead of an interface thereof. Therefore, it is preferable that the layer provided on the anode side have a hole-transporting property and the layer provided on the cathode side have an electron-transporting property. In this case, since the second light-emitting layer is provided on the anode side of the first light-emitting layer, up to the first light-emitting layer also has a function of transporting holes. Thus, the second light-emitting layer preferably has a hole-transporting property.

Here, in the above-described structure, the first organic compound, the second organic compound, and the third organic compound are preferably so-called host materials in order to control a carrier-transporting property in each layer. Therefore, according to another structure of the present invention, a light-emitting element includes a first light-emitting layer between an anode and a cathode; and a second light-emitting layer which is provided in contact with the anode side of the first light-emitting layer, in which the first light-emitting layer includes a layer provided on the anode side and a layer provided on the cathode side, the layer provided on the anode side contains a first organic compound and a first light-emitting substance, the content of the first organic compound in the layer provided on the anode side is greater than or equal to 50 wt % and less than or equal to 99.9 wt %, the layer provided on the cathode side contains a second organic compound and the first light-emitting substance, the content of the second organic compound in the layer provided on the cathode side is greater than or equal to 50 wt % and less than or equal to 99.9 wt %, the second light-emitting layer contains a third organic compound and a second light-emitting substance, and the content of the third organic compound in the second light-emitting layer is greater than or equal to 50 wt % and less than or equal to 99.9 wt %.

In this case, a carrier recombination region in the first light-emitting layer is preferably inside the first light-emitting layer instead of an interface thereof. Therefore, it is preferable that the first organic compound have a hole-transporting property and the second organic compound have an electron-transporting property. In this case, since the second light-emitting layer is provided on the anode side of the first light-emitting layer, up to the first light-emitting layer also has a function of transporting holes. Thus, the third organic compound preferably has a hole-transporting property.

Here, in the above-described light-emitting element of the present invention, an interface between the layer provided on the anode side and the layer provided on the cathode side is a region where the densities of both holes and electrons are high. Therefore, since the first organic compound contained in the layer provided on the anode side and the second organic compound contained in the layer provided on the cathode side are preferably stable with respect to both oxidation and reduction, any of the first organic compound and the second organic compound is preferably tricyclic, tetracyclic, pentacyclic, or hexacyclic condensed aromatic compound. In particular, an anthracene derivative is stable and preferable.

Note that as in the above-described structure, holes are injected into the first light-emitting layer from the second light-emitting layer when the second light-emitting layer is provided on the anode side of the first light-emitting layer. Therefore, the first organic compound contained in the layer provided on the anode side of the first light-emitting layer and the third organic compound contained in the second light-emitting layer are preferably the same in order to make smooth a property of injecting the holes into the first light-emitting layer.

Through the above-described steps, the structure in which the second light-emitting layer is provided on the anode side of the first light-emitting layer is described. However, as described above, the second light-emitting layer can also be provided on the cathode side of the first light-emitting layer.

Therefore, according to another structure of the present invention, a light-emitting element includes a first light-emitting layer between an anode and a cathode; and a second light-emitting layer which is provided in contact with the cathode side of the first light-emitting layer, in which the first light-emitting layer includes a layer provided on the anode side and a layer provided on the cathode side, the layer provided on the anode side contains a first organic compound and a first light-emitting substance, the layer provided on the cathode side contains a second organic compound and the first light-emitting substance, the second light-emitting layer contains a third organic compound and a second light-emitting substance, and light emission from the first light-emitting substance and light emission from the second light-emitting substance can be obtained.

In this case, a carrier recombination region in the first light-emitting layer is preferably inside the first light-emitting layer instead of an interface thereof. Therefore, it is preferable that the layer provided on the anode side have a hole-transporting property and the layer provided on the cathode side have an electron-transporting property. In this case, since the second light-emitting layer is provided on the cathode side of the first light-emitting layer, up to the first light-emitting layer also has a function of transporting electrons. Thus, the second light-emitting layer preferably has an electron-transporting property.

Here, in the above-described structure, the first organic compound, the second organic compound, and the third organic compound are preferably so-called host materials in order to control a carrier-transporting property in each layer. Therefore, according to another structure of the present invention, a light-emitting element includes a first light-emitting layer between an anode and a cathode; and a second light-emitting layer which is provided in contact with the anode side of the first light-emitting layer, in which the first light-emitting layer includes a layer provided on the anode side and a layer provided on the cathode side, the layer provided on the anode side contains a first organic compound and a first light-emitting substance, the content of the first organic compound in the layer provided on the anode side is greater than or equal to 50 wt % and less than or equal to 99.9 wt %, the layer provided on the cathode side contains a second organic compound and the first light-emitting substance, the content of the second organic compound in the layer provided on the cathode side is greater than or equal to 50 wt % and less than or equal to 99.9 wt %, the second light-emitting layer contains a third organic compound and a second light-emitting substance, and the content of the third organic compound in the second light-emitting layer is greater than or equal to 50 wt % and less than or equal to 99.9 wt %.

In this case, a carrier recombination region in the first light-emitting layer is preferably inside the first light-emitting layer instead of an interface thereof. Therefore, it is preferable that the first organic compound have a hole-transporting property and the second organic compound have an electron-transporting property. In this case, since the second light-emitting layer is provided on the cathode side of the first light-emitting layer, up to the first light-emitting layer also has a function of transporting electrons. Thus, the third organic compound preferably has an electron-transporting property.

Here, also in the structure in which the second light-emitting layer is provided on the cathode side of the first light-emitting layer, an interface between the layer provided on the anode side and the layer provided on the cathode side is a region where the densities of both holes and electrons are high. Therefore, since the first organic compound contained in the layer provided on the anode side and the second organic compound contained in the layer provided on the cathode side are preferably stable with respect to both oxidation and reduction, any of the first organic compound and the second organic compound is preferably tricyclic, tetracyclic, pentacyclic, or hexacyclic condensed aromatic compound. In particular, an anthracene derivative is stable and preferable.

Note that as in the above-described structure, electrons are injected into the first light-emitting layer from the second light-emitting layer when the second light-emitting layer is provided on the cathode side of the first light-emitting layer. Therefore, the second organic compound contained in the layer provided on the cathode side of the first light-emitting layer and the third organic compound contained in the second light-emitting layer are preferably the same substances in order to make smooth a property of injecting the electrons into the first light-emitting layer.

The light-emitting element of the present invention is formed with the structure as described above; however, a carrier recombination region in the light-emitting element of the present invention becomes dominant inside the first light-emitting layer in many cases. Therefore, in consideration of energy transition, light emission in the first light-emitting layer preferably has a shorter wavelength than light emission in the second light-emitting layer. In other words, in the light-emitting element of the present invention, an emission peak wavelength of the first light-emitting substance is preferably a wavelength shorter than an emission peak wavelength of the second light-emitting substance.

Note that both light emission from the first light-emitting substance and light emission from the second light-emitting substance can be obtained with the structure of the light-emitting element of the present invention; therefore, the light-emitting element of the present invention is suitable for a light-emitting element having a broad spectrum, and can be preferably used as a white light-emitting element, in particular. Therefore, in the light-emitting element of the present invention as described above, a light-emitting element in which an emission color of the first light-emitting substance and an emission color of the second light-emitting substance are complementary to each other is also one of features of the present invention.

In consideration of white light, more specifically, a structure in which an emission color of the first light-emitting substance is blue and an emission color of the second light-emitting substance is yellow is preferable. Alternatively, it is preferable that an emission peak wavelength of the first light-emitting substance be in a range of greater than or equal to 400 nm and less than 480 nm and an emission peak wavelength of the second light-emitting substance be in a range of greater than or equal to 540 nm and less than 600 nm.

In addition, as another structure in consideration of white light, it is preferable that an emission color of the first light-emitting substance be blue green and an emission color of the second light-emitting substance be red. Alternatively, it is preferable that an emission peak wavelength of the first light-emitting substance be in a range of greater than or equal to 480 nm and less than 520 nm and an emission peak wavelength of the second light-emitting substance be in a range of greater than or equal to 600 nm and less than 700 nm.

Note that the light-emitting element of the present invention as described above can be applied to a variety of light-emitting devices. Therefore, a light-emitting device having the above-described light-emitting element of the present invention is also included in the present invention. The category of a light-emitting device in this specification includes image display devices, lighting devices, and the like. Further, the category of the light-emitting device also includes a module in which a connector such as a flexible printed circuit (FPC), a tape automated bonding (TAB) tape, or a tape carrier package (TCP) is attached to a panel on which a light-emitting element is formed; a module in which a printed wiring board is provided at an end of a TAB tape or a TCP; and also a module in which an integrated circuit (IC) is directly mounted on a light-emitting element by a chip on glass (COG) method.

In particular, the light-emitting element of the present invention is suitable in manufacturing a light-emitting element having a broad spectrum or a white light-emitting element; therefore, a lighting device is preferable as the light-emitting device.

In addition, the above-described light-emitting device of the present invention is particularly useful for a display portion of an electronic device. Therefore, an electronic device provided with the light-emitting device of the present invention is also included in the present invention.

The light-emitting element of the present invention is manufactured, so that a long lifetime light-emitting element can be obtained. In particular, a long lifetime white light-emitting element can be obtained. In addition, the light-emitting element of the present invention is manufactured, so that a light-emitting element having high luminous efficiency can be obtained. In particular, a white light-emitting element having high luminous efficiency can be obtained.

Further, the light-emitting element of the present invention is applied to a light-emitting device or an electronic device, so that a light-emitting device or an electronic device which is highly reliable can be obtained. In addition, a light-emitting device or an electronic device which consumes low power can be obtained.

DETAILED DESCRIPTION OF THE INVENTION

Hereinafter, embodiment modes and embodiments will be described with reference to the drawings. However, the present invention can be implemented in many various ways and it is to be easily understood that various changes and modifications will be apparent to those skilled in the art, unless such changes and modifications depart from the content and the scope of the invention. Therefore, the present invention should not be interpreted as being limited to the description of the embodiment modes and embodiments.

[Embodiment Mode 1]

Embodiment Mode 1 will describe a concept of the present invention. A conceptual view of a light-emitting element of the present invention is shown in FIGS. 1A and 1B.

Figure 1A:
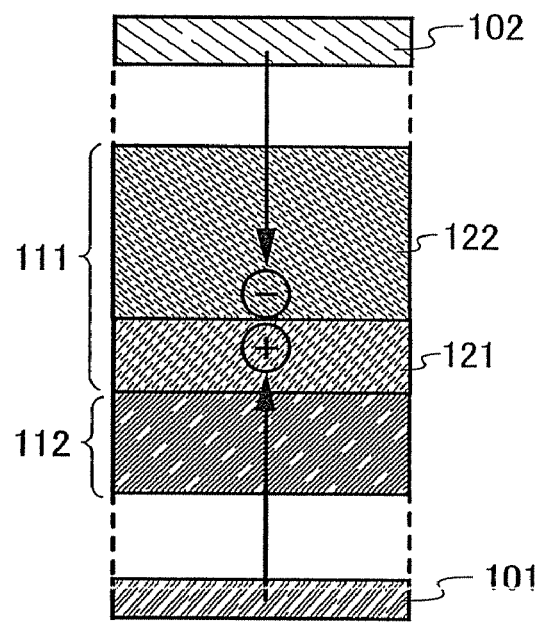
FIGS. 1A and 1B are views each explaining a light-emitting element of the present invention.
Figure 1B:
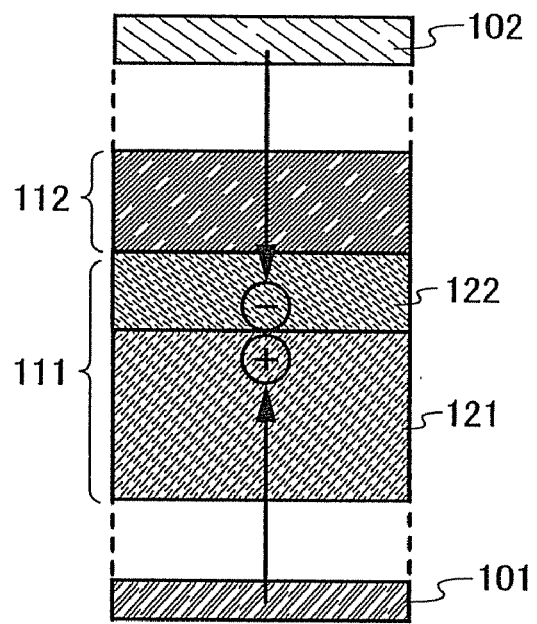

FIG. 1A shows one of structures of a light-emitting element of the present invention in which, between an anode 101 and a cathode 102, a first light-emitting layer 111 and a second light-emitting layer 112 which is provided in contact with the anode side of the first light-emitting layer 111 are provided and the first light-emitting layer 111 includes a layer 121 provided on the anode side and a layer 122 provided on the cathode side. Although a hole-injecting layer or a hole-transporting layer may be provided between the anode 101 and the second light-emitting layer 112, it is not necessarily provided; therefore, they are omitted in FIG. 1A. In addition, although an electron-injecting layer or an electron-transporting layer may be provided between the cathode 102 and the first light-emitting layer 111, it is not necessarily provided; therefore, they are omitted in FIG. 1A.

In the first light-emitting layer 111, the layer 121 provided on the anode side contains a first organic compound and a first light-emitting substance, and the layer 122 provided on the cathode side contains a second organic compound which is different from the first organic compound and the first light-emitting substance. In other words, light emission from the first light-emitting substance is obtained from the first light-emitting layer 111. On the other hand, the second light-emitting layer 112 contains a third organic compound and a second light-emitting substance. In other words, light emission from the second light-emitting substance is obtained from the second light-emitting layer 112. It is the light-emitting element of the present invention that can obtain both the light emission from the first light-emitting substance and the light emission from the second light-emitting substance after holes injected from the anode 101 and electrons injected from the cathode 102 are recombined by application of voltage to the light-emitting element.

First, as for the light-emitting element of the present invention, it is important that the first light-emitting layer 111 be divided into two layers of the layer 121 provided on the anode side and the layer 122 provided on the cathode side and both the two layers contain the first light-emitting substance. In addition, it is also important that the first organic compound be contained in the layer 121 provided on the anode side and the second organic compound be contained in the layer 122 provided on the cathode side, so that a carrier-transporting property inside the first light-emitting layer 111 is adjusted, and the vicinity of the interface between the layer 121 provided on the anode side and the layer 122 provided on the cathode side becomes a main recombination region of carriers. With such a structure, since recombination of carriers occurs not at an end interface of the first light-emitting layer 111 but inside thereof. Therefore, the carrier balance in the first light-emitting layer 111 does not change easily with time; thus, the first light-emitting layer 111 does not deteriorate easily.

From the above perspectives, it is preferable that the layer 121 provided on the anode side contain the first organic compound to adjust a hole-transporting property and the layer 122 provided on the cathode side contain the second organic compound to adjust an electron-transporting property.

On the other hand, the second light-emitting layer 112 contains the second light-emitting substance and emits light with color which is different from that of light emission from the first light-emitting layer 111 (light emission from the first light-emitting substance). Then, as described above, a main recombination region of carriers is formed in the vicinity of the interface between the layer 121 provided on the anode side and the layer 122 provided on the cathode side. Accordingly, the second light-emitting layer 112 also has a function of transporting holes up to the first light-emitting layer 111 in the case of FIG. 1A. Therefore, it is preferable that the second light-emitting layer 112 further contain the third organic compound to adjust a hole-transporting property.

Here, in the light-emitting element of the present invention, both the first light-emitting substance contained in the first light-emitting layer 111 and the second light-emitting substance contained in the second light-emitting layer 112 need to emit light. The second light-emitting substance contained in the second light-emitting layer 112 is slightly apart from the main recombination region of carriers as shown in FIG. 1A; however, part of electrons reach up to the second light-emitting layer 112 by adjusting the film thickness of the layer 121 provided on the anode side. Therefore, the second light-emitting substance can also emit light.

Alternatively, the emission wavelength of the first light-emitting substance is made to be a wavelength shorter than the emission wavelength of the second light-emitting substance, whereby part of excitation energy of the first light-emitting substance is transferred to the second light-emitting substance, so that the second light-emitting substance can emit light. Note that it has been known that the efficiency of energy transfer is inversely proportional to the $6^{th}$ power of a distance between the substances; therefore, the ratio of light emission of the first light-emitting substance to light emission of the second light-emitting substance can be adjusted by adjusting the film thickness of the layer 121 provided on the anode side.

With either mechanism, holes injected from the anode 101 and electrons injected from the cathode 102 are distributed without waste in forming an excited state of either the first light-emitting layer 111 or the second light-emitting layer 112, thereby contributing to light emission. Therefore, the light-emitting element of the present invention can achieve high luminous efficiency.

On the other hand, FIG. 1B contrary to FIG. 1A shows one of structures of the light-emitting element of the present invention in which the second light-emitting layer 112 is provided in contact with the cathode of the first light-emitting layer 111 side. Although a hole-injecting layer or a hole-transporting layer may be provided between the anode 101 and the first light-emitting layer 111, it is not necessarily; therefore, they are omitted in FIG. 1B. In addition, although an electron-injecting layer or an electron-transporting layer may be provided between the cathode 102 and the second light-emitting layer 112, it is not necessarily provided; therefore, they are omitted in FIG. 1B.

In first light-emitting layer 111, the layer 121 provided on the anode side contains the first organic compound and the first light-emitting substance, and the layer 122 provided on the cathode side contains the second organic compound which is different from the first organic compound and the first light-emitting substance. In other words, light emission from the first light-emitting substance is obtained from the first light-emitting layer 111. On the other hand, the second light-emitting layer 112 contains the third organic compound and the second light-emitting substance. In other words, light emission from the second light-emitting substance is obtained from the second light-emitting layer 112. It is the light-emitting element of the present invention that can obtain both the light emission from the first light-emitting substance and the light emission from the second light-emitting substance after holes injected from the anode 101 and electrons injected from the cathode 102 are recombined by application of voltage to the light-emitting element.

As for the first light-emitting layer 111, FIG. 1B has a structure similar to that of FIG. 1A, and it is preferable that the layer 121 provided on the anode side contain the first organic compound to adjust a hole-transporting property and the layer 122 provided on the cathode side contain the second organic compound to adjust an electron-transporting property.

On the other hand, the second light-emitting layer 112 contains the second light-emitting substance and emits light with color which is different from that of light emission from the first light-emitting layer 111 (light emission from the first light-emitting substance). Then, a main recombination region of carriers is formed in the vicinity of the interface between the layer 121 provided on the anode side and the layer 122 provided on the cathode side. Accordingly, the second light-emitting layer 112 also has a function of transporting electrons up to the first light-emitting layer 111 in the case of FIG. 1B. Therefore, it is preferable that the second light-emitting layer 112 further contain the third organic compound to adjust an electron-transporting property.

Here, in the light-emitting element of the present invention, both the first light-emitting substance contained in the first light-emitting layer 111 and the second light-emitting substance contained in the second light-emitting layer 112 need to emit light. The second light-emitting substance contained in the second light-emitting layer 112 is slightly apart from the main recombination region of carriers as shown in FIG. 1B; however, part of holes reach up to the second light-emitting layer 112 by adjusting the film thickness of the layer 122 provided on the cathode side. Therefore, the second light-emitting substance can also emit light.

Alternatively, the emission wavelength of the first light-emitting substance is made to be a wavelength shorter than the emission wavelength of the second light-emitting substance, whereby part of excitation energy of the first light-emitting substance is transferred to the second light-emitting substance, so that the second light-emitting substance can emit light. Note that it has been known that the efficiency of energy transfer is inversely proportional to the $6^{th}$ power of a distance between the substances; therefore, the ratio of light emission of the first light-emitting substance to light emission of the second light-emitting substance can be adjusted by adjusting the film thickness of the layer 122 provided on the cathode side.

With either mechanism, holes injected from the anode 101 and electrons injected from the cathode 102 are distributed without waste in forming an excited state of either the first light-emitting layer 111 or the second light-emitting layer 112, thereby contributing to light emission. Therefore, the light-emitting element of the present invention can achieve high luminous efficiency.

Note that since the light-emitting element of the present invention can obtain both light emission from the first light-emitting substance and light emission from the second light-emitting substance, light emission having a broad spectrum can be obtained. Therefore, white light emission can also be obtained.

As described above, by application of the structure of the present invention, a long-lifetime light-emitting element, in particular, a long-lifetime white light-emitting element can be obtained. In addition, by manufacturing the light-emitting element of the present invention, a light-emitting element having high luminous efficiency, in particular, a white light-emitting element having high luminous efficiency can be obtained.

As described above, the concept of the light-emitting element of the present invention is described in this embodiment mode. Next, the structure of the light-emitting element of the present invention will be described in more detail also with reference to specific materials.

[Embodiment Mode 2]

Figure 2A:
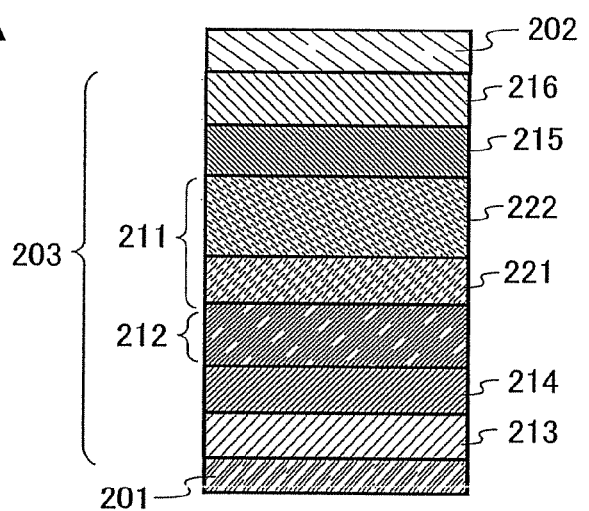
FIGS. 2A and 2B are views each explaining a light-emitting element of the present invention.

Embodiment Mode 2 will describe a specific structure of the light-emitting element of the present invention which is described in FIG. 1A with reference to FIG. 2A.

FIG. 2A is a view schematically showing an element structure of the light-emitting element of the present invention. A layer 203 containing a light-emitting substance is provided between an anode 201 and a cathode 202, and the layer 203 containing a light-emitting substance includes at least a first light-emitting layer 211 and a second light-emitting layer 212 which is provided in contact with the anode side of the first light-emitting layer 211. The first light-emitting layer 211 includes a layer 221 provided on the anode side and a layer 222 provided on the cathode side.

Note that in the light-emitting element in Embodiment Mode 2, a hole-injecting layer 213 and a hole-transporting layer 214 are provided between the anode 201 and the second light-emitting layer 212. In addition, an electron-transporting layer 215 and an electron-injecting layer 216 are provided between the cathode 202 and the first light-emitting layer 211. However, the hole-injecting layer 213, the hole-transporting layer 214, the electron-transporting layer 215, and the electron-injecting layer 216 are not necessarily provided. Alternatively, these layers may be formed of a plurality of layers.

Hereinafter, first, the structures of the first light-emitting layer 211 and the second light-emitting layer 212 are specifically described.

In the first light-emitting layer 211, the layer 221 provided on the anode side contains a first organic compound and a first light-emitting substance, and the layer 222 provided on the cathode side contains a second organic compound which is different from the first organic compound and the first light-emitting substance.

As described also in Embodiment Mode 1, the first organic compound and the second organic compound have a function of adjusting a carrier-transporting property inside the first light-emitting layer 211 and making the vicinity of the interface between the layer 221 provided on the anode side and the layer 222 provided on the cathode side become a main recombination region of carriers. With such a structure, the carrier balance in the first light-emitting layer 211 does not change easily with time; thus, the first light-emitting layer 211 does not deteriorate easily.

In order to adjust a carrier-transporting property, both the first organic compound and the second organic compound preferably serve as a host material. That is, more specifically, the amount of the first organic compound in the layer 221 provided on the anode side may be greater than or equal to 50 wt % and less than or equal to 99.9 wt %. In addition, the amount of the second organic compound in the layer 222 provided on the cathode side may be greater than or equal to 50 wt % and less than or equal to 99.9 wt %.

In addition, as described also in Embodiment Mode 1, in order that the vicinity of the interface between the layer 221 provided on the anode side and the layer 222 provided on the cathode side becomes the main recombination region of carriers, it is preferable that the layer 221 provided on the anode side have a hole-transporting property and the layer 222 provided on the cathode side have an electron-transporting property. In consideration of this respect, it is preferable that the first organic compound which is a host material in the layer 221 provided on the anode side have a hole-transporting property and the second organic compound which is a host material in the layer 222 provided on the cathode side have an electron-transporting property.

Therefore, as specific examples of the first organic compound, a compound having a hole-transporting property such as the following is preferable: 4,4'-bis[N-(1-naphthyl)-N-phenylamino]biphenyl (abbreviation: NPB or α-NPD); 4,4'-bis[N-(9,9-dimethylfluoren-2-yl)-N-phenylamino]biphenyl (abbreviation: DFLDPBi); N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis(N-{4-[N'-(3-methylphenyl)-N'-phenylamino]phenyl}-N-phenylamino)biphenyl (abbreviation: DNTPD); 1,3,5-tris[N-(4-diphenylaminophenyl)-N-phenylamino]benzene (abbreviation: DPA3B); N,N''-bis(spiro-9,9'-bifluoren-2-yl)-N,N'-diphenylbenzidine (abbreviation: BSPB); 4,4'-bis[N-(3-methylphenyl)-N-phenylamino]biphenyl (abbreviation: TPD); 4,4',4''-tris(N,N-diphenylamino)triphenylamine (abbreviation: TDATA); 4,4',4''-tris[N-(3-methylphenyl)-N-phenylamino]triphenylamine (abbreviation: MTDATA); 1,3,5-tris[N,N-di(m-tolyl)amino]benzene (abbreviation: m-MTDAB); 4,4',4''-tris(N-carbazolyl)triphenylamine (abbreviation: TCTA); 9,10-diphenylanthracene (abbreviation: DPAnth); N,N-diphenyl-9-[4-(10-phenyl-9-antryl)phenyl]-9H-carbazol-3-amine (abbreviation: CzA1PA); 9-phenyl-9'-[4-(10-phenyl-9-anthryl)phenyl]-3,3'-bi(9H-carbazole) (abbreviation: PCCPA); 4-(10-phenyl-9-anthryl)triphenylamine (abbreviation: DPhPA); 4-(9H-carbazol-9-yl)-4'-(10-phenyl-9-anthryl)triphenylamine (abbreviation: YGAPA); N,9-diphenyl-N-[4-(10-phenyl-9-anthryl)phenyl]-9H-carbazol-3-amine (abbreviation: PCAPA); N,9-diphenyl-N-{4-[4-(10-phenyl-9-anthryl)phenyl]phenyl}-9H-carbazol-3-amine (abbreviation: PCAPBA); N,9-diphenyl-N-(9,10-diphenyl-2-anthryl)-9H-carbazol-3-amine (abbreviation: 2PCAPA); 6,12-dimethoxy-5,11-diphenylchrysene; or N,N,N',N',N'',N''',N''''-octaphenyldibenzo[g,p]chrysene-2,7,10,15-tetraamine (abbreviation: DBC1). In addition, the interface between the layer 221 provided on the anode side and the layer 222 provided on the cathode side is a region where both holes and electrons have high density; therefore, the first organic compound is preferably stable with respect to both oxidation and reduction. Therefore, tricyclic, tetracyclic, pentacyclic, and hexacyclic condensed aromatic compounds typified by DPAnth, CzA1PA, PCCPA, DPhPA, YGAPA, PCAPA, PCAPBA, 2PCAPA, or DBC1 is more preferable as the first organic compound. In particular, an anthracene derivative such as DPAnth, CzA1PA, PCCPA, DMA, YGAPA, PCAPA, PCAPBA, or 2PCAPA is stable and has a high energy gap; therefore, such an anthracene derivative is preferable as the first organic compound which is a host material.

In addition, as specific examples of the second organic compound, a compound having an electron-transporting property such as the following is preferable: tris(8-quinolinolato)aluminum(III) (abbreviation: Alq); tris(4-methyl-8-quinolinolato)aluminum(III) (abbreviation: Almq$_3$); bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq); bis(8-quinolinolato)zinc(II) (abbreviation: Znq); bis[2-(2-benzoxazolyl)phenolato]zinc(II) (abbreviation: ZnPBO); bis[2-(2-benzothiazolyl)phenolato]zinc(II) (abbreviation: ZnBTZ); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ01); 2,2',2''-(1,3,5-benzenetriyl)tris(1-phenyl-1H-benzimidazole) (abbreviation: TPBI); bathophenanthroline (abbreviation: BPhen); bathocuproine (abbreviation: BCP); 9-[4-(5-phenyl-1,3,4-oxadiazole-2-yl)phenyl]-9H-carbazole (abbreviation: CO11); 9-[4-(10-phenyl-9-anthryl)phenyl]-9H-carbazole (abbreviation: CzPA); 3,6-diphenyl-9-[4-(10-phenyl-9-anthryl)phenyl]-9H-carbazole (abbreviation: DPCzPA); 9,10-bis(3,5-diphenylphenyl)anthracene (abbreviation: DPPA); 9,10-di(2-naphthyl)anthracene (abbreviation: DNA); 2-tert-butyl-9,10-di(2-naphthyl)anthracene (abbreviation: t-BuDNA); 9,9'-bianthryl (abbreviation: BANT); 9,9'-(stilbene-3,3'-diyl)diphenanthrene (abbreviation: DPNS); 9,9'-(stilbene-4,4'-diyl)diphenanthrene (abbreviation: DPNS2); or 3,3',3''-(benzene-1,3,5-triyl)tripyrene (abbreviation: TPB3). In addition, the interface between the layer 221 provided on the anode side and the layer 222 provided on the cathode side is a region where both holes and electrons have high density; therefore, the second organic compound is preferably stable with respect to both oxidation and reduction. Therefore, tricyclic, tetracyclic, pentacyclic, and hexacyclic condensed aromatic compounds typified by CzPA, DPCzPA, DPPA, DNA, t-BuDNA, BANT, DPNS, DPNS2, or TPB3 is more preferable as the second organic compound. In particular, an anthracene derivative such as CzPA, DPCzPA, DPPA, DNA, t-BuDNA, or BANT is stable and has a high energy gap; therefore, such an anthracene derivative is preferable as the second organic compound which is a host material.

Note that the first light-emitting layer may further contain another substance in addition to the first organic compound, the second organic compound, and the first light-emitting substance.

On the other hand, the second light-emitting layer 212 contains the third organic compound and the second light-emitting substance. As described also in Embodiment Mode 1, the main recombination region of carriers is the vicinity of the interface between the layer 221 provided on the anode side and the layer 222 provided on the cathode side; therefore, the second light-emitting layer 212 also has a function of transporting holes up to the first light-emitting layer 211 in the structure of FIG. 2A. In order to realize this function easily, it is preferable that the third organic compound as well as the first organic compound and the second organic compound be a host material in the second light-emitting layer 212. That is, more specifically, the content of the third organic compound in the second light-emitting layer 212 may be greater than or equal to 50 wt % and less than or equal to 99.9 wt %.

In addition, in consideration of the second light-emitting layer 212 also having the function of transporting holes, the third organic compound which is a host material in the second light-emitting layer 212 preferably has a hole-transporting property.

Therefore, as specific examples of the third organic compound, similar to the first organic compound, a compound having a hole-transporting property such as the following is preferable: NPB (or α-NPD), DFLDPBi, DTDPPA, DPAB, DNTPD, DPA3B, BSPB, TPD, TDATA, MTDATA, ni-MI-DAB, TCTA, DPAnth, CzA1PA, PCCPA, DPhPA, YGAPA, PCAPA, PCAPBA, 2PCAPA, or DBC1. In particular, an anthracene derivative such as DPAnth, CzA1PA, PCCPA, DPhPA, YGAPA, PCAPA, PCAPBA, or 2PCAPA is stable and has a high energy gap; therefore, such an anthracene derivative is preferable as the third organic compound which is a host material.

Note that the second light-emitting layer may further contain another substance in addition to the third organic compound and the second light-emitting substance.

Further, in order to reduce a hole injection barrier from the second light-emitting layer 212 to the first light-emitting layer 211, the first organic compound which is contained in the layer 221 provided on the anode side of the first light-emitting layer 211 and the third organic compound which is contained in the second light-emitting layer 212 are preferably similar to each other.

Next, a light-emitting substance is described. The first light-emitting layer 211 contains the first light-emitting substance and the second light-emitting layer 212 contains the second light-emitting substance. Note that different substances are used for the first light-emitting substance and the second light-emitting substance in order to obtain light emission having a broad spectrum or white light emission.

The first light-emitting substance and the second light-emitting substance are not particularly limited as long as they are different substances, and may be selected as appropriate from, for example, the following materials. As a substance which emits blue light, for example, a substance having an emission peak wavelength which is greater than or equal to 400 nm and less than 480 nm may be used, and the following can be given: N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); 2-(4-{N-[4-carbazol-9-yl)phenyl]-N-phenylamino}phenyl)-9,10-diphenylantracene (abbreviation: 2YGAPPA); N,9-diphenyl-N-[4-(10-phenyl-9-anthryl)phenyl]-9H-carbazole-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); and the like. In addition, a material which emits phosphorescence such as bis[2-(4',6'-difluorophenyl)pyridinato-N,$C^{2'}$]iridium (III)tetrakis(1-pyrazolyporate (abbreviation: Fir6) or bis[2-(4',6'-difluorophenyl)pyridinato-N,$C^{2'}$]iridium(III)picolinate (abbreviation: FIrpic) can also be used. As a substance which emits blue green light, for example, substance having an emission peak wavelength which is greater than or equal to 480 nm and less than 520 nm may be used, and the following can be given: N,N''-(2-tert-butylanthracene-9,10-diyldi-4,1-phenylene)bis[N,N',N'-triphenyl-1,4-phenylenediamine] (abbreviation: DPABPA); N,9-diphenyl-N-[4-(9,10-diphenyl-2-anthryl)phenyl]-9H-carbazole-3-amine (abbreviation: 2PCAPPA); N-[4-(9,10-diphenyl-2-anthryl)phenyl]-N,N',N'-triphenyl-1,4-phenylenediamine (abbreviation: 2DPAPPA); N,N,N',N',N'',N'',N''',N'''-octaphenyldibenzo[g,p]chrysene-2,7,10,15-tetraamine (abbreviation: DBC1); coumarin 30; and the like. In addition, a material which emits phosphorescence such as bis[2-(3',5'-bistrifluoromethylphenyl)-pyridinato-N,$C^{2'}$]iridium(M)picolinate (abbreviation: Ir(CF$_3$ppy)$_2$(pic)) or bis[2-(4',6'-difluorophenyl)pyridinato-N,$C^{2'}$]iridium(III)acetylacetonate (abbreviation: FIracac) can also be used. As a substance which emits yellow light, for example, a substance having an emission peak wavelength which is greater than or equal to 540 nm and less than 600 nm may be used, and the following can be given: rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); and the like. In addition, a material which emits phosphorescence such as bis(benzo[h]quinolinato)iridium(III)acetylacetonate (abbreviation: Ir(bzq)$_2$(acac)); bis(2,4-diphenyl-1,3-oxazolato-N,$C^{2'}$)iridium(III)acetylacetonate (abbreviation: Ir(dpo)$_2$(acac)); bis[2-(4'-(perfluorophenylphenyl)pyridinato]iridium(III)acetylacetonate (abbreviation: Ir(p-PF-ph)$_2$(acac)); or bis(2-phenylbenzothiazolato-N,$C^{2'}$)iridium(III)acetylacetonate (abbreviation: Ir(bt)$_2$(acac)) can also be used. As a substance which emits red light, for example, a substance having an emission peak wavelength which is greater than or equal to 600 nm and less than 700 nm may be used, and the following can be given: N,N,N',N'-tetrakis(4-methylphenyl)tetracene-5,11-diamine (abbreviation: p-mPhTD); 7,13-diphenyl-N,N,N',N'-tetrakis(4-methylphenyl)acenaphtho[1,2-a]fluoranthene-3,10-diamine (abbreviation: p-mPhAFD); 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and the like. In addition, a material which emits phosphorescence such as bis[2-(2'-benzo[4,5-α]thienyl)pyridinato-N,$C^{3'}$)iridium(III)acetylacetonate (abbreviation: Ir(btp)$_2$(acac)); bis(1-phenylisoquinolinato-N,$C^{2'}$)iridium(III)acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$(acac)); 2,3,7,8,12,13,17,18-octaethyl-21H,23H-porphine platinum(II) (abbreviation: PtOEP); tris(1,3-diphenyl-1,3-propanedionato)(monophenanthroline)europium (III) (abbreviation: Eu(DBM)$_3$(Phen)), or tris[1-(2-thenoyl)-3,3,3-trifluoroacetonato](monophenanthroline)europium (III) can also be used. Note that materials having an emission peak wavelength within the range of 520 nm to 540 nm are not given; however, it is needless to say that a light-emitting material having an emission wavelength of this range (including a material which emits phosphorescence) can be used. For example, coumarin 545T, N,N'-diphenylquinacridone (abbreviation: DPQd), tris(2-phenylpyridinato)iridium(III) (abbreviation: Ir(ppy)$_3$), and the like can be given. Substances having different emission wavelengths can be selected from these materials and used so that a desired emission color can be obtained from a light-emitting element.

Here, in the light-emitting element of the present invention, both the first light-emitting substance contained in the first light-emitting layer 211 and the second light-emitting substance contained in the second light-emitting layer 212 need to emit light. The second light-emitting substance contained in the second light-emitting layer 212 is slightly apart from a main recombination region of carriers; however, part of electrons reach up to the second light-emitting layer 212 by adjusting the film thickness of the layer 221 provided on the anode side. Therefore, the second light-emitting substance can also emit light. Accordingly, the film thickness of the layer 221 provided on the anode side is preferably greater than or equal to 1 nm and less than or equal to 20 nm.

In addition, the emission wavelength of the first light-emitting substance is made to be a wavelength shorter than the emission wavelength of the second light-emitting substance, whereby part of excitation energy of the first light-emitting substance is transferred to the second light-emitting substance, so that the second light-emitting substance can be made to emit light. Therefore, in the light-emitting element of the present invention, the emission peak wavelength of the first light-emitting substance is preferably a wavelength shorter than the emission peak wavelength of the second light-emitting substance. Note that it has been known that the efficiency of energy transfer is inversely proportional to the $6^{th}$ power of a distance between the substances; therefore, the ratio of light emission of the first light-emitting substance to light emission of the second light-emitting substance can be adjusted by adjusting the film thickness of the layer 221 provided on the anode side. In this respect, the film thickness of the layer 221 provided on the anode side is preferably greater than or equal to 1 nm and less than or equal to 20 nm.

Note that both light emission from the first light-emitting substance and light emission from the second light-emitting substance can be obtained with the structure of the light-emitting element of the present invention; therefore, the light-emitting element of the present invention is suitable as a light-emitting element having a broad spectrum, and can be preferably used as a white light-emitting element, in particular. Therefore, in the light-emitting element of the present invention as described above, a light-emitting element in which an emission color of the first light-emitting substance and an emission color of the second light-emitting substance are complementary to each other is also one of features of the present invention. As a complementary relation, blue and yellow, blue green and red, and the like can be given. A substance which emits blue, yellow, blue green, or red light may be selected as appropriate from, for example, the light-emitting substances given above.

As a combination example, PCBAPA which emits blue light is used as the first light-emitting substance and rubrene which emits yellow light is used as the second light-emitting substance to obtain white light. In addition, white light can be obtained even when, for example, 2PCAPPA which emits blue green light is used as the first light-emitting substance and BisDCM which emits red light is used as the second light-emitting substance. Note that as an emission color other than white light, an intermediate color like purple can be obtained with the use of, for example, 2YGAPPA which emits blue light as the first light-emitting substance and BisDCM which emits red light as the second light-emitting substance.

Here, as described above, in consideration of utilization of energy transfer from the first light-emitting substance to the second light-emitting substance, the emission peak wavelength of the first light-emitting substance is preferably a wavelength shorter than the emission peak wavelength of the second light-emitting substance.

Therefore, for example, a structure is preferable in which an emission color of the first light-emitting substance is blue (an emission peak wavelength which is greater than or equal to 400 nm and less than 480 nm) and an emission color of the second light-emitting substance is yellow (an emission peak wavelength which is greater than or equal to 540 nm and less than 600 nm). In consideration of this, the above-described YGA2S, YGAPA, 2YGAPPA, PCAPA, perylene, TBP, PCBAPA, FIr6, FIrpic, or the like is preferable as the first light-emitting substance, and the above-described rubrene, BPT, DCM1, DCM2, Ir(bzq)$_2$(acac), Ir(dpo)$_2$(acac), Ir(p-PF-ph)$_2$(acac), Ir(bt)$_2$(acac), or the like is preferable as the second light-emitting substance.

In addition, for example, another structure is preferable in which an emission color of the first light-emitting substance is blue green (an emission peak wavelength which is greater than or equal to 480 nm and less than 520 nm) and an emission color of the second light-emitting substance is red (an emission peak wavelength which is greater than or equal to 600 nm and less than 700 nm). In consideration of this respect, the above-described DPABPA, 2PCAPPA, 2DPAPPA, DBC1, coumarin 30, Ir(CF$_3$ ppy)$_2$(pic), FIracac, or the like is preferable as the first light-emitting substance, and the above-described p-mPhTD, p-mPhAFD, DCJTI, DCJTB, BisDCM, BisDCJTM, Ir(btp)$_2$(acac), Ir(piq)$_2$(acac), Ir(Fdpq)$_2$(acac), PtOEP, Eu(DBM)$_3$(Phen), tris[1-(2-thenoyl)-3,3,3-trifluoroacetonato](monophenanthroline)europium(III), or the like is preferable as the second light-emitting substance.

By applying the structure of the first light-emitting layer 211 and the second light-emitting layer 212 which is described above, holes injected from the anode 201 and electrons injected from the cathode 202 are distributed without waste in forming an excited state of either the first light-emitting layer 211 or the second light-emitting layer 212, thereby contributing to light emission. Therefore, the light-emitting element of the present invention can achieve high luminous efficiency.

Next, materials which can be preferably used for the anode 201, the hole-injecting layer 213, the hole-transporting layer 214, the electron-transporting layer 215, the electron-injecting layer 216, and the cathode 202 are specifically given below.

The anode 201 is preferably formed using any of a variety of metals, alloys, electrically conductive compounds, and a mixture thereof or the like having a high work function (specifically greater than or equal to 4.0 eV). Specifically, for example, indium tin oxide (ITO), indium tin oxide containing silicon or silicon oxide, indium zinc oxide (IZO), indium oxide containing silicon oxide and tin oxide (indium tin silicon oxide (ITSO)), indium oxide containing tungsten oxide and zinc oxide (IWZO), and the like are given. Such conductive metal oxide films are generally deposited by a sputtering method, but may be formed by an ink-jet method, a spin coating method, or the like by applying a sol-gel method or the like. For example, indium zinc oxide (IZO) can be deposited using a target in which 1 wt % to 20 wt % zinc oxide is added to indium oxide by a sputtering method. Further, indium oxide containing tungsten oxide and zinc oxide (IWZO) can be deposited using a target in which 0.5 wt % to 5 wt % tungsten oxide and 0.1 wt % to 1 wt % zinc oxide are contained in indium oxide by a sputtering method. Other than these, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), or the like can be used.

In addition, as the anode 201, any of a variety of metals, alloys, and electrically conductive compounds, a mixture thereof, or the like can be used regardless of high and low of the work function when a subsequent layer containing a composite material is used as the layer in contact with the anode 201. For example, aluminum (Al), silver (Ag), or an alloy containing aluminum (for example, AlSi, AlTi, or AlNd) can be used. Alternatively, any of elements belonging to Group 1 and 2 of the periodic table which are materials with a low work function, that is, alkali metals such a lithium (Li) and cesium (Cs) and alkaline earth metals such as magnesium (Mg), calcium (Ca), and strontium (Sr); alloys containing them (MgAg or AlLi); rare earth metals such as europium (Eu) and ytterbium (Yb); alloys containing them; or the like can also be used. Further, the above-described metals and alloys can be formed by a vacuum evaporation method or a sputtering method. Alternatively, a film of a paste (a silver paste or the like) can also be formed by an ink-jet method or the like.

The hole-injecting layer 213 is a layer containing a substance having a high hole-injecting property. As the substance having a high hole-injecting property, molybdenum oxide, vanadium oxide, ruthenium oxide, tungsten oxide, manganese oxide, or the like can be used. In addition, as a low molecular organic compound, the following can be given: a phthalocyanine-based compound such as phthalocyanine (abbreviation: H$_2$Pc), copper(II) phthalocyanine (abbreviation: CuPc), and vanadyl phthalocyanine (abbreviation: VOPc); and an aromatic amine compound such as NPB (or α-NPD), DFLDPBi, DTDPPA, DPAB, DNTPD, DPA3B, BSPB, TPD, TDATA, MTDATA, m-MTDAB, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-ypamino]-9-phenylcarbazole (abbreviation: PCzPCN1).

Alternatively, for the hole-injecting layer 213, a composite material in which an acceptor substance is mixed into a substance having a high hole-transporting property can be used. Note that by using such a composite material in which an acceptor substance is mixed into a substance having a high hole-transporting property, a material for forming an electrode can be selected, regardless of the work function. In other words, besides a material with a high work function, a material with a low work function can also be used for the anode 201. These composite materials can be formed by co-evaporation of a substance having a high hole-transporting property and an acceptor substance.

As a substance having a high hole-transporting property used for the composite material, any of a variety of compounds such as aromatic amine compounds, carbazole derivatives, aromatic hydrocarbons, and macromolecular compounds (such as oligomers, dendrimers or polymers) can be used. Specifically, the substance having a high hole-transporting property used for the composite material is preferably a substance having a hole mobility of greater than or equal to $10^{-6}$ cm$^2$/(V·s). However, any substance other than these substances may be used as long as it is a substance in which the hole-transporting property is higher than the electron-transporting property. The substance having a high hole-transporting property which can be used for the composite material is specifically given below.

As an organic compound which can be used as the substance having a high hole-transporting property, for example, the following which are described above can be given: the aromatic amine compounds such as NPB (or α-NPD), DFLDPBi, DTDPPA, DPAB, DNTPD, DPA3B, BSPB, TPD, TDATA, MTDATA, nz-MTDAB, PCzPCA1, PCzPCA2, PCzPCN1, and TCTA; the carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene; and the aromatic hydrocarbons such as DPPA, DNA, t-BuDNA, BANT, DPAnth, 2-tert-butyl-9,10-bis(4-phenylphenyl)anthracene (abbreviation: t-BuDBA), 2-tert-butylanthracene (abbreviation: t-BuAnth), 9,10-bis(4-methyl-1-naphthyl)anthracene (abbreviation: DMNA), 9,10-bis[2-(1-naphthyl)phenyl-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, nentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

In addition, as the acceptor substance, 7,7,8,8-tetracyano-2,3,5,6-tetrafluoroquinodimethane (abbreviation: F$_4$-TCNQ), an organic compound such as chloranil, and a transition metal oxide can be given. Moreover, an oxide of a metal which belongs to Group 4 to 8 of the periodic table can be given. Specifically, it is preferable to use vanadium oxide, niobium oxide, tantalum oxide, chromium oxide, molybdenum oxide, tungsten oxide, manganese oxide, or rhenium oxide because of their high electron-accepting properties. Among them, molybdenum oxide is particularly preferable because it is stable even in the atmosphere, has low absorption property, and is easy to handle.

Further, a macromolecular compound (an oligomer, a dendrimer, a polymer, or the like) can be used for the hole-injecting layer 213. For example, a macromolecular compound such as poly(N-vinylcarbazole) (abbreviation: PVK), poly(4-vinyltriphenylamine) (abbreviation: PVITA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine (abbreviation: poly-TPD) can be used. In addition, a macromolecular compound added with acid, such as poly(3,4-ethylenedioxythiophene)/poly(styrenesulfonic acid) (PEDOT/PSS) or polyaniline/poly(styrenesulfonic acid) (PAni/PSS), can be used.

Further, the hole-injecting layer 213 may be formed using the composite material which is formed using the above-described macromolecular compound, such as PVK, PVTPA, PTPDMA, or Poly-TPD, and the above-described acceptor substance.

The hole-transporting layer 214 is a layer containing a substance having a high hole-transporting property. As a substance having a high hole-transporting property, particularly as a low molecular organic compound, the above-described aromatic amine compound such as NPB (or α-NPD), DFLD-PBi, BSPB, TPD, or TCTA can be used. The substances mentioned here mainly are substances having a hole mobility of greater than or equal to $10^{-6}$ cm$^2$/(V·s). However, any substance other than the above substances may be used as long as it is a substance in which the hole-transporting property is higher than the electron-transporting property.

Further, for the hole-transporting layer 214, a macromolecular compound such as PVK, PVTPA, PTPDMA, or Poly-TPD can be used.

The electron-transporting layer 215 is a layer containing a substance having a high electron-transporting property. For example, as a low molecular organic compound, a metal complex such as Alq, Almq$_3$, BeBq$_2$, BAlq, Znq, ZnPBO, or ZnBTZ or a heterocyclic compound such as PBD, OXD-7, TAZ01, TPBI, BCP, BPhen, or CO11 can be used. In addition, a condensed aromatic compound such as CzPA, DPCzPA, or TPB3 can be used. The substances mentioned here mainly are substances having an electron mobility of greater than or equal to $10^{-6}$ cm$^2$/(V·s). However, any substance other than the above substances may be used as the electron-transporting layer as long as it is a substance in which the electron-transporting property is higher than the hole-transporting property.

For the electron-transporting layer 215, a macromolecular compound can be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injecting layer 216 is a layer containing a substance having a high electron-injecting property. As a substance having a high electron-injecting property, an alkali metal or an alkaline earth metal, such as lithium fluoride (LiF), cesium fluoride (CsF), or calcium fluoride (CaF$_2$), or a compound thereof can be used. Alternatively, a layer formed of a substance having an electron-transporting property where a donor substance is contained can be used. As a substance having an electron-transporting property, the substance which can be used for the above-described electron-transporting layer 215 may be used. On the other hand, as a donor substance, an alkali metal, an alkaline earth metal, or a compound thereof can be used. Further alternatively, as a donor substance, an organic compound such as tetrathianaphthacene (abbreviation: TTN) or decamethylnickelocene (abbreviation: DMN) may be used. The donor substance can be contained in the electron-injecting layer 216 by co-evaporation.

As the cathode 202, any of a variety of metals, alloys, electrically conductive compounds, and a mixture thereof or the like having a low work function (specifically less than or equal to 3.8 eV). As specific examples of such cathode materials, any of elements belonging to Group 1 and 2 of the periodic table, that is, alkali metals such a lithium (Li) and cesium (Cs) and alkaline earth metals such as magnesium (Mg), calcium (Ca), and strontium (Sr); alloys containing them (MgAg or AlLi); rare earth metals such as europium (Eu) and ytterbium (Yb); alloys containing them; and the like can be given. Further, aluminum (Al), indium (In), silver (Ag), or an alloy thereof can be used. The above-described metals and alloys can be formed by a vacuum evaporation method or a sputtering method. Alternatively, a film of a paste (a silver paste or the like) can also be formed by an ink-jet method or the like.

In addition, as the electron-injecting layer 216, the layer formed of a substance having an electron-transporting property where a donor substance is contained, as described above, can be used, so that a variety of electrically conductive compounds such as Al, Ag, ITO, and indium tin oxide containing silicon or silicon oxide can be used for the cathode 202, regardless of the work function. These electrically conductive compounds can be formed by a sputtering method, an ink-jet method, a spin coating method, or the like.

Note that a conductive composition containing a conductive macromolecule (also referred to as a conductive polymer) can also be used for the anode 201 and the cathode 202. When a thin film of a conductive composition is formed as the anode or the cathode, the thin film preferably has sheet resistance of less than or equal to 10000 Ω/square and light transmittance of greater than or equal to 70% at a wavelength of 550 nm. Note that resistance of a conductive molecule which is contained in the thin film is preferably less than or equal to 0.1Ω·cm.

As a conductive macromolecule, so-called π electron conjugated conductive macromolecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive macromolecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

One of the above-described conductive macromolecule can be used alone for the anode or the cathode, or an organic resin may be added to such a conductive macromolecule in order to adjust film characteristics so that it can be used as a conductive composition.

As for an organic resin, a thermosetting resin, a thermoplastic resin, or a photocurable resin may be used, as long as such a resin is compatible to a conductive macromolecule or a resin can be mixed and dispersed into a conductive macromolecule. For example, the following can be given: a polyester-based resin such as polyethylene terephthalate, polybutylene terephthalate, or polyethylene naphthalate; a polyimide-based resin such as polyimide or polyimide amide; a polyamide resin such as polyamide 6, polyamide 6,6, polyamide 12, or polyamide 11; a fluorine resin such as polyvinylidene fluoride, polyvinyl fluoride, polytetrafluoroethylene, ethylenetetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin, a melamine resin; a phenol-based resin; polyether; an acrylic-based resin, or a copolymer of any of these resins.

Further, the conductive macromolecule or conductive composition may be doped with an acceptor dopant or a donor dopant so that oxidation-reduction potential of a conjugated electron in a conjugated conductive macromolecule may be changed in order to adjust conductivity of the conductive macromolecule or conductive composition.

As an acceptor dopant, a halogen compound, lewis acid, proton acid, an organic cyano compound, an organic metal compound, or the like can be used. Examples of a halogen compound include chlorine, bromine, iodine, iodine chloride, iodine bromide, iodine fluoride, and the like. As lewis acid, phosphorus pentafluoride, arsenic pentafluoride, antimony pentafluoride, boron trifluoride, boron trichloride, and boron tribromide can be given. As proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As the organic carboxylic acid and the organic sulfonic acid, the above-described carboxylic acid compounds or sulfonic acid compounds can be used. As the organic cyano compound, a compound in which two or more cyano groups are included in a conjugated bond can be used. For example, tetracyanoethylene, tetracyanoethylene oxide, tetracyanobenzene, tetracyanoquinodimethane, tetracyano azanaphthalene, and the like can be given.

As a donor dopant, alkali metal, alkaline-earth metal, a quaternary amine compound, and the like can be given.

Further, a thin film used for the anode or the cathode can be formed by a wet process using a solution in which the conductive macromolecule or the conductive composition is dissolved in water or an organic solvent (e.g., an alcohol solvent, a ketone solvent, an ester solvent, a hydrocarbon solvent, or an aromatic solvent).

There is no particular limitation on the solvent in which the conductive macromolecule or the conductive composition is dissolved, as long as the above-described conductive macromolecule and the macromolecular resin compound such as an organic resin are dissolved. For example, the conductive macromolecule or the conductive composition may be dissolved in a single solvent or a mixed solvent of the following: water, methanol, ethanol, propylene carbonate, N-methylpyrrolidone, dimethylformamide, dimethylacetamide, cyclohexanone, acetone, methyletylketone, methylisobutylketone, toluene, and/or the like.

Formation of a film using a solution in which the conductive high molecule or conductive composition is dissolved in a solvent can be conducted by a wet process, such as an application method, a coating method, a droplet discharge method (also referred to as an ink-jet method), or a printing method. The solvent may be dried with heat treatment or may be dried under reduced pressure. In the case where the organic resin is a thermosetting resin, heat treatment may be further performed. In the case where the organic resin is a photocurable resin, light irradiation treatment may be performed.

Next, a manufacturing method of a light-emitting element is described. Any of a variety of methods can be employed for forming the layer 203 containing a light-emitting substance, regardless of whether it is a dry process or a wet process. For example, a vacuum evaporation method, an ink-jet method, a spin coating method, or the like may be employed. Further, different formation methods may be employed for each layer.

For example, the macromolecule compound among the above-described materials can be formed by a wet process such as an ink-jet method, a spin coating method, or the like. In addition, the low molecular organic compound can also be formed by a wet process or a dry process such as a vacuum evaporation method.

As described above, the light-emitting element of the present invention can achieve a long lifetime with the carrier balance which does not change easily with time. In addition, since holes and electrons can be utilized for formation in an excited state without waste, luminous efficiency is high. Moreover, since both the first light-emitting substance and the second light-emitting substance can emit light, light emission having a broad spectrum or white light emission can be obtained.

Therefore, by manufacturing the light-emitting element of the present invention, a long-lifetime light-emitting element, in particular, a long-lifetime white light-emitting element can be obtained. In addition, by manufacturing the light-emitting element of the present invention, a light-emitting element having high luminous efficiency, in particular, a white light-emitting element having high luminous efficiency can be obtained.

[Embodiment Mode 3]

Figure 2B:
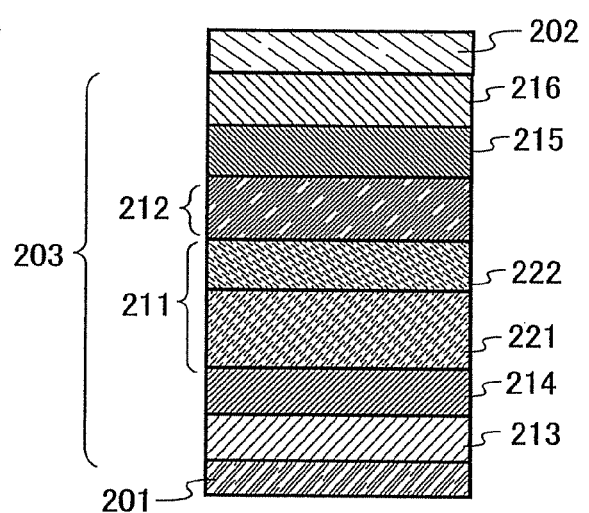

Embodiment Mode 3 will describe a specific structure of the light-emitting element of the present invention which is described in FIG. 1B with reference to FIG. 2B.

FIG. 2B is a view schematically showing an element structure of the light-emitting element of the present invention. The layer 203 containing a light-emitting substance is provided between the anode 201 and the cathode 202, and the layer 203 containing a light-emitting substance includes at least the first light-emitting layer 211 and the second light-emitting layer 212 which is provided in contact with the cathode side of the first light-emitting layer 211. The first light-emitting layer 211 includes the layer 221 provided on the anode side and the layer 222 provided on the cathode side.

Note that in the light-emitting element in Embodiment Mode 3, the hole-injecting layer 213 and the hole-transporting layer 214 are provided between the anode 201 and the first light-emitting layer 211. In addition, the electron-transporting layer 215 and the electron-injecting layer 216 are provided between the cathode 202 and the second light-emitting layer 212. However, the hole-injecting layer 213, the hole-transporting layer 214, the electron-transporting layer 215, and the electron-injecting layer 216 are not necessarily provided. Alternatively, these layers may be formed of a plurality of layers.

The structure of the light-emitting element of Embodiment Mode 3 shown in FIG. 2B which includes the anode 201, the hole-injecting layer 213, the hole-transporting layer 214, the electron-transporting layer 215, the electron-injecting layer 216, the cathode 202, and the first light-emitting layer 211 can be similar to that of the light-emitting element described in Embodiment Mode 2. On the other hand, the structure of the second light-emitting layer 212 is preferably different from that of the light-emitting element described in Embodiment Mode 2.

In other words, the second light-emitting layer 212 is similar to the light-emitting element described in Embodiment Mode 2 in that the third organic compound and the second light-emitting substance are included but different in that up to the first light-emitting layer 211 have a function of transporting electrons instead of holes. In order to realize this function easily, the third organic compound preferably serves as a host material in the second light-emitting layer 212 in a manner similar to that of the first organic compound and the second organic compound. That is, more specifically, the amount of the third organic compound in the second light-emitting layer 212 may be greater than or equal to 50 wt % and less than or equal to 99.9 wt %. In addition, in consideration of the second light-emitting layer 212 having the function of transporting electrons, the third organic compound which is a host material in the second light-emitting layer 212 preferably has an electron-transporting property.

Therefore, as specific examples of the third organic compound in Embodiment Mode 3, compounds having an electron-transporting property such as the following are preferable in a manner similar to that of the second organic compound contained in the layer 222 provided on the cathode side in the first light-emitting layer 211: Alq, Almq$_3$, BeBq$_2$, BAlq, Znq, ZnPBO, ZnBTZ, PBD, OXD-7, TAZ01, TPBI, BPhen, BCP, CO11, CzPA, DPCzPA, DPPA, DNA, t-BuDNA, BANT, DPNS, DPNS2, and TPB3. In particular, anthracene derivatives such as CzPA, DPCzPA, DPPA, DNA, t-BuDNA, and BANT which are stable and have high energy gaps are preferable as the third organic compound which is a host material.

Further, in order to reduce a hole injection barrier from the second light-emitting layer 212 to the first light-emitting layer 211, the second organic compound which is contained in the layer 222 provided on the cathode side of the first light-emitting layer 211 and the third organic compound which is contained in the second light-emitting layer 212 are preferably similar to each other.

Note that as the second light-emitting substance, a substance similar to that described in Embodiment Mode 2 can be used.

In addition, the second light-emitting layer may further contain other substance besides the third organic compound and the second light-emitting substance.

Note that in the light-emitting element of the present invention, both the first light-emitting substance contained in the first light-emitting layer 211 and the second light-emitting substance contained in the second light-emitting layer 212 need to emit light. The second light-emitting substance contained in the second light-emitting layer 212 is slightly apart from a main recombination region of carriers; however, part of holes reach up to the second light-emitting layer 212 by adjusting the film thickness of the layer 222 provided on the cathode side in Embodiment Mode 3. Therefore, the second light-emitting substance can also emit light. Accordingly, the film thickness of the layer 222 provided on the cathode side is preferably greater than or equal to 1 nm and less than or equal to 20 nm.

In addition, the emission wavelength of the first light-emitting substance is made to be a wavelength shorter than the emission wavelength of the second light-emitting substance, whereby part of excitation energy of the first light-emitting substance is transferred to the second light-emitting substance, so that the second light-emitting substance can be made to emit light. Therefore, in the light-emitting element of the present invention, the wavelength of the emission peak of the first light-emitting substance is preferably a wavelength shorter than the wavelength of the emission peak of the second light-emitting substance. Note that it has been known that the efficiency of energy transfer is inversely proportional to the 6$^{th}$ power of a distance between the substances; therefore, the ratio of light emission of the first light-emitting substance to light emission of the second light-emitting substance can be adjusted by adjusting the film thickness of the layer 222 provided on the cathode side. In this respect, the film thickness of the layer 222 provided on the cathode side is preferably greater than or equal to 1 nm and less than or equal to 20 nm.

Similar to the light-emitting element of Embodiment Mode 2, the light-emitting element of Embodiment Mode 3 can also achieve a long lifetime with the carrier balance which does not change easily with time. In addition, since holes and electrons can be utilized for formation in an excited state without waste, luminous efficiency is high. Moreover, since both the first light-emitting substance and the second light-emitting substance can emit light, light emission having a broad spectrum or white light emission can be obtained.

[Embodiment Mode 4]

Embodiment Mode 4 will describe a stack order and a light-emitting direction in the case where the light-emitting element of the present invention which is described in Embodiment Mode 2 or 3 is foamed over a substrate, with reference to FIGS. 3A to 3C and FIGS. 4A to 4C.

Figure 3A:
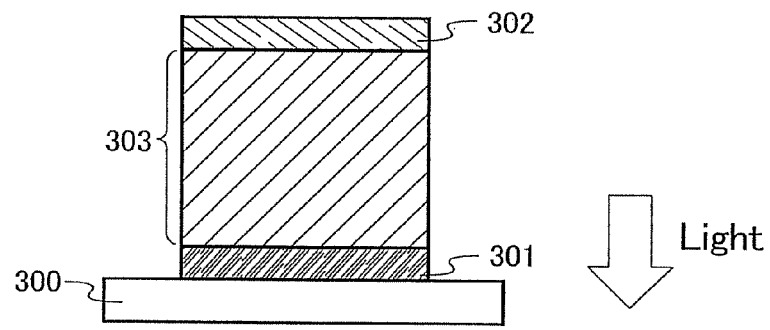
FIGS. 3A to 3C are views each explaining a light-emitting element of the present invention.
Figure 3B:
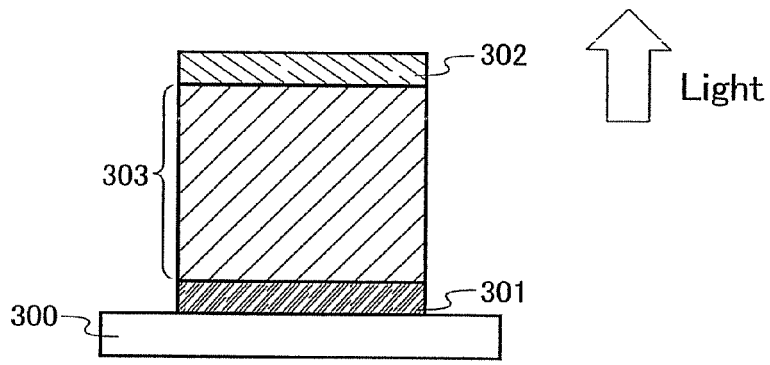
Figure 3C:
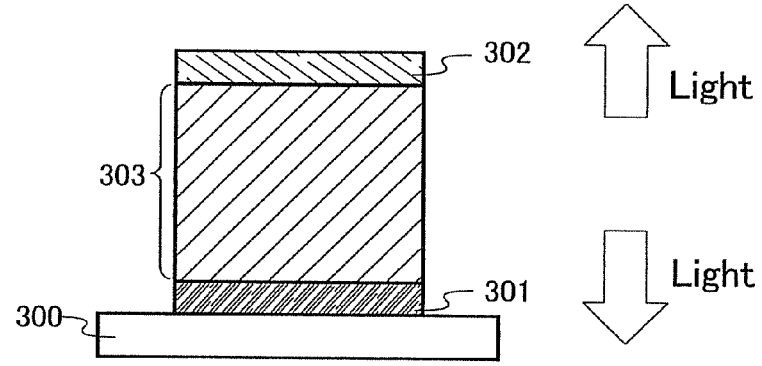
Figure 4A:
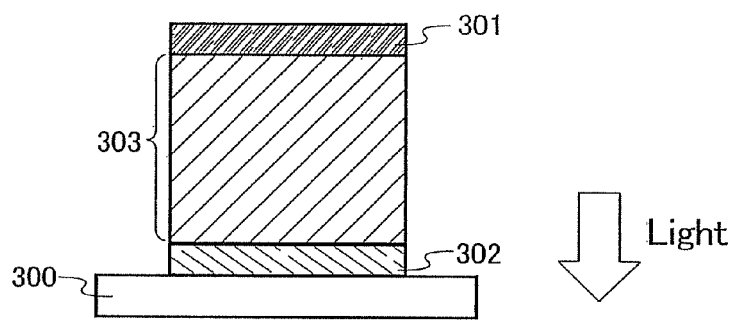
FIGS. 4A to 4C are views each explaining a light-emitting element of the present invention.
Figure 4B:
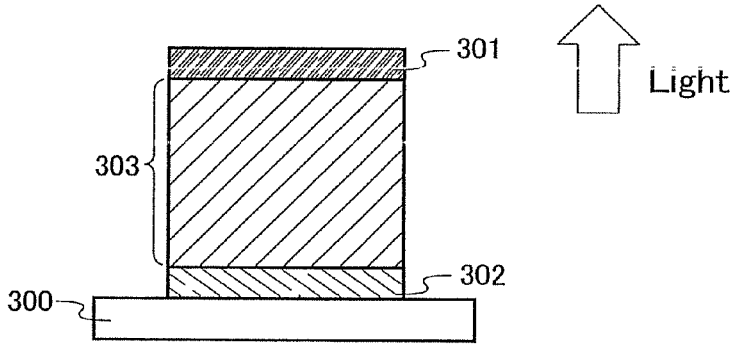
Figure 4C:
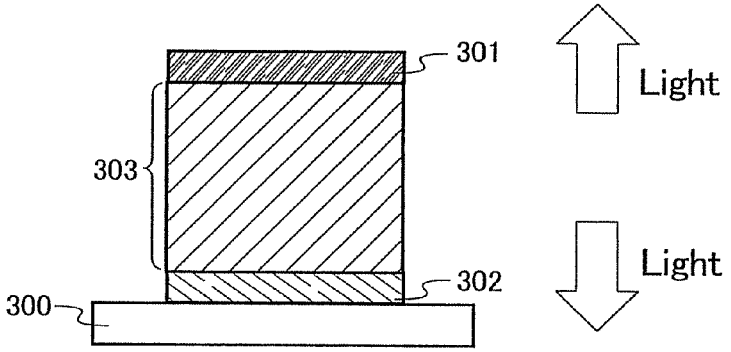

FIGS. 3A to 3C and FIGS. 4A to 4C are schematic views in which a light-emitting element of the present invention which is formed of an anode 301, a cathode 302 and a layer 303 containing a light-emitting substance is formed over a substrate 300. FIGS. 3A to 3C are views in the case where the anode 301 is formed over the substrate 300, and FIGS. 4A to 4C are views in the case where the cathode 302 is formed over the substrate 300. Note that as for the anode 301, the cathode 302, and the layer 303 containing a light-emitting substance, the structure described in Embodiment Mode 2 or 3 may be applied.

Light emission is extracted outside through one of or both the anode 301 and the cathode 302. Thus, one of or both the anode 301 and the cathode 302 are light-transmitting electrodes. As the light-transmitting electrode, ITO, IZO, ITSO, IWZO, a conductive composition containing a conductive macromolecule, or the like which is described in Embodiment Mode 2 is used. In addition, metal or an alloy may be formed to be thin enough to have a light-transmitting property.

First, the case where the anode 301 is foamed over the substrate 300 (FIGS. 3A to 3C) is described. When the anode 301 and the substrate 300 each have a light-transmitting property and the cathode 302 has a light-shielding property, light emission is extracted from the substrate 300 side as shown in FIG. 3A. In addition, when at least the anode 301 or the substrate 300 has a light-shielding property and only the cathode 302 has a light-transmitting property, light emission is extracted from the side opposite to the substrate 300 as shown in FIG. 3B. When the anode 301, the cathode 302, and the substrate 300 each have light-transmitting properties, light emission is extracted from both the substrate 300 side and the side opposite to the substrate 300 as shown in FIG. 3C.

Then, the case where the cathode 302 is formed over the substrate 300 (FIGS. 4A to 4C) is described. When the cathode 302 and the substrate 300 each have a light-transmitting property and the anode 301 has a light-shielding property, light emission is extracted from the substrate 300 side as shown in FIG. 4A. In addition, when at least the cathode 302 or the substrate 300 has a light-shielding property and only the anode 301 has a light-transmitting property, light emission is extracted from the side opposite to the substrate 300 as shown in FIG. 4B. When the anode 301, the cathode 302, and the substrate 300 each have light-transmitting properties, light emission is extracted from both the substrate 300 side and the side opposite to the substrate 300 as shown in FIG. 4C.

Note that the substrate 300 is used as a support of the light-emitting element. For the substrate 300, for example, glass, plastic, or the like can be used. When a light-transmitting property is not necessary (in the case of FIG. 3B or FIG. 4B), a silicon substrate, a substrate of a metal foil, or the like can also be used. Note that any material other than these may be used as long as it functions as a support in a manufacturing process of the light-emitting element.

Note that in this embodiment mode, the light-emitting element is formed over a substrate formed of glass, plastic, or the like. By formation of a plurality of such light-emitting elements over one substrate, a passive matrix light-emitting device can be manufactured. Alternatively, for example, thin film transistors (TFTs) are formed over a substrate formed of glass, plastic, or the like, and light-emitting elements may be formed over electrodes which are electrically connected to the TFTs. Accordingly, an active matrix light-emitting device in which drive of the light-emitting elements is controlled by the TFTs can be manufactured. There is no particular limitation on the structure of the TFTs, and either staggered TFTs or inverted staggered TFTs may be employed. In addition, a driver circuit formed over a TFT substrate may include both n-channel and p-channel TFTs or only an n-channel or p-channel TFT. Further, there is no particular limitation on the crystallinity of a semiconductor film used for the TFTs, and either an amorphous semiconductor film or a crystalline semiconductor film may be used.

[Embodiment Mode 5]

Embodiment mode 5 will describe a mode of a light-emitting element in which a plurality of light-emitting units relating to the present invention is stacked (hereinafter referred to as a stacked-type light-emitting element) with reference to FIG. 5. The light-emitting element is a stacked-type light-emitting element including a plurality of light-emitting units between an anode and a cathode. Each light-emitting unit can have a structure that is similar to that of the layer 203 containing a light-emitting substance which is described in FIGS. 2A and 2B (Embodiment Modes 2 and 3). That is, the light-emitting elements described in Embodiment Modes 2 and 3 are light-emitting elements including one light-emitting unit. In this embodiment mode, a light-emitting element including a plurality of light-emitting units is described.

Figure 5:
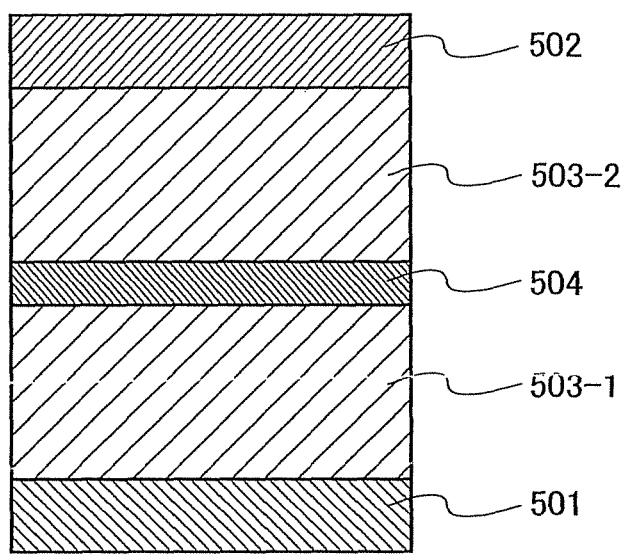
FIG. 5 is a view explaining a light-emitting element of the present invention.

In FIG. 5, a first light-emitting unit 503-1 and a second light-emitting unit 503-2 are stacked between an anode 501 and a cathode 502. As the anode 501 and the cathode 502, an anode and a cathode which are similar to those described in Embodiment Mode 2 can be applied. In addition, the first light-emitting unit 503-1 and the second light-emitting unit 503-2 may have either the same or a different structure, which can be similar to that of the layer 203 containing a light-emitting substance which is described in Embodiment Modes 2 and 3.

Any structure of a charge generation layer 504 interposed between the first light-emitting unit 503-1 and the second light-emitting unit 503-2 is acceptable as long as it is one by which electrons are injected into the first light-emitting unit 503-1 and holes are injected into the second light-emitting unit 503-2 when a voltage is applied between the anode 501 and the cathode 502. However, a preferable example of the charge generation layer 504 is a structure in which at least two layers of a layer which can inject electrons and a layer which can inject holes are included and the layer which can inject electrons is in contact with the first light-emitting unit 503-1 and the layer which can inject holes is in contact with the second light-emitting unit 503-2.

As the layer which can inject electrons, a layer having a structure which is similar to that of the cathode and the electron-injecting layer which are described in Embodiment Mode 2 can be used. In particular, a composite material in which a donor substance is contained in a layer formed of a substance having an electron-transporting property, as described in Embodiment Mode 2, is preferable.

On the other hand, as the layer which can inject holes, a layer, a structure of which is similar to that of the anode and the hole-injecting layer which are described in Embodiment Mode 2, can be used. In particular, a composite material in which an acceptor substance is contained in a layer formed of a substance having a hole-transporting property, as described in Embodiment Mode 2, is preferable.

Therefore, as a specific example of the charge generation layer 504, for example, a structure can be given in which a layer where lithium is added to BPhen, which is a substance having an electron-transporting property, and a layer where molybdenum oxide is added to NPB, which is a substance having a hole-transporting property, are stacked in this order from the anode 501 side.

In Embodiment Mode 5, the light-emitting element having two light-emitting units is described; however, a light-emitting element in which three or more light-emitting units are stacked can also be formed in a similar manner. When a plurality of light-emitting units are arranged to be partitioned from each other with a charge generation layer between a pair of electrodes, like the light-emitting element relating to Embodiment Mode 5, emission from a region of high luminance can be realized at a low current density, and thus, an element with a long life can be achieved. When the light-emitting element is applied to a lighting device, for example, a drop in voltage due to the resistance of an electrode material can be suppressed, and thus, uniform emission in a large area can be achieved. Further, a light-emitting device which can be driven at a low voltage and has low power consumption can be realized.

This embodiment mode can be combined with any of the other embodiment modes, as appropriate. For example, the substrate, the stack order, and the light-emitting direction which are as described in Embodiment Mode 4 can be selected and combined, as appropriate.

[Embodiment Mode 6]

Figure 6A:
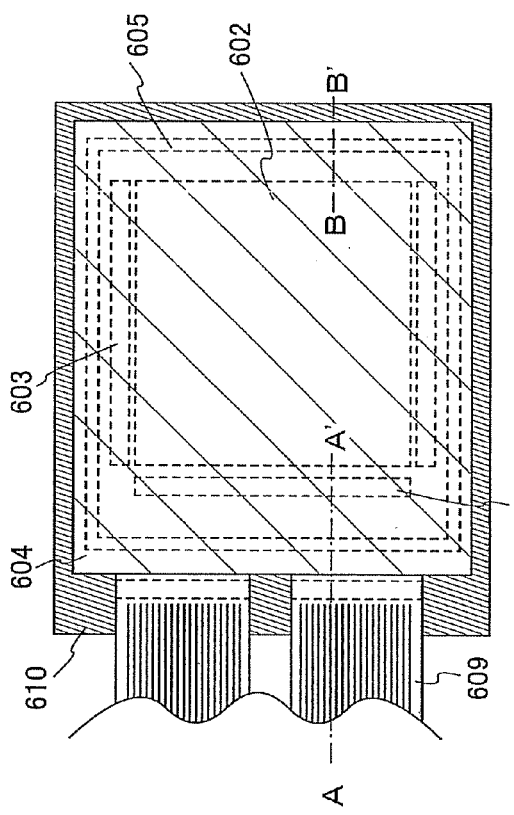
FIGS. 6A and 6B are views explaining a light-emitting device of the present invention.
Figure 6B:
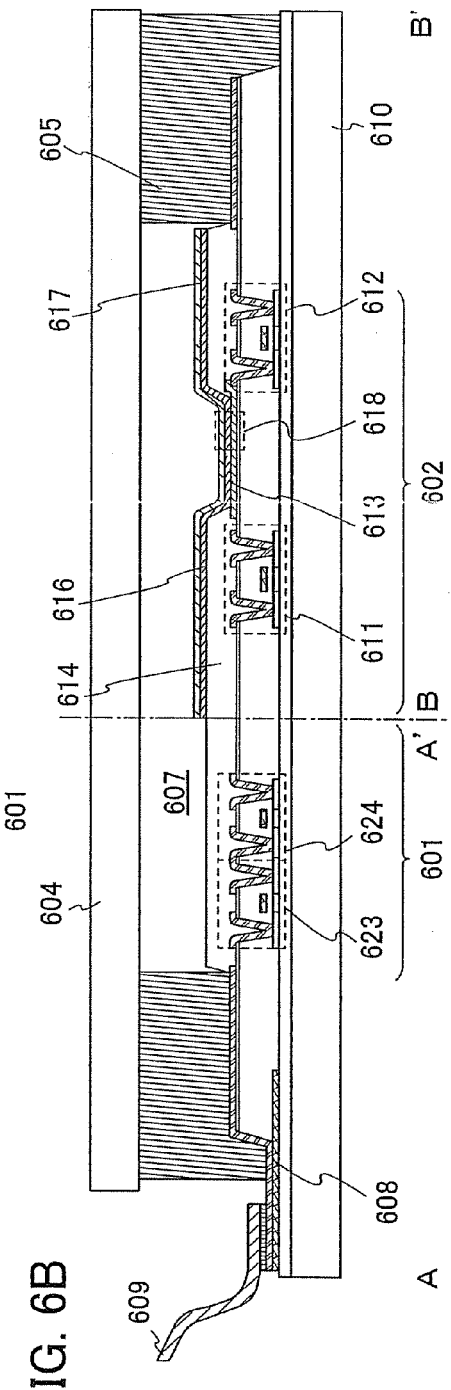

This embodiment mode will describe a light-emitting device having a light-emitting element of the present invention with reference to FIGS. 6A and 6B. FIG. 6A is a top view of the light-emitting device, and FIG. 6B is a cross-sectional view taken along lines A-A' and B-B' in FIG. 6A. The light-emitting device has a driver circuit portion (a source side driver circuit) 601, a pixel portion 602, and a driver circuit portion (a gate side driver circuit) 603 which are indicated by dotted lines to control light emission of the light-emitting element. Reference numerals 604 and 605 denote a sealing substrate and a sealing material, respectively. The inside surrounded by the sealing material 605 is a space 607.

A lead wiring 608 is a wiring used to transmit signals to be inputted to the source side driver circuit 601 and the gate side driver circuit 603 and receives a video signal, a clock signal, a start signal, a reset signal, and the like from a flexible printed circuit (FPC) 609 which is an external input terminal. Note that only the FPC is shown here; however, the FPC may be provided with a printed wiring board (PWB). The category of the light-emitting device in this specification includes not only a light-emitting device itself but also a light-emitting device to which an FPC or a PWB is attached.

Next, a cross-sectional structure is described with reference to FIG. 6B. The driver circuit portion and the pixel portion are formed over an element substrate 610. Here, one pixel in the pixel portion 602 and the source side driver circuit 601 which is the driver circuit portion are shown.

A CMOS circuit, which is a combination of an n-channel TFT 623 and a p-channel TFT 624, is formed as the source side driver circuit 601. Each driver circuit portion may be any of a variety of circuits such as a CMOS circuit, a PMOS circuit, or an NMOS circuit. Although a driver-integration type device, in which a driver circuit is formed over the substrate, is described in this embodiment mode, a driver circuit is not necessarily be formed over the substrate but can be formed externally from the substrate.

The pixel portion 602 is formed of a plurality of pixels each of which includes a switching TFT 611, a current control TFT 612, and an anode 613 which is electrically connected to a drain of the current control TFT 612. Note that an insulator 614 is formed to cover end portions of the anode 613. Here, the insulator 614 is formed using a positive photosensitive acrylic resin film.

The insulator 614 is formed so as to have a curved surface having curvature at an upper end portion or a lower end portion thereof in order to make the coverage favorable. For example, in the case of using a positive photosensitive acrylic resin as a material for the insulator 614, it is preferable that the insulator 614 be formed so as to have a curved surface with radius of curvature (0.2 µm to 3 µm) only at the upper end portion thereof. The insulator 614 can be formed using either a negative type which becomes insoluble in an etchant by light irradiation or a positive type which becomes soluble in an etchant by light irradiation.

A layer 616 containing a light-emitting substance and a cathode 617 are formed over the anode 613. Here, the anode 613 is preferably formed using a material having a high work function. For example, it is possible to use a single-layer film such as an ITO film, indium tin oxide film containing silicon, an indium oxide film containing 2 wt % to 20 wt % zinc oxide, a titanium nitride film, a chromium film, a tungsten film, a Zn film, or a Pt film; a stack of a titanium nitride film and a film containing aluminum as its main component; or a three-layer structure of a titanium nitride film, a film containing aluminum as its main component, and a titanium nitride film. When a stacked structure is employed, resistance as a wiring is low, a good ohmic contact is formed, and further a function as an anode can be obtained.

The layer 616 containing a light-emitting substance is formed by any of a variety of methods such as an evaporation method using an evaporation mask, an inkjet method, or a spin coating method. The layer 616 containing a light-emitting substance has the structure of the light-emitting element of the present invention as described in Embodiment Modes 2 to 5.

As a material used for the cathode 617, which is formed over the layer 616 containing a light-emitting substance, a material having a low work function (Al, Mg, Li, Ca, or an alloy or a compound thereof such as MgAg, MgIn, AlLi, LiF, or $CaF_2$) is preferably used. In a case where light generated in the layer 616 containing a light-emitting substance is transmitted through the cathode 617, a stack of a metal thin film with reduced thickness and a transparent conductive film (ITO, indium oxide containing 2 wt % to 20 wt % of zinc oxide, indium tin oxide containing silicon or silicon oxide, zinc oxide (ZnO), or the like) is preferably used as the cathode 617.

The sealing substrate 604 is attached to the element substrate 610 with the use of the sealing material 605; thus, a light-emitting element 618 is provided in the space 607 surrounded by the element substrate 610, the sealing substrate 604, and the sealing material 605. Note that the space 607 is filled with a filler. The space 607 is filled with an inert gas (e.g., nitrogen or argon) or the sealing material 605 in some cases.

It is preferable that an epoxy-based resin be used to form the sealing material 605 and that such a material permeate little moisture and oxygen as much as possible. Alternatively, the sealing substrate 604 can be formed of, as well as a glass substrate or a quartz substrate, a plastic substrate made of fiberglass-reinforced plastic (FRP), polyvinyl fluoride (PVF), polyester, acrylic, or the like.

As described above, a light-emitting device including the light-emitting element of the present invention and a TFT which is a means for controlling the light-emitting element can be obtained. The light-emitting device of Embodiment Mode 6 can be utilized as an image display device.

The light-emitting device of the present invention has high reliability because the long-lifetime light-emitting element of the present invention is used. In addition, the light-emitting device of the present invention consumes low power because the light-emitting element of the present invention which has high luminous efficiency is used.

In addition, the light-emitting element of the present invention can emit white light. Therefore, a white light-emitting element of the present invention is applied as the light-emitting element of Embodiment Mode 6, so that a white image display device can be manufactured. In addition, the sealing substrate 604 or the element substrate 610 is provided with red, blue, and green color filters to transmit white light of the light-emitting element of the present invention, so that pixels of red, blue, and green which are the three primary colors of light can be obtained. Therefore, the light-emitting device of the present invention can also be used as a full-color image display device. Moreover, when a structure is employed in which a color filter is provided only for part of pixels and the other pixels are not provided with it, it is also possible to form four kinds of a red pixel, a blue pixel, a green pixel, and a white pixel, so that a full-color image can be displayed. Such a method of using four kinds of pixels is effective in reducing power consumption.

Figure 7A:
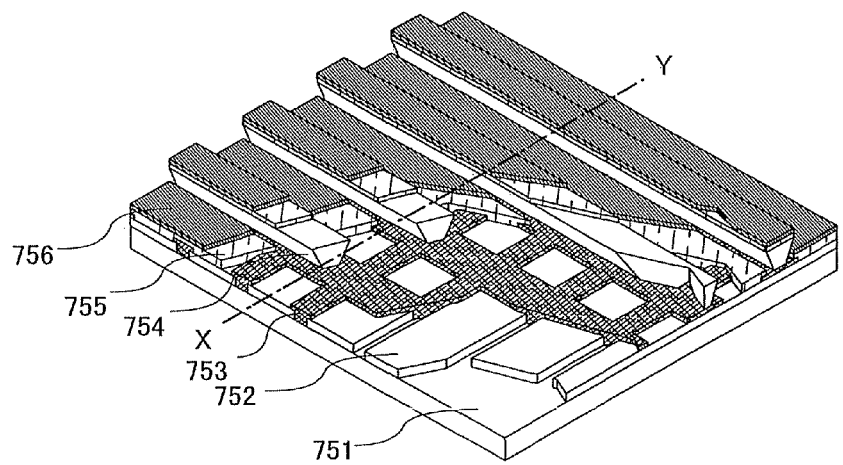
FIGS. 7A and 7B are views explaining a light-emitting device of the present invention.
Figure 7B:
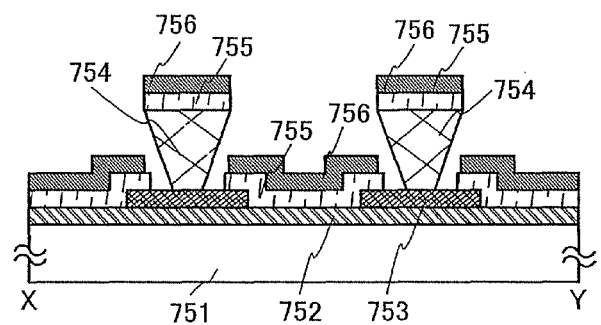

As described above, the active light-emitting device in which the driving of the light-emitting element is controlled by a TFT is described in this embodiment mode. However, a passive light-emitting device may be employed as well. FIGS. 7A and 7B show a passive matrix light-emitting device having the light-emitting element of the present invention. FIG. 7A is a perspective view of the light-emitting device, and FIG. 7B is a cross-sectional view taken along line X-Y of FIG. 7A. In FIGS. 7A and 7B, over a substrate 751, a layer 755 containing a light-emitting substance is provided between an electrode 752 and an electrode 756. As for the layer containing a light-emitting substance, a structure as described in the above-described Embodiment Mode 2 may be applied. An end portion of the electrode 752 is covered with an insulating layer 753. Then, a partition layer 754 is provided over the insulating layer 753. Sidewalls of the partition layer 754 are slanted so that a distance between one of the sidewalls and the other becomes narrower toward a substrate surface. That is, a cross section of the partition layer 754 in the direction of a narrow side is trapezoidal, and a base (a side facing in the same direction as a plane direction of the insulating layer 753 and in contact with the insulating layer 753) is shorter than an upper side (a side facing in the same direction as the plane direction of the insulating layer 753 and not in contact with the insulating layer 753). The partition layer 754 provided in this manner can prevent the light-emitting element from being defective due to static electricity or the like. Also in the passive matrix light-emitting device, a highly reliable light-emitting device can be obtained by including the light-emitting element of the present invention. Moreover, a light-emitting device which consumes low power can be obtained.

[Embodiment Mode 7]

Embodiment Mode 7 exemplifies a liquid crystal display device using the light-emitting element of the present invention as a backlight as an example of the light-emitting device having a light-emitting element of the present invention.

Figure 8:
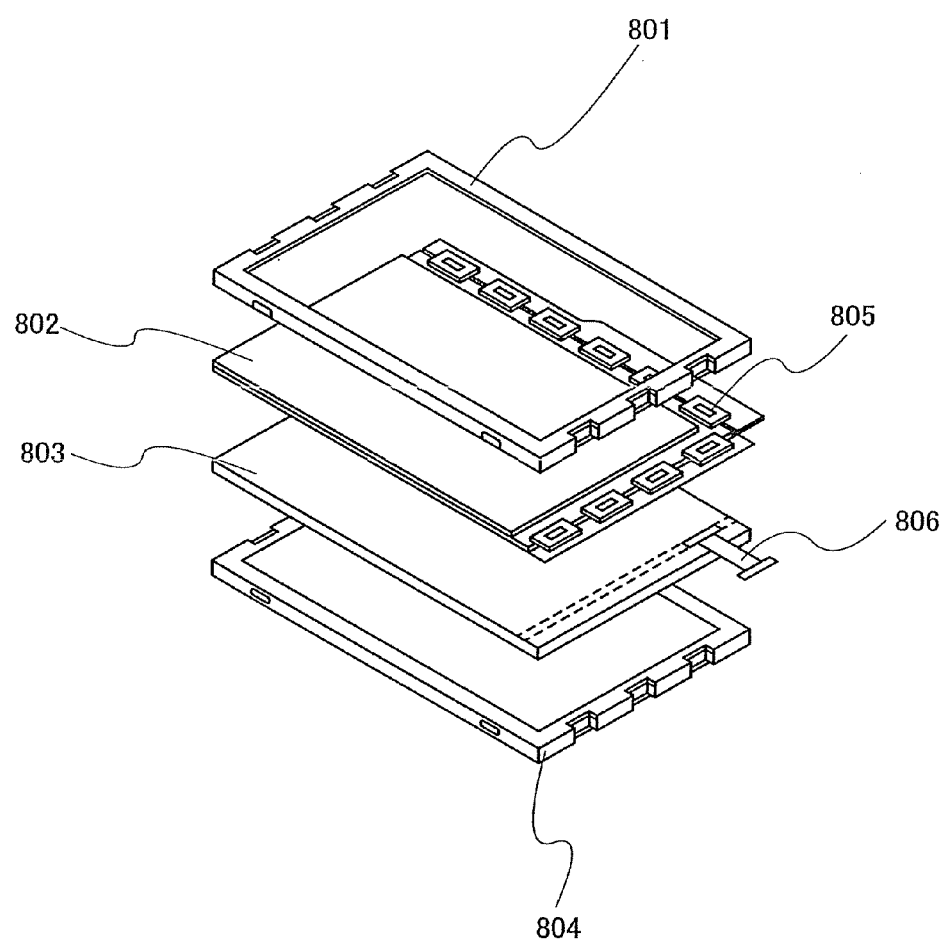
FIG. 8 is a view explaining a light-emitting device of the present invention.

FIG. 8 is a view showing an example of a liquid crystal display device using the light-emitting element of the present invention as a backlight. The liquid crystal display device shown in FIG. 8 includes a housing 801, a liquid crystal layer 802, a backlight 803, and a housing 804, and the liquid crystal layer 802 is connected to a driver IC 805. Further, the light-emitting element of the present invention as described in Embodiment Modes 2 to 5 is used for the backlight 803, and a current is supplied through a terminal 806.

By using the light-emitting element of the present invention as the backlight of the liquid crystal display device, a long-lifetime backlight can be obtained; thus, a highly reliable liquid crystal display device can be obtained. In addition, since the light-emitting element of the present invention is thin and consumes low power, a thin shape and low power consumption of a liquid crystal display device can also be achieved. Further, the light-emitting element of the present invention is a light-emitting element with plane light emission and can be made to have a large area. Therefore, the backlight can have a large area; thus, a liquid crystal display device having a large area can be provided.

[Embodiment Mode 8]

Embodiment Mode 8 will describe a lighting device as an example of the light-emitting device having a light-emitting element of the present invention.

Figure 9A:
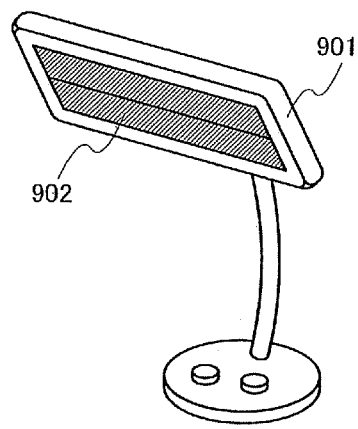
FIGS. 9A and 9B are views explaining a light-emitting device of the present invention.

FIG. 9A shows an example in which the light-emitting device having a light-emitting element of the present invention is applied to a table lamp which is a lighting device. The table lamp shown in FIG. 9A has a housing 901 and a light source 902. The light-emitting element of the present invention as described in Embodiment Modes 2 to 5 is used as the light source 902. The light-emitting device (lighting device) of the present invention can emit light with high luminance; therefore, it can illuminate the area where detail work or the like is being done.

Figure 9B:
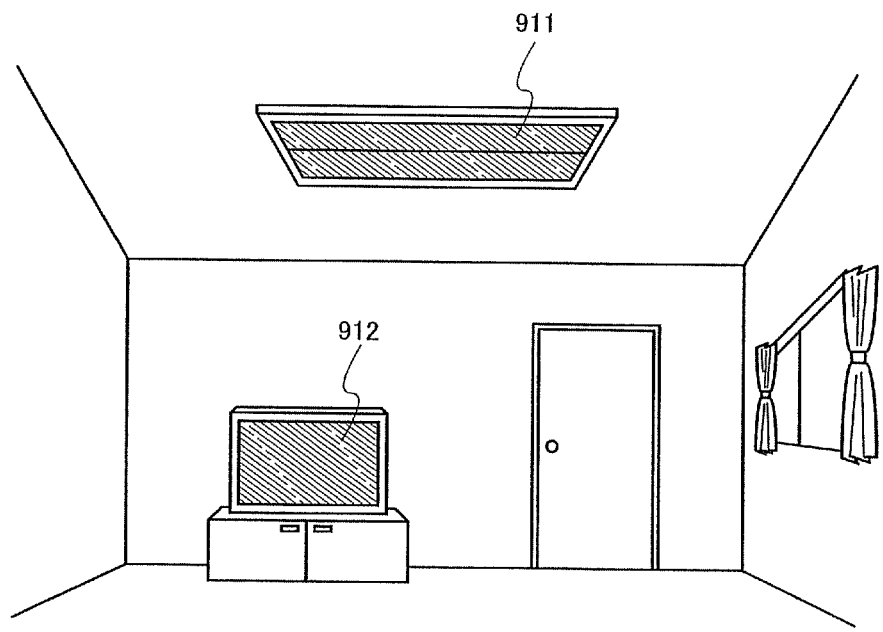

FIG. 9B shows an example in which the light-emitting device having a light-emitting element of the present invention as described in Embodiment Modes 2 to 5 is applied to an indoor lighting device 911. Since the light-emitting element of the present invention can have a larger area, the light-emitting element of the present invention can be used for a lighting device having a large area. Further, since the light-emitting element of the present invention is thin and consumes low power, the light-emitting element of the present invention can be used for a lighting device with a thin shape and low power consumption. A television device 912 (the detail will be described in Embodiment Mode 9) using the light-emitting device of the present invention as described in FIGS. 6A and 6B, FIGS. 7A and 7B, or FIG. 8 as an image display device is thus placed in a room where the light-emitting element of the present invention is used for the indoor lighting device 911 to be able to enjoy public broadcasting and movies. In such a case, since power consumption is low in both devices, a powerful image can be watched in a bright room without any concern about charges for electricity.

[Embodiment Mode 9]

Embodiment Mode 9 will describe electronic devices of the present invention partially including any of the light-emitting devices of the present invention. In particular, electronic devices of the present invention each including the light-emitting device of the present invention as a display portion will be described. The electronic device of the present invention has a highly reliable display portion because the light-emitting device of the present invention as described in Embodiment Modes 6 to 8 is included. Moreover, a display portion having low power consumption is included.

As examples of the electronic devices each including a light-emitting element of the present invention, cameras such as video cameras or digital cameras, goggle type displays, navigation systems, audio playback devices (e.g., car audio sets, audio component sets, or the like), computers, game machines, portable information terminals (e.g., mobile computers, cellular phones, portable game machines, or e-books), an image reproducing device provided with a recording medium (specifically, a device for reproducing a recording medium such as a digital versatile disc (DVD) and having a display device for displaying the reproduced image), and the like are given. Specific examples of these electronic devices are shown in FIGS. 10A to 10D.

Figure 10A:
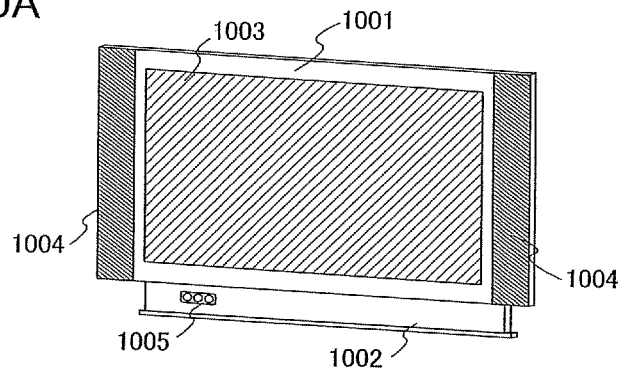
FIGS. 10A to 10D are views each explaining an electronic device of the present invention.

FIG. 10A shows a television set relating to the present invention, which includes a housing 1001, a supporting base 1002, a display portion 1003, a speaker portion 1004, a video input terminal 1005, and the like. In this television set, the display portion 1003 has the light-emitting device of the present invention as described in Embodiment Modes 6 and 7. Therefore, image quality of the display portion 1003 is scarcely deteriorated and low power consumption thereof is achieved. Such features contribute to significant reduction and downsizing of the deterioration compensation function circuits and power source circuits in the television set; therefore, reduction in size and weight of the housing 1001 and the supporting base 1002 can be achieved. In the television set relating to the present invention, high reliability, low power consumption, high image quality, and reduction in size and weight are achieved; therefore, products suitable for living environment can be provided.

Figure 10B:
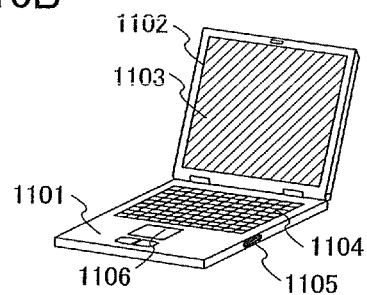

FIG. 10B shows a computer relating to the present invention, which includes a main body 1101, a housing 1102, a display portion 1103, a keyboard 1104, an external connection port 1105, a pointing device 1106, and the like. In this computer, the display portion 1103 has the light-emitting device of the present invention as described in Embodiment Modes 6 and 7. Therefore, image quality of the display portion 1103 is scarcely deteriorated and low power consumption thereof is achieved. Such features contribute to significant reduction and downsizing of the deterioration compensation function circuits and power source circuits in the computer; therefore, reduction in size and weight of the main body 1101 and the housing 1102 can be achieved. In the computer relating to the present invention, high reliability, low power consumption, high image quality, and reduction in size and weight are achieved; therefore, products suitable for the environment can be provided.

Figure 10C:
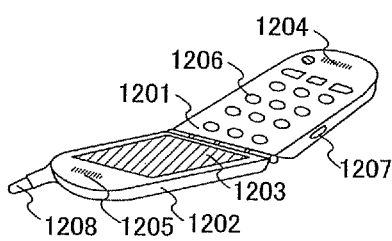

FIG. 10C shows a cellular phone relating to the present invention, which includes a main body 1201, a housing 1202, a display portion 1203, an audio input portion 1204, an audio output portion 1205, operation keys 1206, an external connection port 1207, an antenna 1208, and the like. In this cellular phone, the display portion 1203 has the light-emitting device of the present invention as described in Embodiment Modes 6 and 7. Therefore, image quality of the display portion 1203 is scarcely deteriorated and low power consumption thereof is achieved. Such features contribute to significant reduction and downsizing of the deterioration compensation function circuits and power source circuits in the cellular phone; therefore, reduction in size and weight of the main body 1201 and the housing 1202 can be achieved. In the cellular phone relating to the present invention, high reliability, low power consumption, high image quality, and reduction in size and weight are achieved; therefore, products suitable for portability can be provided.

Figure 10D:
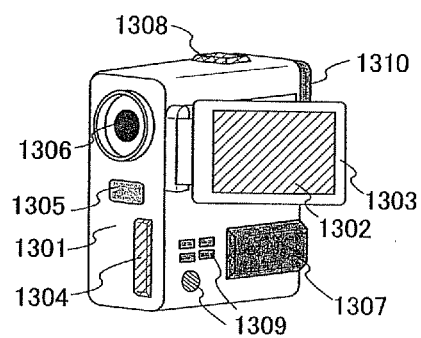

FIG. 10D shows a camera relating to the present invention, which includes a main body 1301, a display portion 1302, a housing 1303, an external connection port 1304, a remote control receiving portion 1305, an image receiving portion 1306, a battery 1307, an audio input portion 1308, operation keys 1309, an eye piece portion 1310, and the like. In this camera, the display portion 1302 has the light-emitting device of the present invention as described in Embodiment Modes 6 and 7. Therefore, image quality of the display portion 1302 is scarcely deteriorated and low power consumption thereof is achieved. Such features contribute to significant reduction and downsizing of the deterioration compensation function circuits and power source circuits in the camera; therefore, reduction in size and weight of the main body 1301 can be achieved. In the camera relating to the present invention, high reliability, low power consumption, high image quality, and reduction in size and weight are achieved; therefore, products suitable for portability can be provided.

As described above, the applicable range of the light-emitting device of the present invention is so wide that the light-emitting device can be applied to electronic appliances of a variety of fields. By applying the light-emitting device of the present invention to any of the electronic devices, an electronic device having a highly reliable display portion can be provided. In addition, an electronic device having a display portion which consumes low power can be provided.

[Embodiment 1]

Figure 11A:
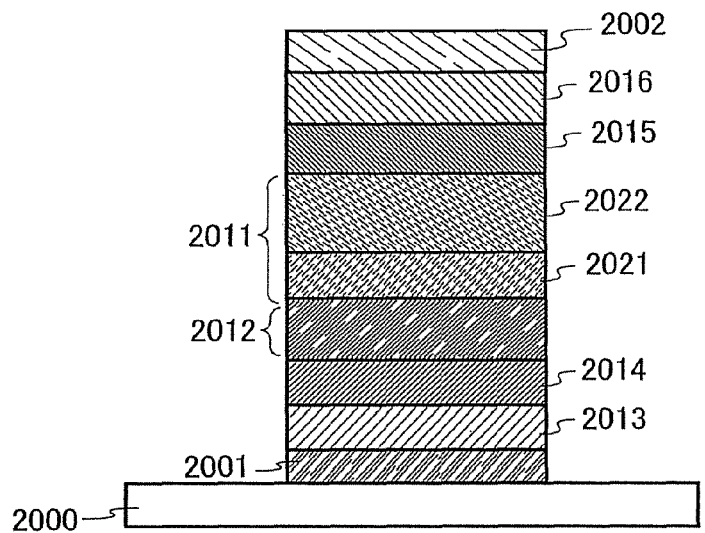
FIGS. 11A and 11B are views each explaining light-emitting elements of embodiments.
Figure 11B:
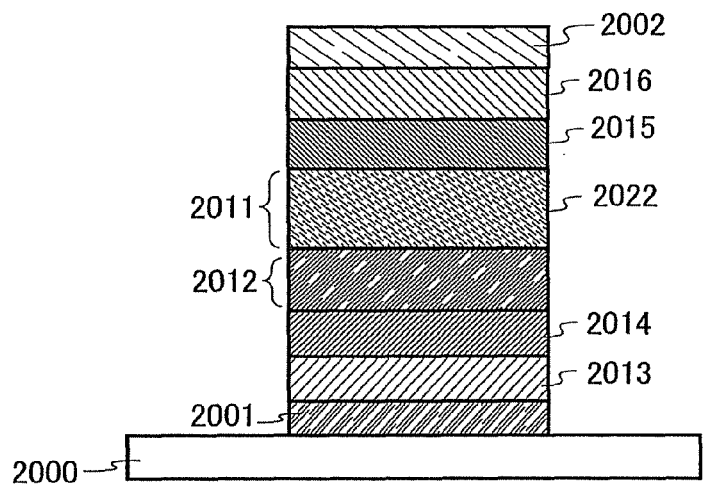

Embodiment 1 will describe a manufacturing example of the light-emitting element of the present invention with reference to FIGS. 11A and 11B. Note that a structural formula of a substance used in this embodiment is shown below.

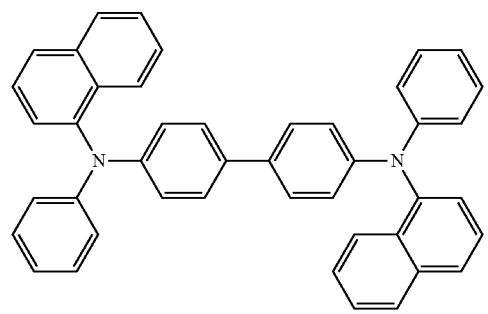

NPB

PCCPA

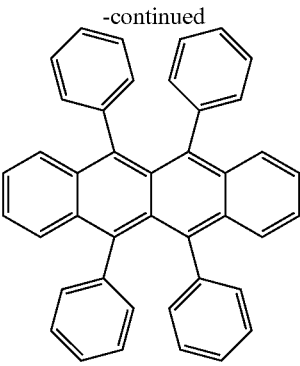

rubrene

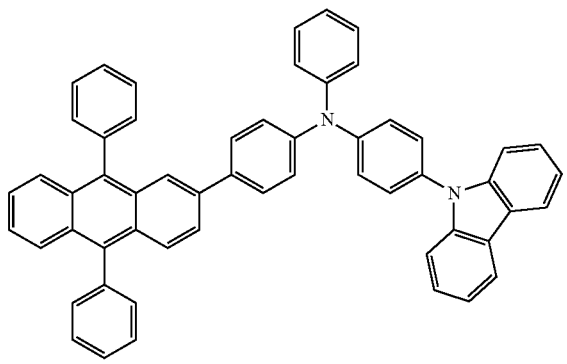

2YGAPPA

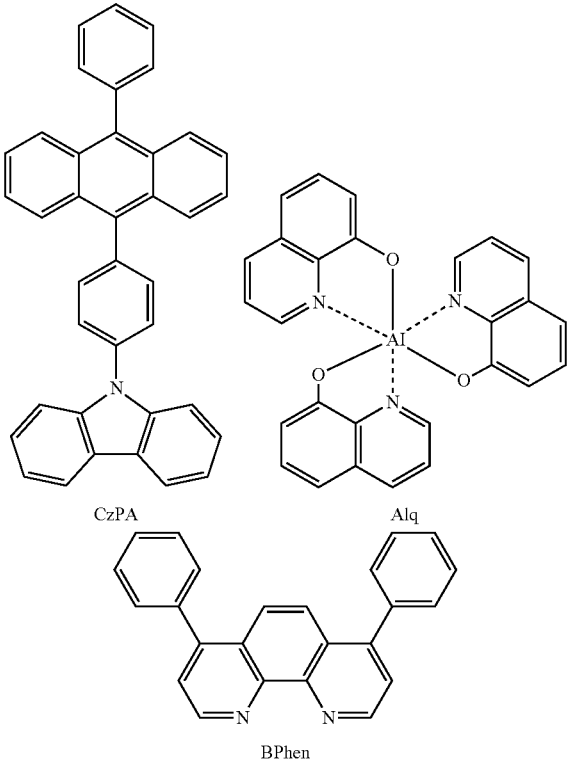

CzPA                Alq

BPhen (Manufacture of Light-Emitting Element 1)

A manufacturing example of a light-emitting element 1 is described with reference to FIG. 11A. First, a glass substrate 2000 over which indium tin silicon oxide (ITSO) which is formed with a thickness of 110 nm as an anode 2001 was prepared. The periphery of the surface of the ITSO was covered with a polymide film so that an area of 2 mm×2 mm of the surface was exposed. The electrode area was 2 mm×2 mm. As pretreatment for fanning the light-emitting element over the substrate, the surface of the substrate was washed with water, and baked at 200° C. for 1 hour, then, UV ozone treatment was performed for 370 seconds. Then, the substrate was transferred into a vacuum evaporation apparatus whose pressure was reduced to approximately $10^{-4}$ Pa, and vacuum baking at 170° C. for 30 minutes was performed in a heating chamber of the vacuum evaporation apparatus. After that, the substrate was cooled down for approximately 30 minutes.

Next, the glass substrate 2000 over which the anode 2001 was formed was fixed to a substrate holder provided in a film formation chamber in a vacuum evaporation apparatus so that the surface provided with the anode 2001 faced downward. Then, first, 4,4'-bis[N-(1-naphthyl)-N-phenylamino]biphenyl (abbreviation: NPB) and molybdenum(VI) oxide were co-evaporated over the anode 2001, whereby a hole-injecting layer 2013 which is formed of a composite material of an organic compound and an inorganic compound was formed. Resistive heating was employed for evaporation. The thickness of the hole-injecting layer 2013 was set to be 50 nm, and the evaporation rate was adjusted such that the weight ratio of NPB to molybdenum(VI) oxide was 4:1 (=NPB:molybdenum oxide). Note that a co-evaporation method is an evaporation method in which evaporation is performed using a plurality of evaporation sources in one treatment chamber at the same time.

Next, NPB was deposited to a thickness of 10 nm by an evaporation method using resistive heating to form a hole-transporting layer 2014.

Further, by co-evaporation of 9-phenyl-9'-[4-(10-phenyl-9-anthryl)phenyl]-3,3'-bi(9H-carbazole) (abbreviation: PCCPA) and rubrene over the hole-transporting layer 2014 using resistive heating, a second light-emitting layer 2012 was formed. The evaporation rate was adjusted such that the weight ratio of PCCPA to rubrene was 1:0.01 (=PCCPA: rubrene). The thickness was set to be 10 nm. Since rubrene serves as a light-emitting substance in the second light-emitting layer 2012, a light-emitting layer which emits yellow light is obtained.

A first light-emitting layer 2011 was formed over the second light-emitting layer 2012. First, by co-evaporation of PCCPA and 2-(4-{N-[4-carbazol-9-yl)phenyl]-N-phenylamino}phenyl)-9,10-diphenylantracene (abbreviation: 2YGAPPA) using resistive heating, a layer 2021 provided on the anode side in the first light-emitting layer 2011 was formed. The evaporation rate was adjusted such that the weight ratio of PCCPA to 2YGAPPA was 1:0.05 (=PCCPA: 2YGAPPA). The thickness of the layer 2021 provided on the anode side was set to be 10 nm. Next, by co-evaporation of 9-[4-(10-phenyl-9-anthryl)phenyl]-9H-carbazole (abbreviation: CzPA) and 2YGAPPA using resistive heating, a layer 2022 provided on a cathode side in the first light-emitting layer 2011 was formed. The evaporation rate was adjusted such that the weight ratio of CzPA to 2YGAPPA was 1:0.05 (=CzPA: 2YGAPPA). The thickness of the layer 2022 provided on a cathode side was set to be 20 nm. Since 2YGAPPA serves as a light-emitting substance in the first light-emitting layer 2011 which is formed as described above, a light-emitting layer which emits blue light is obtained.

After that, tris(8-quinolinolato)aluminum(III) (abbreviation: Alq) was deposited to a thickness of 10 nm and bathophenanthroline (abbreviation: BPhen) was deposited to a thickness of 20 nm by an evaporation method using resistive heating to form an electron-transporting layer 2015.

Further, by an evaporation method using resistive heating, lithium fluoride (LiF) was deposited over the electron-transporting layer 2015 to have a thickness of 1 nm to form an electron-injecting layer 2016.

Lastly, aluminum was deposited to a thickness of 200 nm by an evaporation method using resistive heating to form a cathode 2002. Accordingly, the light-emitting element 1 of the present invention was manufactured.

(Manufacture of Light-Emitting Element 2)

A light-emitting element 2 of the present invention was manufactured in a manner similar to that of the light-emitting element 1 except that the film thickness of the layer 2021 provided on the anode side in the first light-emitting layer 2011 was set to be 20 nm.

(Manufacture of Comparative Light-Emitting Element 3)

For comparison, a comparative light-emitting element 3 without the layer 2021 provided on the anode side in the first light-emitting layer 2011 was manufactured. The element structure is shown in FIG. 11B. As shown in FIG. 11B, a first light-emitting layer 2011 in the comparative light-emitting element 3 includes only the layer 2022 provided on a cathode side in the light-emitting element 1.

First, the comparative light-emitting element 3 which includes an anode 2001, a hole-injecting layer 2013, a hole-transporting layer 2014, an electron-transporting layer 2015, an electron-injecting layer 2016, and a cathode 2002 has the same structure as the light-emitting element 1 and the light-emitting element 2.

On the other hand, a second light-emitting layer 2012 in the comparative light-emitting element 3 was formed by co-evaporation of PCCPA and rubrene using resistive heating. The evaporation rate was adjusted such that the weight ratio of PCCPA to rubrene was 1:0.0025 (=PCCPA:rubrene). The thickness was set to be 10 nm similar to that of the light-emitting element 1. Since rubrene serves as a light-emitting substance in the second light-emitting layer 2012, a light-emitting layer which emits yellow light is obtained. Note that the ratio of rubrene (1:0.0025) in the comparative light-emitting element 3 is lower than that of the light-emitting element 1 (1:0.01) because yellow gets stronger if the addition concentration of rubrene is not lowered and thus white light emission cannot be obtained.

In addition, the first light-emitting layer 2011 in the comparative light-emitting element 3 was formed by co-evaporation of CzPA and 2YGAPPA using resistive heating. The evaporation rate was adjusted such that the weight ratio of CzPA to 2YGAPPA was 1:0.05 (=CzPA:2YGAPPA), and the thickness was set to be 20 nm. Therefore, the first light-emitting layer 2011 in the comparative light-emitting element 3 has exactly the same structure as the layer 2022 provided on the cathode side in the light-emitting element 1. Since 2YGA-PPA serves as a light-emitting substance in the first light-emitting layer 2011 which is formed as described above, a light-emitting layer which emits blue light is obtained.

(Characteristic Comparison of Light-Emitting Element 1, Light-Emitting Element 2, and Comparative Light-Emitting Element 3)

Sealing was performed in a glove box under a nitrogen atmosphere so that the light-emitting element 1 and the light-emitting element 2 of the present invention and the comparative light-emitting element 3 which are obtained through the above-described steps were not exposed to the atmosphere, and then operation characteristics of these light-emitting elements were measured. Note that the measurements were performed at a room temperature (in an atmosphere kept at 25° C.).

Figure 12A:
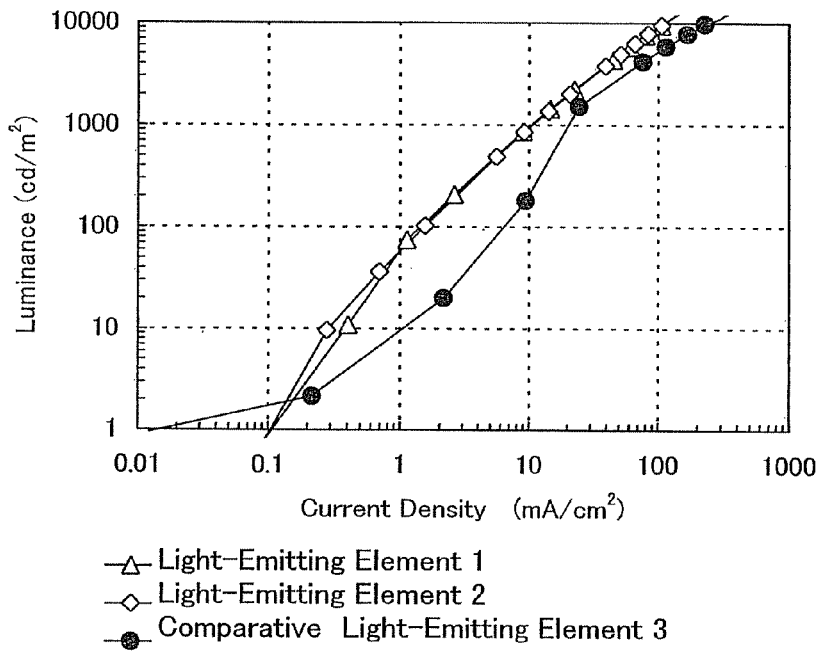
FIGS. 12A and 12B are graphs showing current density vs. luminance characteristics and voltage vs. luminance characteristics of light-emitting elements manufactured in Embodiment 1.
Figure 12B:
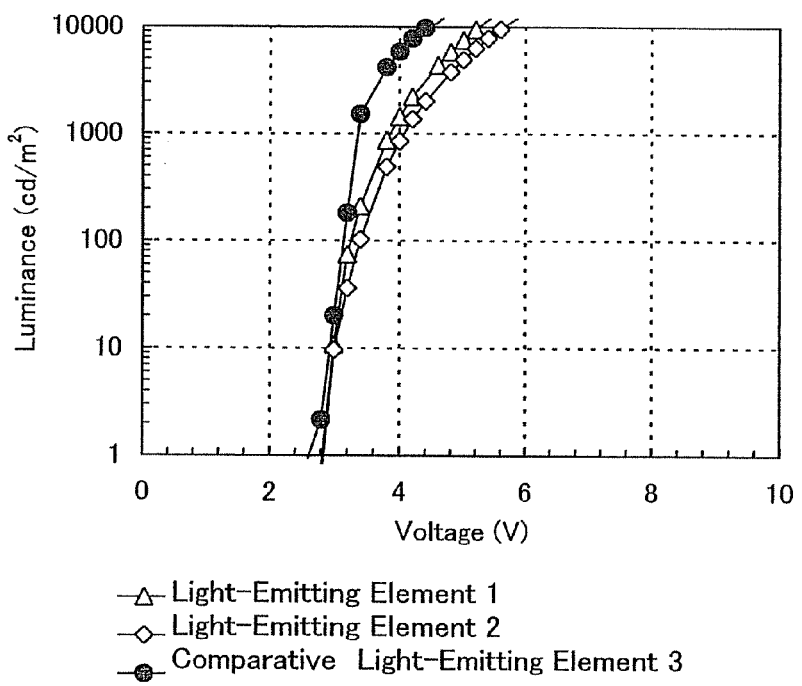
Figure 13:
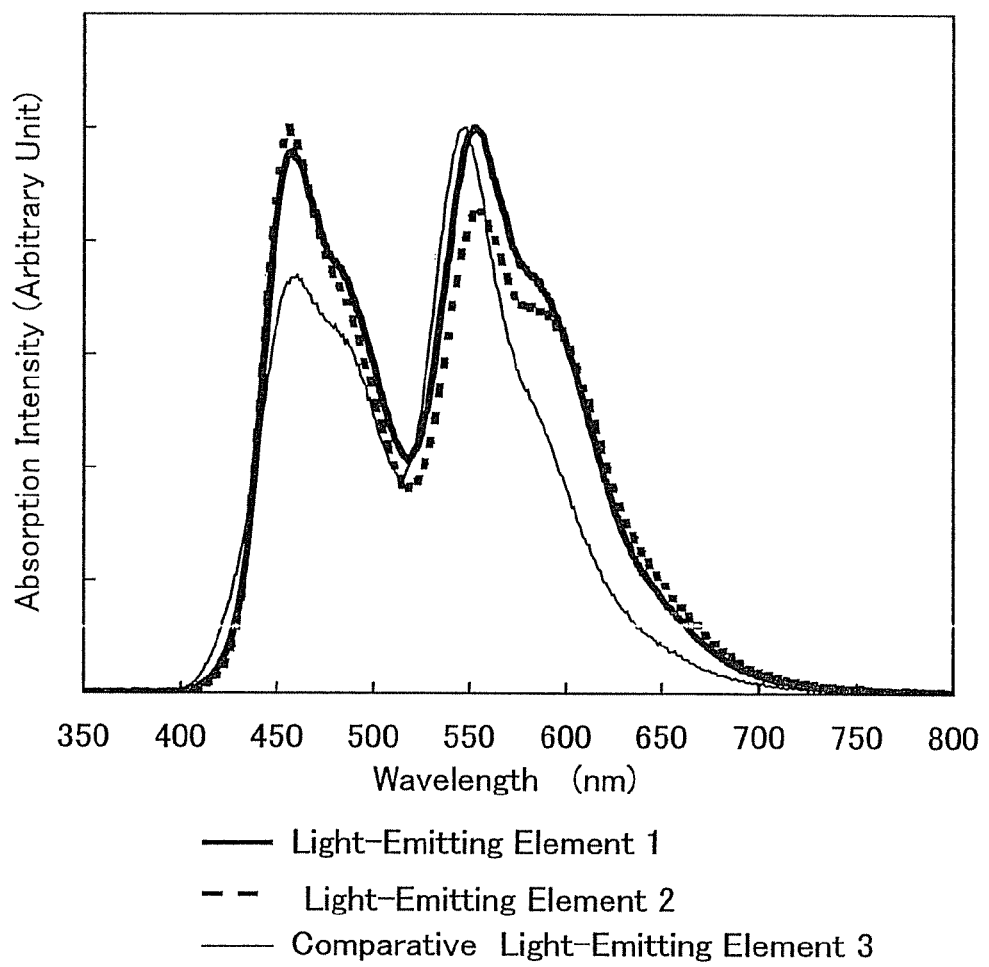
FIG. 13 is a graph showing an emission spectrum of light-emitting elements manufactured in Embodiment 1.

The current density vs. luminance characteristics of the light-emitting element 1, the light-emitting element 2, and the comparative light-emitting element 3 are shown in FIG. 12A. In addition, the voltage vs. luminance characteristics are shown in FIG. 12B. In addition, the emission spectrum at current of 1 mA are shown in FIG. 13.

A voltage of 3.8 [V] was applied to the light-emitting element 1, whereby current flowed with a current density of 9.01 [mA/cm$^2$] and light was emitted with luminance of 870 [cd/m$^2$]. At this time, the current efficiency was 9.7 [cd/A], the power efficiency was 8.0 [lm/W], and the external quantum efficiency was 4.0 [%]. In addition, the CIE chromaticity coordinate was (x=0.30, y=0.35), and white light was emitted. Further, as apparent from the emission spectrum of FIG. 13, both blue light emission near 460 nm and yellow light emission near 550 nm can be obtained in a favorable balance, and the light-emitting element 1 shows a broad emission spectrum.

A voltage of 4.0 [V] was applied to the light-emitting element 2, whereby current flowed with a current density of 9.17 [mA/cm$^2$] and light was emitted with luminance of 850 [cd/m$^2$]. At this time, the current efficiency was 9.3 [cd/A], the power efficiency was 7.3 [lm/W], and the external quantum efficiency was 4.1 [%]. In addition, the CIE chromaticity coordinate was (x=0.30, y=0.33), and white light was emitted. Further, as apparent from the emission spectrum of FIG. 13, both blue light emission near 460 nm and yellow light emission near 550 nm can be obtained in a favorable balance, and the light-emitting element 2 shows a broad emission spectrum.

A voltage of 3.4 [V] was applied to the light-emitting element 3, whereby current flowed with a current density of 24.5 [mA/cm$^2$] and light was emitted with luminance of 1500 [cd/m$^2$]. At this time, the current efficiency was 6.2 [cd/A], the power efficiency was 5.7 [lm/W], and the external quantum efficiency was 2.4 [%]. In addition, the CIE chromaticity coordinate was (x=0.28, y=0.36), and pale yellow light was emitted. Further, as apparent from the emission spectrum of FIG. 13, yellow light emission near 550 nm is slightly strong than blue light emission near 460 nm. In such a manner, yellow light is slightly strong even when the concentration of rubrene which is a yellow light-emitting substance is lowered to the utmost in the element structure like the comparative light-emitting element 3. On the other hand, the light-emitting element 1 and the light-emitting element 2 have a significant feature that white light emission can be obtained even when the concentration of rubrene is increased to some extent. It can be considered that this leads to the difference in luminous efficiency or lifetime which will be mentioned later.

Figure 14A:
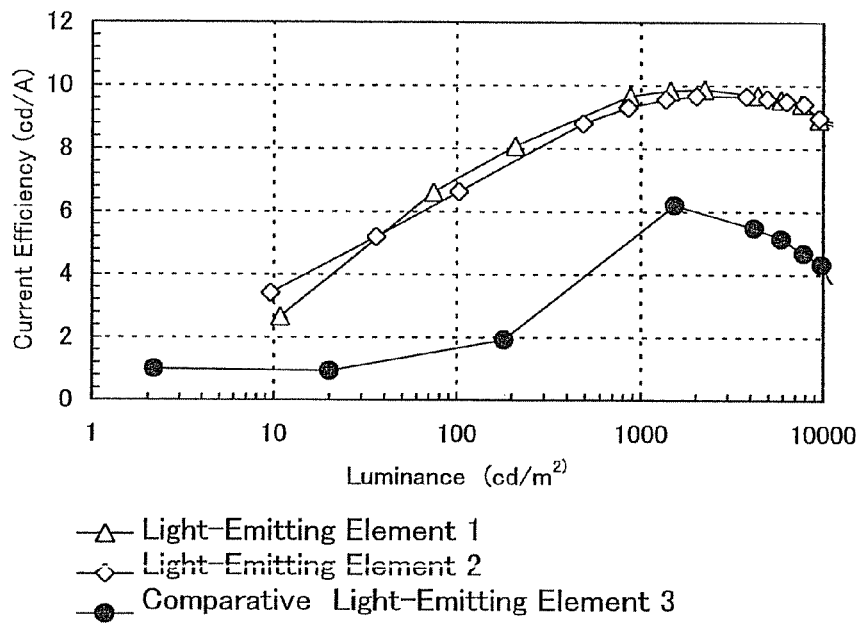
FIGS. 14A and 14B are graphs showing luminance vs. current efficiency characteristics and luminance vs. power efficiency characteristics of light-emitting elements manufactured in Embodiment 1.
Figure 14B:
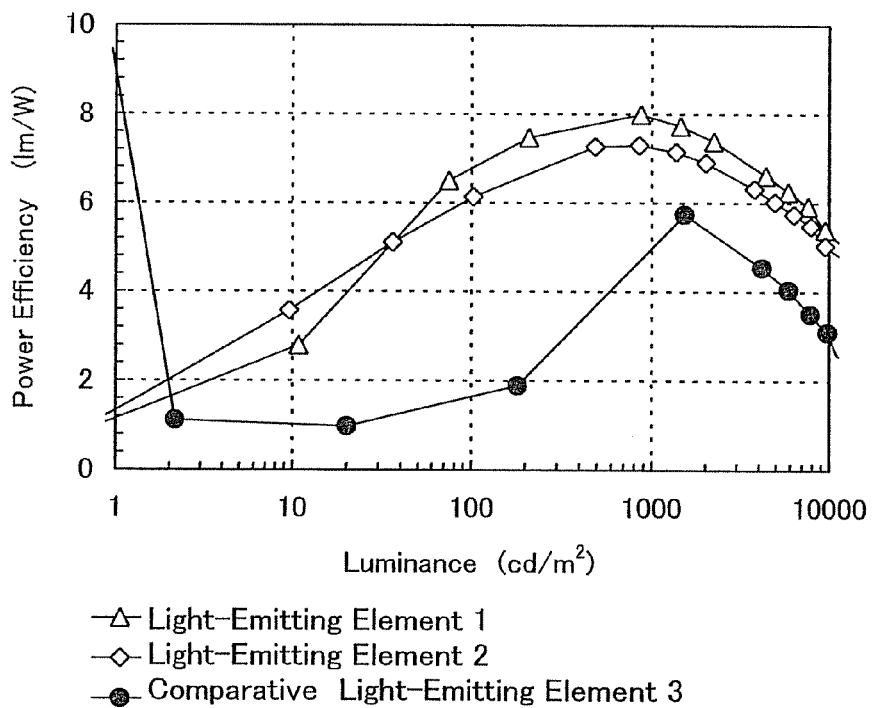

In order to compare luminous efficiency of the light-emitting elements 1 to 3 on the graphs, luminance vs. current efficiency characteristics are shown in FIG. 14A and luminance vs. power efficiency characteristics are shown in FIG. 14B. As shown in FIG. 14A, the light-emitting elements 1 and 2 of the present invention have higher current efficiency than the comparative light-emitting element 3. In addition, although the light-emitting elements 1 and 2 have slightly higher driving voltages than the comparative light-emitting element 3 (see FIG. 12B), the light-emitting elements 1 and 2 are superior to the comparative light-emitting element 3 in power efficiency as shown in FIG. 14B and thus consume low power. This is because the light-emitting elements 1 and 2 have higher current efficiency. In such a manner, it was apparent that the light-emitting element of the present invention has high luminous efficiency.

Figure 15:
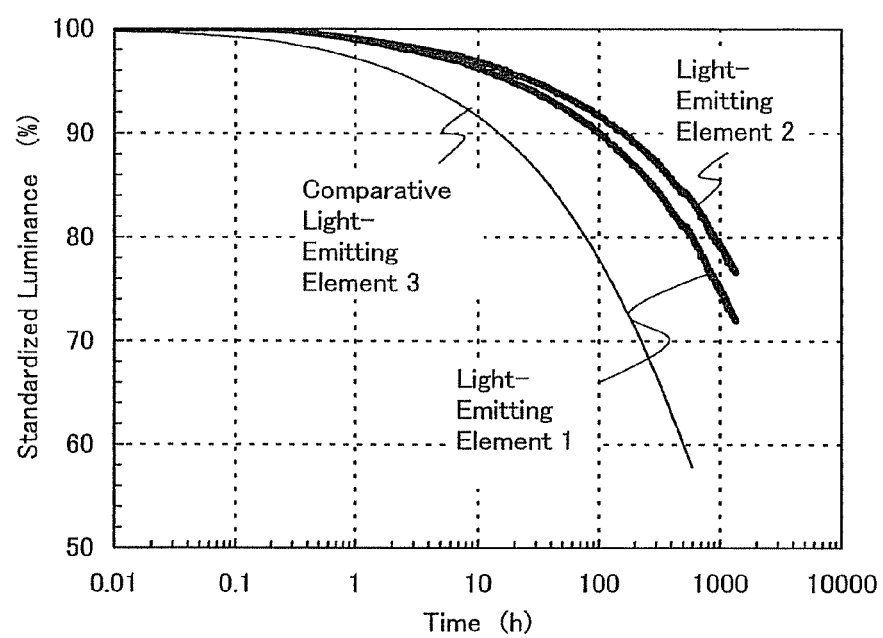
FIG. 15 is a graph showing the result of continuous lighting tests of light-emitting elements manufactured in Embodiment 1 by constant current driving.

Next, FIG. 15 shows the results of continuous lighting tests in which the light-emitting element 1, the light-emitting element 2, and the comparative light-emitting element 3 were continuously lit by constant current driving with the initial luminance set at 1000 cd/m$^2$ (the vertical axis indicates a standardized luminance on the assumption that 1000 cd/m$^2$ is 100%).

As a result of FIG. 15, the light-emitting element 1 kept 75% of the initial luminance even after 1000 hours. Thus, it was proved that the light-emitting element 1 has a long lifetime. In addition, the light-emitting element 2 kept 79% of the initial luminance even after 1000 hours. Thus, it was proved that the light-emitting element 2 has a long lifetime. On the other hand, luminance of the comparative light-emitting element 3 decreased up to 60% of the initial luminance after 500 hours and thus has a short lifetime. In such a manner, it was proved that the light-emitting element of the present invention has a long lifetime.

[Embodiment 2]

Embodiment 2 will specifically describe a manufacturing example of the light-emitting element of the present invention using 4-(10-phenyl-9-anthryl)-4'-(9-phenyl-9H-carbazol-3-yl)triphenylamine (abbreviation: PCBAPA) which is a blue light-emitting substance that differs from 2YGAPPA used in Embodiment 1. A structural formula of PCBAPA is shown below.

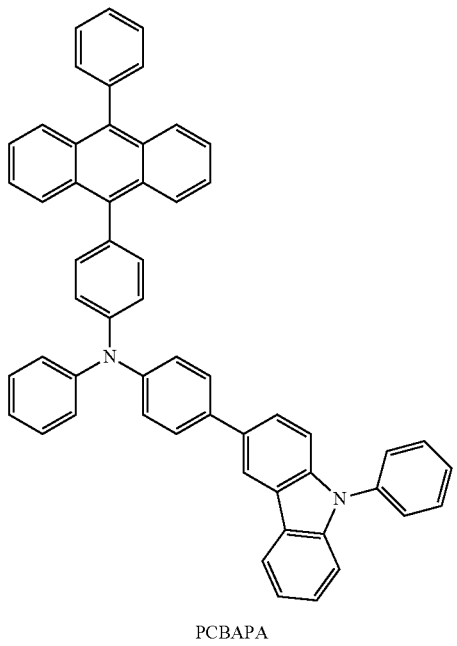

PCBAPA (Manufacture of Light-Emitting Element 4)

A manufacturing example of a light-emitting element 4 is described with reference to FIG. 11A. First, a glass substrate 2000 over which indium tin silicon oxide (ITSO) which is formed with a thickness of 110 nm as an anode 2001 was prepared. The periphery of the surface of the ITSO was covered with a polyimide film so that an area of 2 mm×2 mm of the surface was exposed. The electrode area was 2 mm×2 mm. As pretreatment for forming the light-emitting element over the substrate, the surface of the substrate was washed with water, and baked at 200° C. for 1 hour, then, UV ozone treatment was performed for 370 seconds. Then, the substrate was transferred into a vacuum evaporation apparatus whose pressure was reduced to approximately 10$^{-4}$ Pa, and vacuum baking at 170° C. for 30 minutes was performed in a heating chamber of the vacuum evaporation apparatus. After that, the substrate was cooled down for approximately 30 minutes.

Next, the glass substrate 2000 over which the anode 2001 was formed was fixed to a substrate holder provided in a film formation chamber in a vacuum evaporation apparatus so that the surface provided with the anode 2001 faced downward. Then, first, NPB and molybdenum(VI) oxide were co-evaporated over the anode 2001, whereby a hole-injecting layer 2013 which is formed of a composite material of an organic compound and an inorganic compound was formed. Resistive heating was employed for evaporation. The thickness of the hole-injecting layer 2013 was set to be 50 nm, and the evaporation rate was adjusted such that the weight ratio of NPB to molybdenum(VI) oxide was 4:1 (=NPB:molybdenum oxide). Note that a co-evaporation method is an evaporation method in which evaporation is performed using a plurality of evaporation sources in one treatment chamber at the same time.

Next, NPB was deposited to a thickness of 10 nm by an evaporation method using resistive heating to form a hole-transporting layer 2014.

Further, by co-evaporation of PCCPA and rubrene over the hole-transporting layer 2014 using resistive heating, a second light-emitting layer 2012 was formed. The evaporation rate was adjusted such that the weight ratio of PCCPA to rubrene was 1:0.01 PCCPA:rubrene). The thickness was set to be 20 nm. Since rubrene serves as a light-emitting substance in the second light-emitting layer 2012, a light-emitting layer which emits yellow light is obtained.

A first light-emitting layer 2011 was formed over the second light-emitting layer 2012. First, by co-evaporation of PCCPA and PCBAPA using resistive heating, a layer 2021 provided on the anode side in the first light-emitting layer 2011 was formed. The evaporation rate was adjusted such that the weight ratio of PCCPA to PCBAPA was 1:0.10 (=PCCPA:PCBAPA). The thickness of the layer 2021 provided on the anode side was set to be 10 nm. Next, by co-evaporation of CzPA and PCBAPA using resistive heating, a layer 2022 provided on a cathode side in the first light-emitting layer 2011 was formed. The evaporation rate was adjusted such that the weight ratio of CzPA to PCBAPA was 1:0.10 (=CzPA:PCBAPA). The thickness of the layer 2022 provided on a cathode side was set to be 20 nm. Since PCBAPA serves as a light-emitting substance in the first light-emitting layer 2011 which is formed as described above, a light-emitting layer which emits blue light is obtained.

After that, Alq was deposited to a thickness of 10 nm and BPhen was deposited to a thickness of 20 nm by an evaporation method using resistive heating to form an electron-transporting layer 2015.

Further, by an evaporation method using resistive heating, lithium fluoride (LiF) was deposited over the electron-transporting layer 2015 to have a thickness of 1 nm to form an electron-injecting layer 2016.

Lastly, aluminum was deposited to a thickness of 200 nm by an evaporation method using resistive heating to form a cathode 2002. Accordingly, the light-emitting element 4 of the present invention was manufactured.

(Characteristic Evaluation of Light-Emitting Element 4)

Sealing was performed in a glove box under a nitrogen atmosphere so that the light-emitting element 4 of the present invention which is obtained through the above-described steps was not exposed to the atmosphere, and then operation characteristics of the light-emitting element were measured. Note that the measurements were performed at a room temperature (in an atmosphere kept at 25° C.).

Figure 16A:
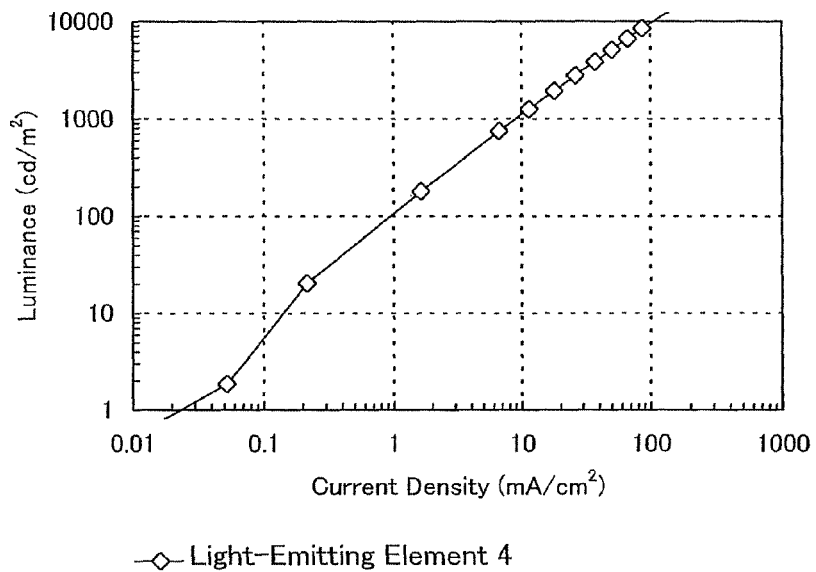
FIGS. 16A and 16B are graphs showing current density vs. luminance characteristics and voltage vs. luminance characteristics of a light-emitting element manufactured in Embodiment 2.
Figure 16B:
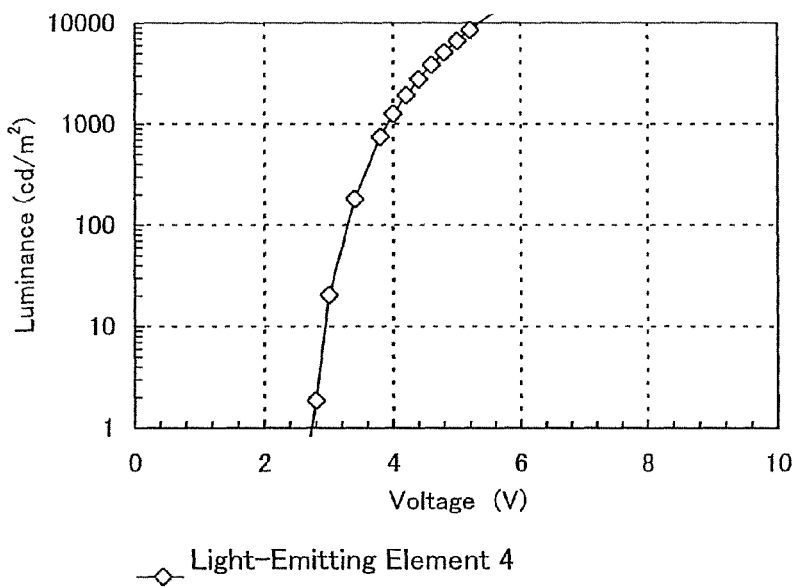
Figure 17:
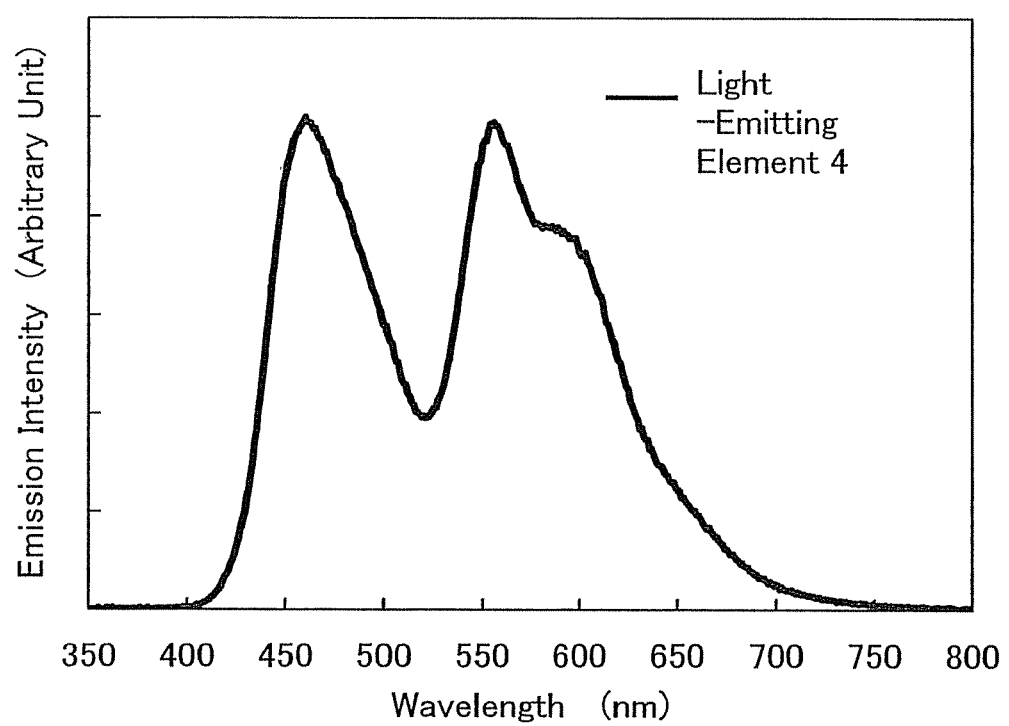
FIG. 17 is a graph showing an emission spectrum of a light-emitting element manufactured in Embodiment 2.

The current density vs. luminance characteristics of the light-emitting element 4 are shown in FIG. 16A. In addition, the voltage vs. luminance characteristics are shown in FIG. 16B. In addition, the emission spectrum at current of 1 mA is shown in FIG. 17.

A voltage of 3.8 [V] was applied to the light-emitting element 4, whereby current flowed with a current density of 6.66 [mA/cm$^2$] and light was emitted with luminance of 750 [cd/m$^2$]. At this time, the current efficiency was 11 [cd/A], the power efficiency was 9.3 [lm/W], and the external quantum efficiency was 5.0 [%]. In addition, the CIE chromaticity coordinate was (x=0.31, y=0.33), and white light was emitted. Further, as apparent from the emission spectrum of FIG. 17, both blue light emission near 460 nm and yellow light emission near 560 nm can be obtained in a favorable balance, and the light-emitting element 4 shows a broad emission spectrum.

Figure 18A:
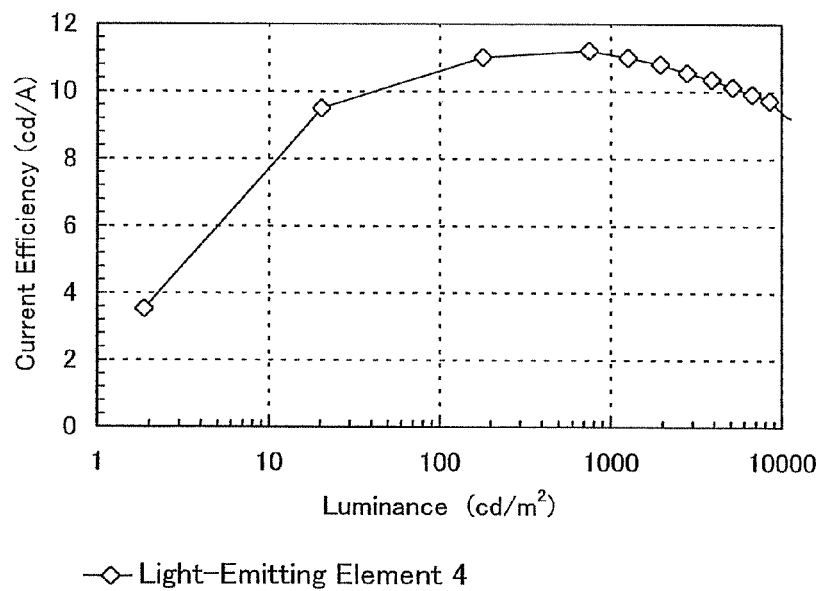
FIGS. 18A and 18B are graphs showing luminance vs. current efficiency characteristics and luminance vs. power efficiency characteristics of a light-emitting element manufactured in Embodiment 2.
Figure 18B:
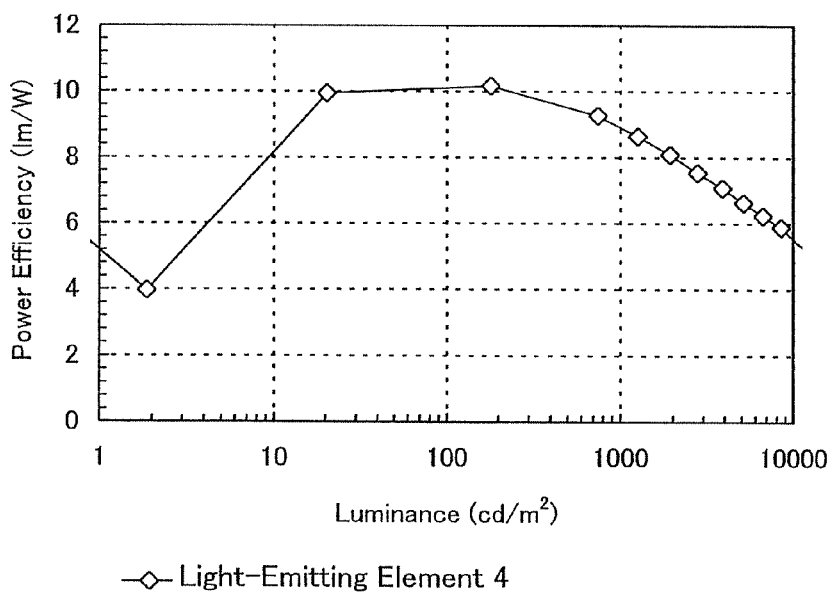

In order to evaluate luminous efficiency of the light-emitting element 4 on the graphs, luminance vs. current efficiency characteristics are shown in FIG. 18A and luminance vs. power efficiency characteristics are shown in FIG. 18B. As shown in FIG. 18A, the light-emitting element 4 of the present invention had extremely high current efficiency and power efficiency in a practical luminance region (100 [cd/m$^2$] to 10000 [cd/m$^2$]). In such a manner, it was apparent that the light-emitting element of the present invention has high luminous efficiency and accordingly consumes low power.

Figure 19:
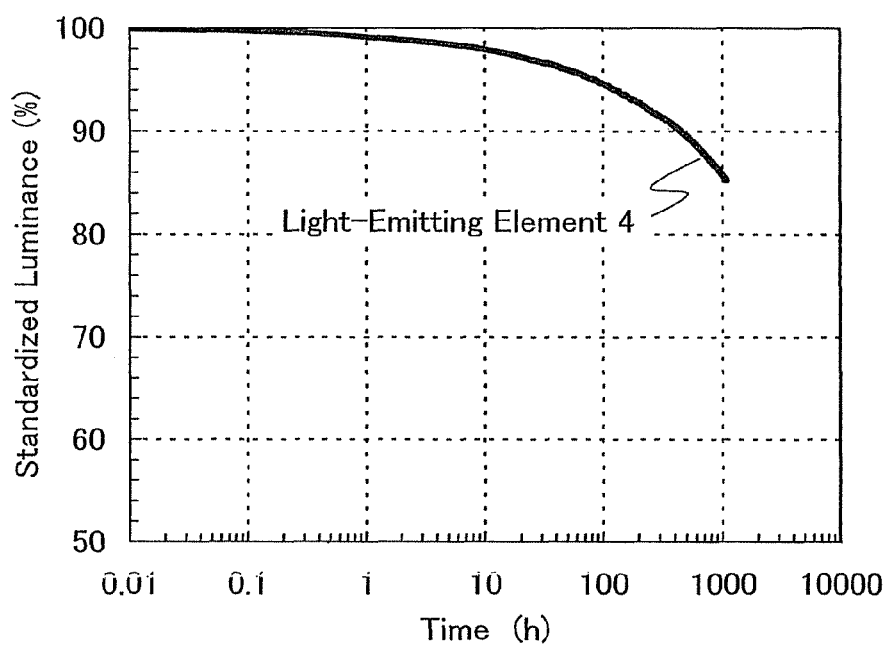
FIG. 19 is a graph showing the result of continuous lighting tests of a light-emitting element manufactured in Embodiment 2 by constant current driving.

Next, FIG. 19 shows the results of continuous lighting tests in which the light-emitting element 4 was continuously lit by constant current driving with the initial luminance set at 1000 cd/m$^2$ (the vertical axis indicates a standardized luminance on the assumption that 1000 cd/m$^2$ is 100%).

As a result of FIG. 19, the light-emitting element 4 kept 86% of the initial luminance even after 1000 hours. Thus, it was proved that the light-emitting element 4 has a long lifetime. Its luminance half-time period is estimated to be approximately 20,000 hours. In such a manner, it was proved that the light-emitting element of the present invention has a long lifetime.

[Embodiment 3]

In Embodiment 3, a light-emitting element 5 was manufactured with a structure similar to that of the light-emitting element 4 of Embodiment 2 except that the electron-transporting layer 2015 and the electron-injecting layer 2016 were changed as described below.

An electron-transporting layer 2015 in the light-emitting element 5 was formed by evaporation of Alq to a thickness of 10 nm by resistive heating. In addition, an electron-injecting layer 2016 was formed by co-evaporation of BPhen and lithium (Li). Resistive heating was employed for evaporation. The thickness of the electron-injecting layer 2016 was set to be 20 nm, and the evaporation rate was adjusted such that the weight ratio of BPhen to Li was 1:0.01 (=BPhen:Li).

(Characteristic Evaluation of Light-Emitting Element 5)

Sealing was performed in a glove box under a nitrogen atmosphere so that the light-emitting element 5 of the present invention which is obtained through the above-described steps was not exposed to the atmosphere, and then operation characteristics of the light-emitting element were measured. Note that the measurements were performed at a room temperature (in an atmosphere kept at 25° C.).

Figure 20A:
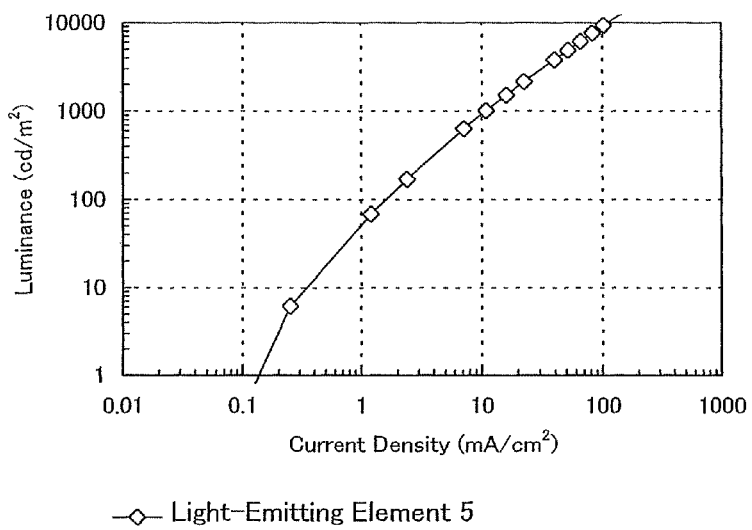
FIGS. 20A and 20B are graphs showing current density vs. luminance characteristics and voltage vs. luminance characteristics of a light-emitting element manufactured in Embodiment 3.
Figure 20B:
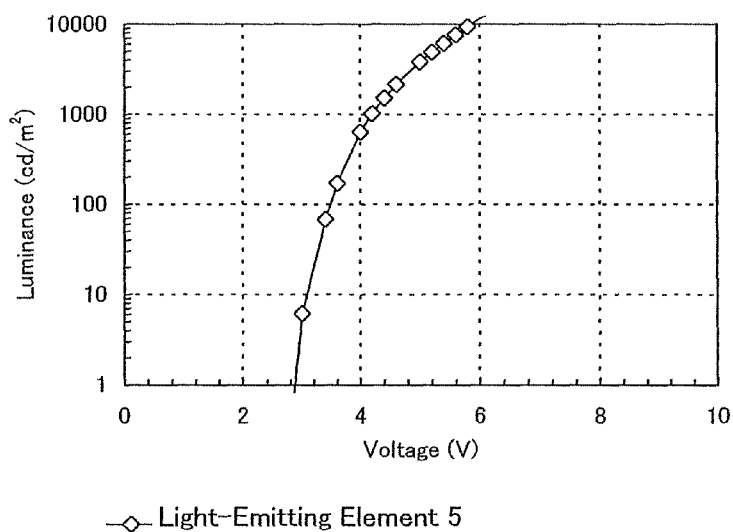
Figure 21:
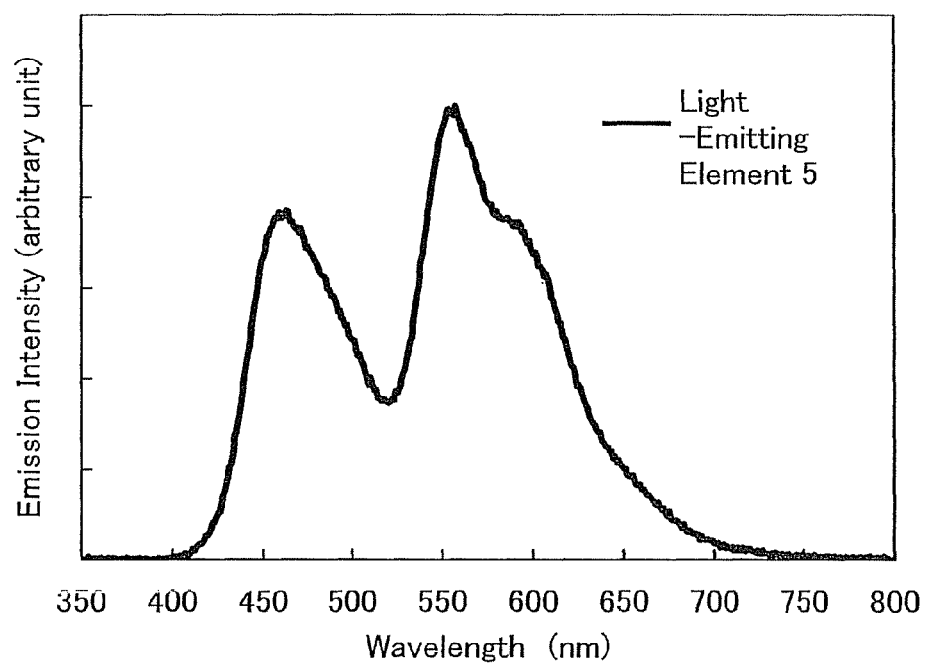
FIG. 21 is a graph showing an emission spectrum of a light-emitting element manufactured in Embodiment 3.

The current density vs. luminance characteristics of the light-emitting element 5 are shown in FIG. 20A. In addition, the voltage vs. luminance characteristics are shown in FIG. 20B. In addition, the emission spectrum at current of 1 mA is shown in FIG. 21.

A voltage of 4.2 [V] was applied to the light-emitting element 5, whereby current flowed with a current density of 10.9 [mA/cm$^2$] and light was emitted with luminance of 1000 [cd/m$^2$]. At this time, the current efficiency was 9.3 [cd/A], the power efficiency was 7.0 [lm/W], and the external quantum efficiency was 3.8 [%]. In addition, the CIE chromaticity coordinate was (x=0.32, y=0.35), and white light was emitted. Further, as apparent from the emission spectrum of FIG. 21, both blue light emission near 460 nm and yellow light emission near 560 nm can be obtained in a favorable balance, and the light-emitting element 5 shows a broad emission spectrum.

Figure 22A:
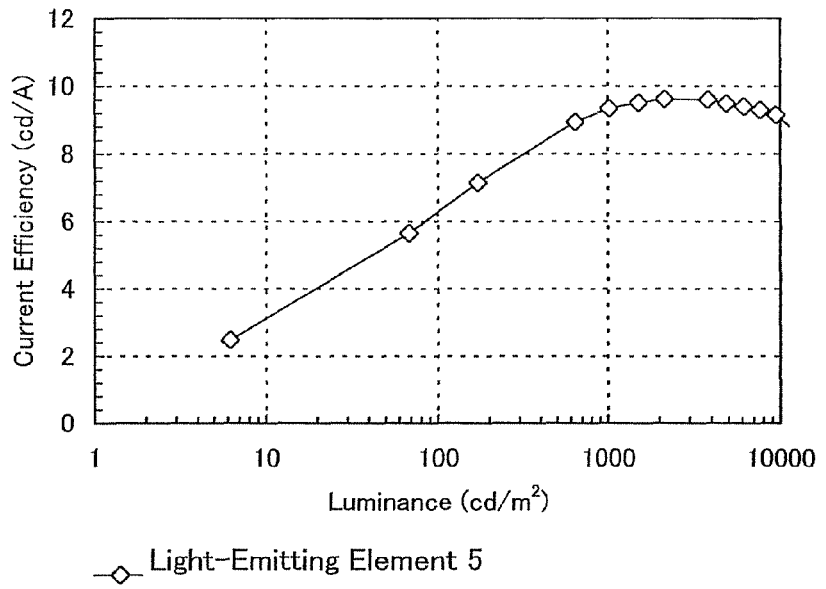
FIGS. 22A and 22B are graphs showing luminance vs. current efficiency characteristics and luminance vs. power efficiency characteristics of a light-emitting element manufactured in Embodiment 3.
Figure 22B:
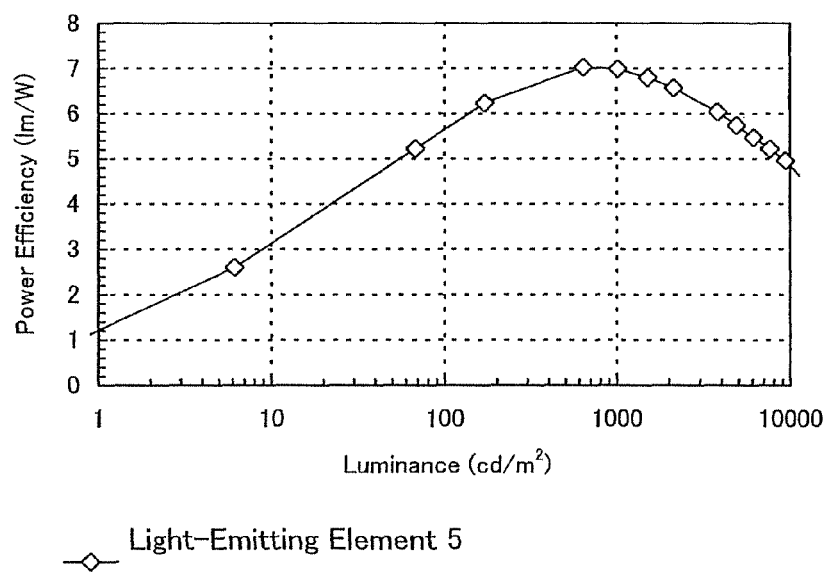

In order to evaluate luminous efficiency of the light-emitting element 5 on the graphs, luminance vs. current efficiency characteristics are shown in FIG. 22A and luminance vs. power efficiency characteristics are shown in FIG. 22B. As shown in FIG. 22A, the light-emitting element 5 of the present invention had extremely high current efficiency and power efficiency in a practical luminance region (100 [cd/m$^2$] to 10000 [cd/m$^2$]). In such a manner, it was apparent that the light-emitting element of the present invention has high luminous efficiency and accordingly consumes low power.

Figure 23:
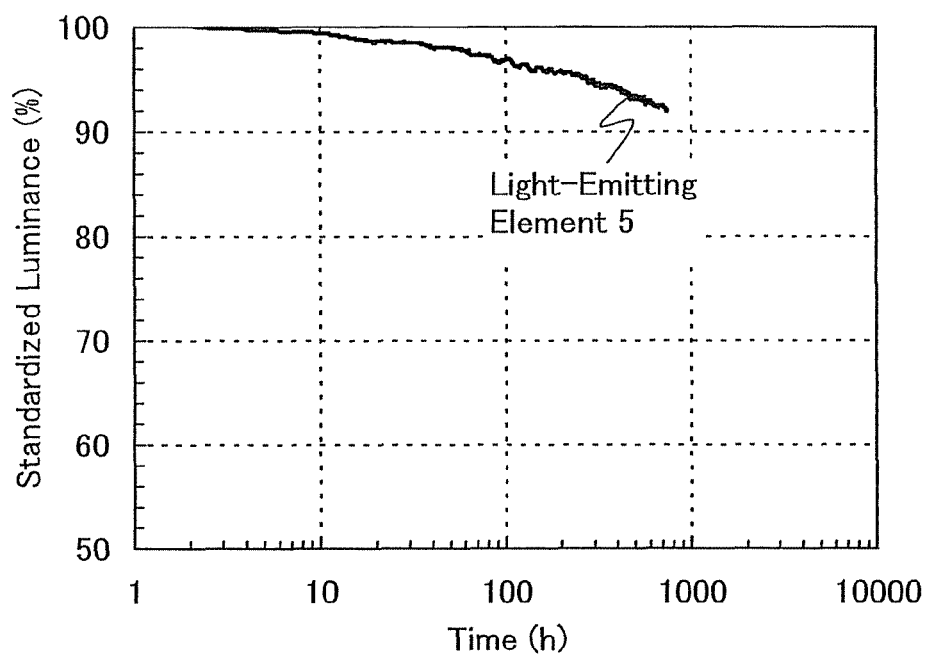
FIG. 23 is a graph showing the result of continuous lighting tests of a light-emitting element manufactured in Embodiment 3 by constant current driving.

Next, FIG. 23 shows the results of continuous lighting tests in which the light-emitting element 5 was continuously lit by constant current driving with the initial luminance set at 1000 cd/m$^2$ (the vertical axis indicates a standardized luminance on the assumption that 1000 cd/m$^2$ is 100%).

As a result of FIG. 23, the light-emitting element 5 kept 92% of the initial luminance even after 740 hours. Thus, it was proved that the light-emitting element 5 has a long lifetime. Its luminance half-time period is estimated to be approximately 40,000 hours to 50,000 hours. In such a manner, it was proved that the light-emitting element of the present invention has a long lifetime.

[Embodiment 4]

Figure 24:
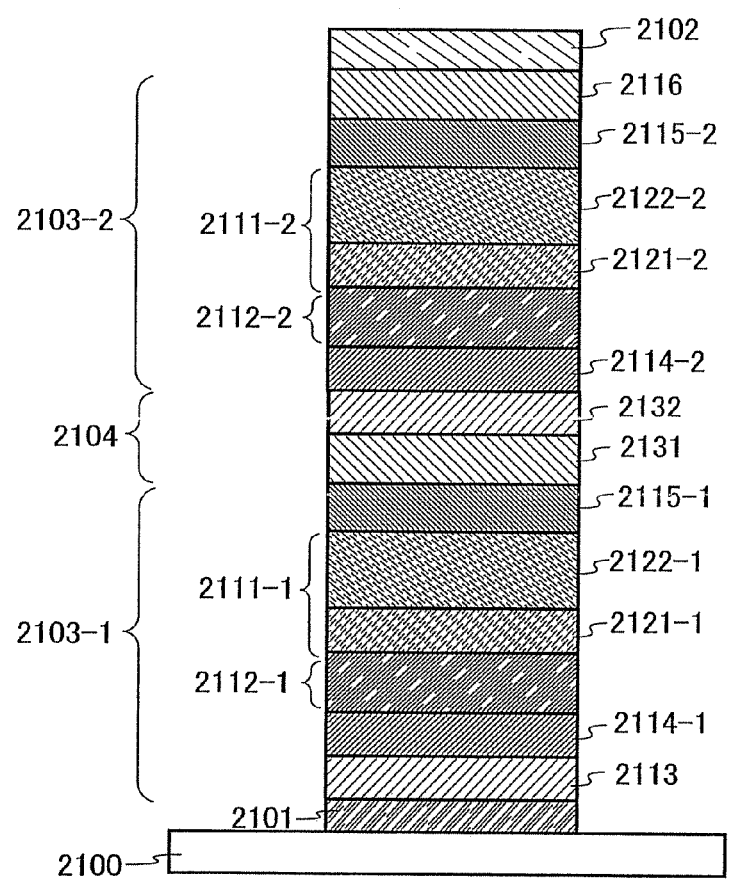
FIG. 24 is a view explaining light-emitting elements of embodiments.

Embodiment 4 will describe a manufacturing example of the stacked-type light-emitting element having a plurality of light-emitting units as described in Embodiment Mode 5 with reference to FIG. 24. In a stacked-type light-emitting element (light-emitting element 6) of Embodiment 4 as shown in FIG. 24, a first light-emitting unit 2103-1 and a second light-emitting unit 2103-2 are stacked between an anode 2101 and a cathode 2102. In addition, a charge generation layer 2104 is formed between the first light-emitting unit 2103-1 and the second light-emitting unit 2103-2.

(Manufacture of Light-Emitting Element 6)

First, a glass substrate 2100 over which indium tin silicon oxide (ITSO) which is formed with a thickness of 110 nm as the anode 2101 was prepared. The periphery of the surface of the ITSO was covered with a polyimide film so that an area of 2 mm×2 mm of the surface was exposed. The electrode area was 2 mm×2 mm. As pretreatment for forming the light-emitting element over the substrate, the surface of the substrate was washed with water, and baked at 200° C. for 1 hour, then, UV ozone treatment was performed for 370 seconds. Then, the substrate was transferred into a vacuum evaporation apparatus whose pressure was reduced to approximately 10$^{-4}$ Pa, and vacuum baking at 170° C. for 30 minutes was performed in a heating chamber of the vacuum evaporation apparatus. After that, the substrate was cooled down for approximately 30 minutes.

Next, the glass substrate 2100 over which the anode 2101 was formed was fixed to a substrate holder provided in a film formation chamber in a vacuum evaporation apparatus so that the surface provided with the anode 2101 faced downward. Then, the first light-emitting unit 2103-1 was formed with the following procedure.

First, NPB and molybdenum(VI) oxide were co-evaporated over the anode 2101, whereby a hole-injecting layer 2113 which is formed of a composite material of an organic compound and an inorganic compound was formed. Resistive heating was employed for evaporation. The thickness of the hole-injecting layer 2113 was set to be 50 nm, and the evaporation rate was adjusted such that the weight ratio of NPB to molybdenum(VI) oxide was 4:1 (=NPB:molybdenum oxide). Note that a co-evaporation method is an evaporation method in which evaporation is performed using a plurality of evaporation sources in one treatment chamber at the same time.

Next, NPB was deposited to a thickness of 10 nm by an evaporation method using resistive heating to for in a hole-transporting layer 2114-1.

Further, by co-evaporation of PCCPA and rubrene over the hole-transporting layer 2114-1 using resistive heating, a second light-emitting layer 2112-1 was formed. The evaporation rate was adjusted such that the weight ratio of PCCPA to rubrene was 1:0.01 (=PCCPA:rubrene). The thickness was set to be 20 nm. Since rubrene serves as a light-emitting substance in the second light-emitting layer 2112-1, a light-emitting layer which emits yellow light is obtained.

A first light-emitting layer 2111-1 was formed over the second light-emitting layer 2112-1. First, by co-evaporation of PCCPA and PCBAPA using resistive heating, a layer 2121-1 provided on the anode side in the first light-emitting layer 2111-1 was formed. The evaporation rate was adjusted such that the weight ratio of PCCPA to PCBAPA was 1:0.10 (=PCCPA:PCBAPA). The thickness of the layer 2121-1 provided on the anode side was set to be 10 nm. Next, by co-evaporation of CzPA and PCBAPA using resistive heating, a layer 2122-1 provided on the cathode side in the first light-emitting layer 2111-1 was formed. The evaporation rate was adjusted such that the weight ratio of CzPA to PCBAPA was 1:0.10 CzPA: PCBAPA). The thickness of the layer 2122-1 provided on the cathode side was set to be 20 nm. Since PCBAPA serves as a light-emitting substance in the first light-emitting layer 2111-1 which is formed as described above, a light-emitting layer which emits blue light is obtained.

After that, Alq was deposited to a thickness of 10 nm by an evaporation method using resistive heating to form an electron-transporting layer 2115-1.

Next, the charge generation layer 2104 was formed. The charge generation layer 2104 was formed to have a stacked-layer structure of a first layer 2131 and a second layer 2132. First, the first layer 2131 was formed by co-evaporation of BPhen and lithium (Li). Resistive heating was employed for evaporation. The thickness of the first layer 2131 was set to be 20 nm, and the evaporation rate was adjusted such that the weight ratio of BPhen to Li was 1:0.01 BPhen:Li). Further, NPB and molybdenum(VI) oxide were co-evaporated, whereby the second layer 2132 which is formed of a composite material of an organic compound and an inorganic compound was formed. Resistive heating was employed for evaporation. The thickness of the second layer 2132 was set to be 50 nm, and the evaporation rate was adjusted such that the weight ratio of NPB to molybdenum(VI) oxide was 4:1 (=NPB:molybdenum oxide). The structure of the charge generation layer is as described above.

Next, the second light-emitting unit 2103-2 was formed with the following procedure.

First, NPB was deposited to a thickness of 10 nm by an evaporation method using resistive heating to form a hole-transporting layer 2114-2.

Further, by co-evaporation of PCCPA and rubrene over the hole-transporting layer 2114-2 using resistive heating, a second light-emitting layer 2112-2 was formed. The evaporation rate was adjusted such that the weight ratio of PCCPA to rubrene was 1:0.01 PCCPA:rubrene). The thickness was set to be 20 nm. Since rubrene serves as a light-emitting substance in the second light-emitting layer 2112-2, a light-emitting layer which emits yellow light is obtained.

A first light-emitting layer 2111-2 was formed over the second light-emitting layer 2112-2. First, by co-evaporation of PCCPA and PCBAPA using resistive heating, a layer 2121-2 provided on the anode side in the first light-emitting layer 2111-2 was formed. The evaporation rate was adjusted such that the weight ratio of PCCPA to PCBAPA was 1:0.10 PCCPA:PCBAPA). The thickness of the layer 2121-2 provided on the anode side was set to be 10 nm. Next, by co-evaporation of CzPA and PCBAPA using resistive heating, a layer 2122-2 provided on the cathode side in the first light-emitting layer 2111-2 was formed. The evaporation rate was adjusted such that the weight ratio of CzPA to PCBAPA was 1:0.10 CzPA:PCBAPA). The thickness of the layer 2122-2 provided on the cathode side was set to be 20 nm. Since PCBAPA serves as a light-emitting substance in the first light-emitting layer 2111-2 which is formed as described above, a light-emitting layer which emits blue light is obtained.

After that, Alq was deposited to a thickness of 10 nm by an evaporation method using resistive heating to form an electron-transporting layer 2115-2. Further, an electron-injecting layer 2116 was formed by co-evaporation of BPhen and lithium (Li). Resistive heating was employed for evaporation. The thickness of the electron-injecting layer 2116 was set to be 20 nm, and the evaporation rate was adjusted such that the weight ratio of BPhen to Li was 1:0.01 (=BPhen:Li). The second light-emitting unit 2103-2 was formed as described above.

Lastly, aluminum was deposited to a thickness of 200 nm by an evaporation method using resistive heating to form the cathode 2102. Accordingly, the light-emitting element 6 of the present invention was manufactured.

(Characteristic Evaluation of Light-Emitting Element 6)

Sealing was performed in a glove box under a nitrogen atmosphere so that the light-emitting element 6 of the present invention which is obtained through the above-described steps was not exposed to the atmosphere, and then operation characteristics of the light-emitting element were measured. Note that the measurements were performed at a room temperature (in an atmosphere kept at 25° C.).

Figure 25A:
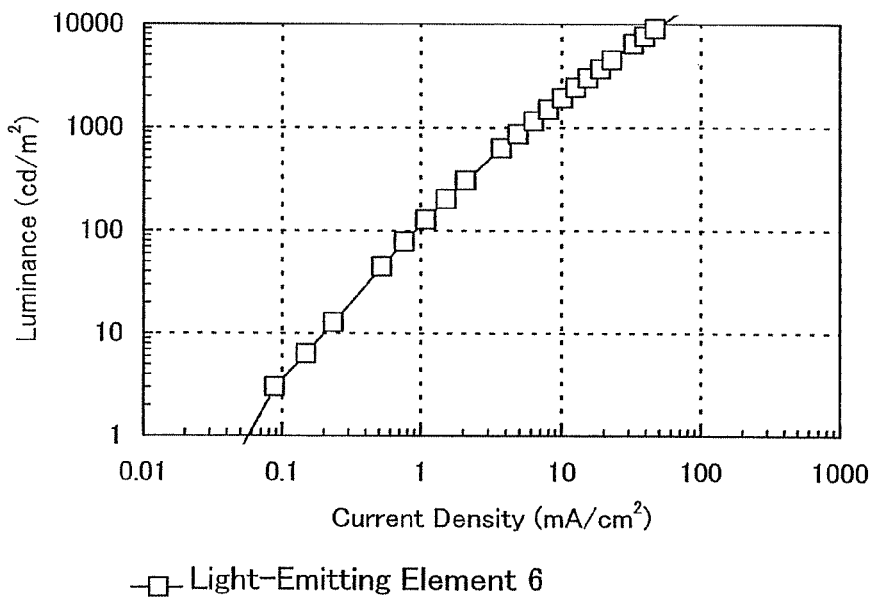
FIGS. 25A and 25B are graphs showing current density vs. luminance characteristics and voltage vs. luminance characteristics of a light-emitting element manufactured in Embodiment 4.
Figure 25B:
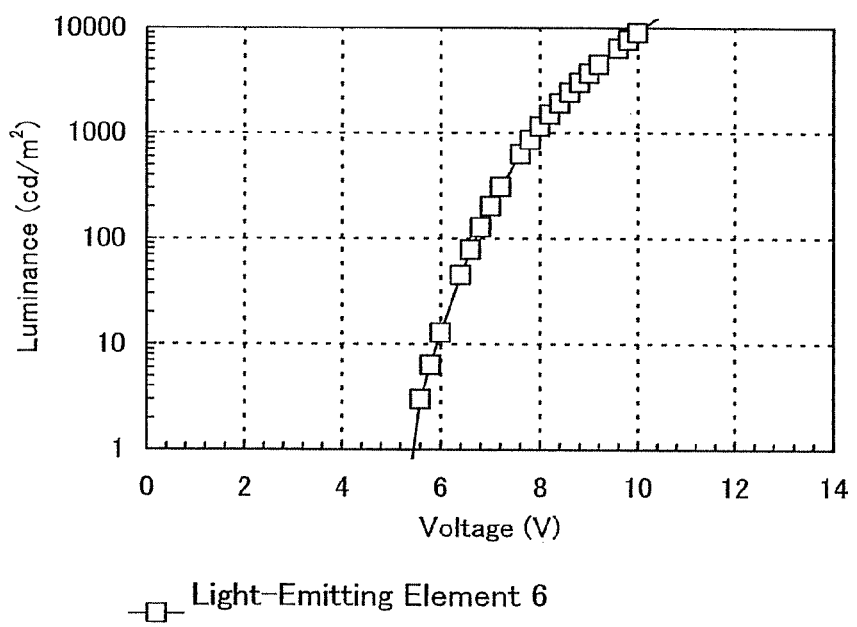
Figure 26:
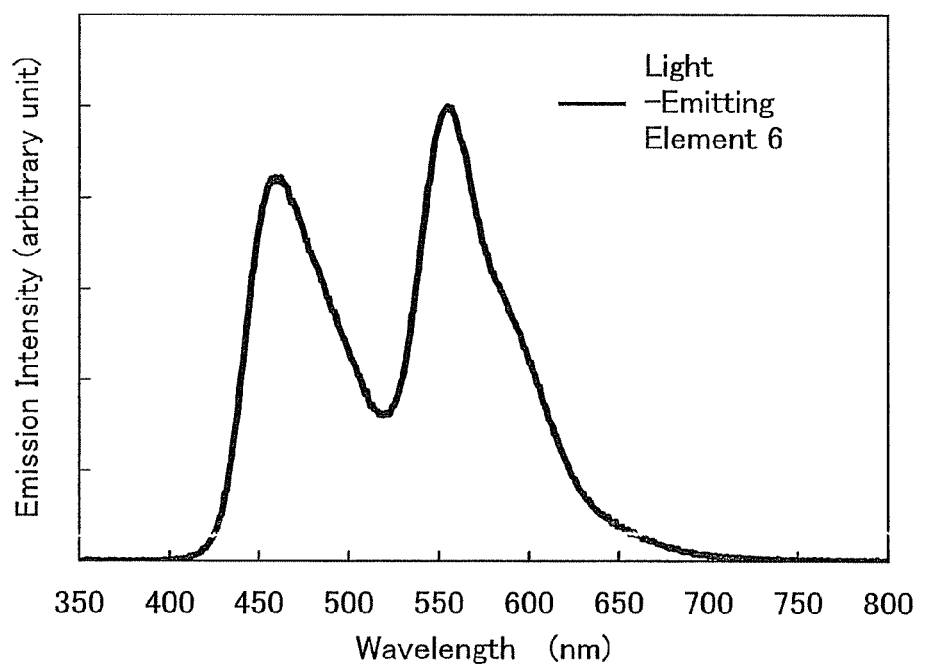
FIG. 26 is a graph showing an emission spectrum of a light-emitting element manufactured in Embodiment 4.

The current density vs. luminance characteristics of the light-emitting element 6 are shown in FIG. 25A. In addition, the voltage vs. luminance characteristics are shown in FIG. 25B. In addition, the emission spectrum at current of 1 mA is shown in FIG. 26.

A voltage of 7.8 [V] was applied to the light-emitting element 6, whereby current flowed with a current density of 4.89 [mA/cm$^2$] and light was emitted with luminance of 860 [cd/m$^2$]. At this time, the current efficiency was 18 [cd/A], the power efficiency was 7.1 [lm/W], and the external quantum efficiency was 7.0 [%]. In addition, the CIE chromaticity coordinate was (x=0.29, y=0.34), and white light was emitted. Further, as apparent from the emission spectrum of FIG. 26, both blue light emission near 460 nm and yellow light emission near 560 nm can be obtained in a favorable balance, and the light-emitting element 6 shows a broad emission spectrum.

Figure 27A:
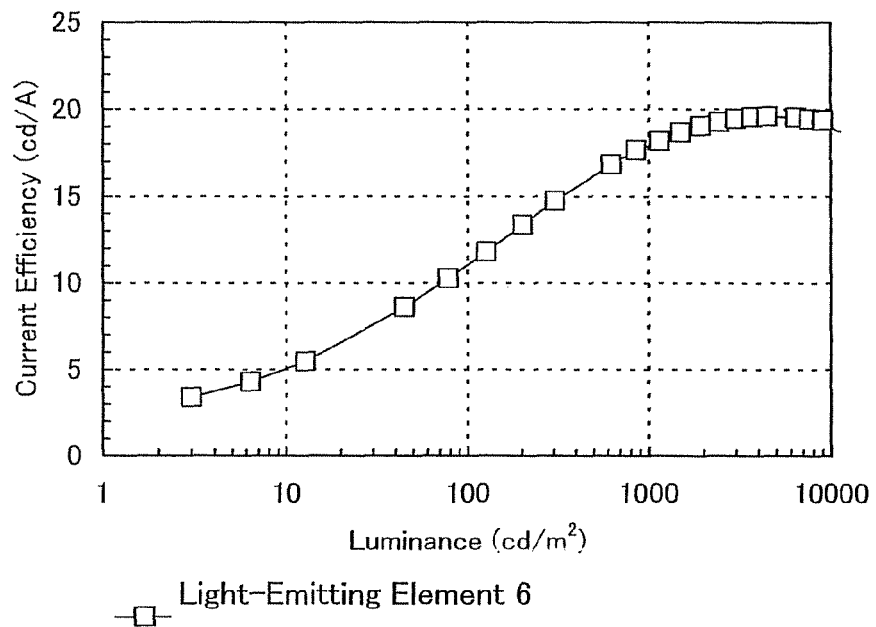
FIGS. 27A and 27B are graphs showing luminance vs. current efficiency characteristics and luminance vs. power efficiency characteristics of a light-emitting element manufactured in Embodiment 4.
Figure 27B:
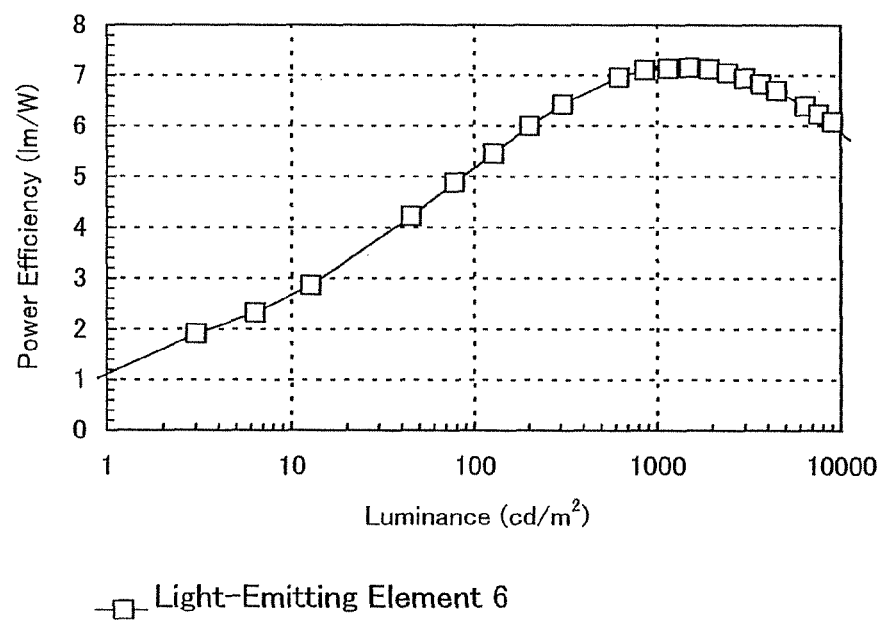

In order to evaluate luminous efficiency of the light-emitting element 6 on the graphs, luminance vs. current efficiency characteristics are shown in FIG. 27A and luminance vs. power efficiency characteristics are shown in FIG. 27B. As shown in FIG. 27A, the light-emitting element 6 of the present invention has had extremely high current efficiency and power efficiency in a practical luminance region (100 [cd/m$^2$] to 10000 [cd/m$^2$]). In such a manner, it was apparent that the light-emitting element of the present invention has high luminous efficiency and accordingly consumes low power.

Figure 28:
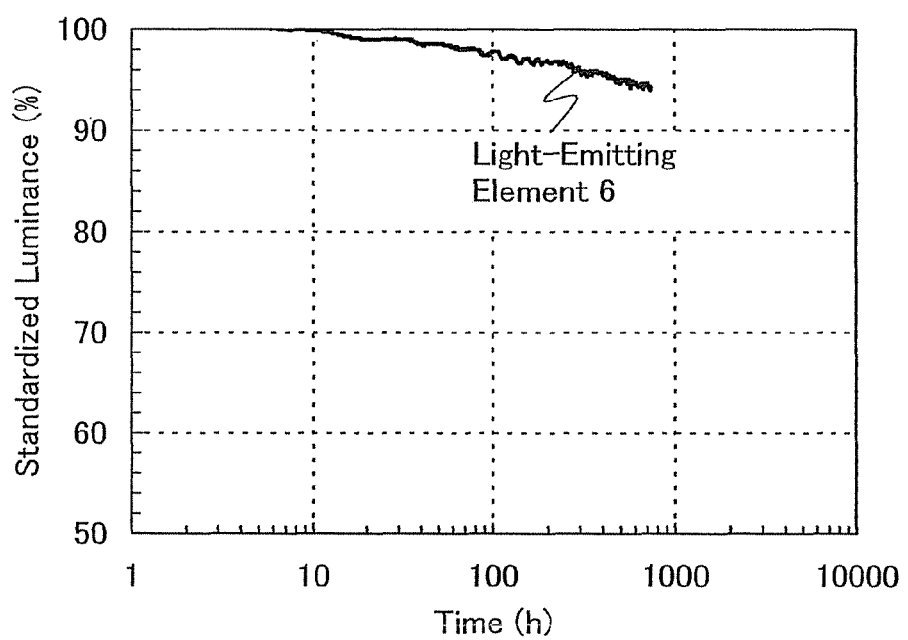
FIG. 28 is a graph showing the result of continuous lighting tests of a light-emitting element manufactured in Embodiment 4 by constant current driving.

Next, FIG. 28 shows the results of continuous lighting tests in which the light-emitting element 6 was continuously lit by constant current driving with the initial luminance set at 1000 cd/m$^2$ (the vertical axis indicates a standardized luminance on the assumption that 1000 cd/m$^2$ is 100%).

As a result of FIG. 28, the light-emitting element 6 kept 94% of the initial luminance even after 740 hours. Thus, it was proved that the light-emitting element 6 has a long lifetime. Its luminance half-time period is estimated to be approximately 100,000 hours. In such a manner, it was proved that the light-emitting element of the present invention has a long lifetime.

[Embodiment 5]

Embodiment 5 will specifically describe a manufacturing example of the light-emitting element of the present invention using N,9-diphenyl-N-(9,10-diphenyl-2-anthryl)-9H-carbazol-3-amine (abbreviation: 2PCAPA) which is a green light-emitting substance as the second light-emitting layer. A structural formula of 2PCAPA is shown below.

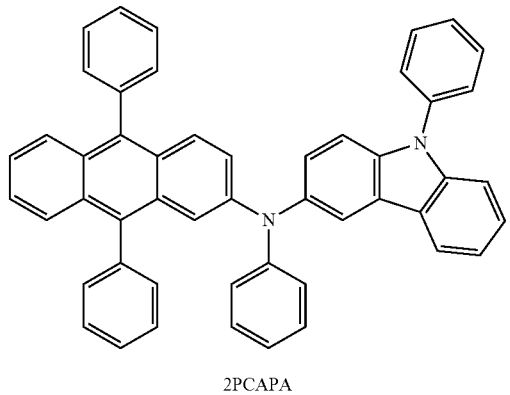

2PCAPA (Manufacture of Light-Emitting Element 7)

A manufacturing example of a light-emitting element 7 will be described with reference to FIG. 11A. First, a glass substrate 2000 over which indium tin silicon oxide (ITSO) which is formed with a thickness of 110 nm as an anode 2001 was prepared. The periphery of the surface of the ITSO was covered with a polyimide film so that an area of 2 mm×2 mm of the surface was exposed. The electrode area was 2 mm×2 mm. As pretreatment for forming the light-emitting element over the substrate, the surface of the substrate was washed with water, and baked at 200° C. for 1 hour, then, UV ozone treatment was performed for 370 seconds. Then, the substrate was transferred into a vacuum evaporation apparatus whose pressure was reduced to approximately 10$^4$ Pa, and vacuum baking at 170° C. for 30 minutes was performed in a heating chamber of the vacuum evaporation apparatus. After that, the substrate was cooled down for approximately 30 minutes.

Next, the glass substrate 2000 over which the anode 2001 was formed was fixed to a substrate holder provided in a film formation chamber in a vacuum evaporation apparatus so that the surface provided with the anode 2001 faced downward. Then, first, NPB and molybdenum(VI) oxide were co-evaporated over the anode 2001, whereby a hole-injecting layer 2013 which is Mimed of a composite material of an organic compound and an inorganic compound was formed. Resistive heating was employed for evaporation. The thickness of the hole-injecting layer 2013 was set to be 50 nm, and the evaporation rate was adjusted such that the weight ratio of NPB to molybdenum(VI) oxide was 4:1 (=NPB:molybdenum oxide). Note that a co-evaporation method is an evaporation method in which evaporation is performed using a plurality of evaporation sources in one treatment chamber at the same time.

Next, NPB was deposited to a thickness of 10 nm by an evaporation method using resistive heating to form a hole-transporting layer 2014.

Further, by co-evaporation of PCCPA and 2PCAPA over the hole-transporting layer 2014 using resistive heating, a second light-emitting layer 2012 was formed. The evaporation rate was adjusted such that the weight ratio of PCCPA to 2PCAPA was 1:0.02 (=PCCPA:2PCAPA). The thickness was set to be 10 nm. Since 2PCAPA serves as a light-emitting substance in the second light-emitting layer 2012, a light-emitting layer which emits green light is obtained.

A first light-emitting layer 2011 was formed over the second light-emitting layer 2012. First, by co-evaporation of PCCPA and PCBAPA using resistive heating, a layer 2021 provided on the anode side in the first light-emitting layer 2011 was formed. The evaporation rate was adjusted such that the weight ratio of PCCPA to PCBAPA was 1:0.10 PCCPA:PCBAPA). The thickness of the layer 2021 provided on the anode side was set to be 10 nm. Next, by co-evaporation of CzPA and PCBAPA using resistive heating, a layer 2022 provided on a cathode side in the first light-emitting layer 2011 was formed. The evaporation rate was adjusted such that the weight ratio of CzPA to PCBAPA was 1:0.05 (=CzPA:PCBAPA). The thickness of the layer 2022 provided on a cathode side was set to be 20 nm. Since PCBAPA serves as a light-emitting substance in the first light-emitting layer 2011 which is formed as described above, a light-emitting layer which emits blue light is obtained. In addition, PCCPA is a first organic compound which adjusts a transporting property of the layer 2021 provided on the anode side, and CzPA is a second organic compound which adjusts a transporting property of the layer 2022 provided on a cathode side.

After that, Alq was deposited to a thickness of 10 nm and BPhen was deposited to a thickness of 20 nm by an evaporation method using resistive heating to form an electron-transporting layer 2015.

Further, by an evaporation method using resistive heating, lithium fluoride (LiF) was deposited over the electron-transporting layer 2015 to have a thickness of 1 nm to form an electron-injecting layer 2016.

Lastly, aluminum was deposited to have a thickness of 200 nm by an evaporation method using resistive heating to form a cathode 2002. Accordingly, the light-emitting element 7 of the present invention was manufactured.

(Characteristic Evaluation of Light-Emitting Element 7)

Sealing was performed in a glove box under a nitrogen atmosphere so that the light-emitting element 7 of the present invention which is obtained through the above-described steps was not exposed to the atmosphere, and then operation characteristics of the light-emitting element were measured. Note that the measurements were performed at a room temperature (in an atmosphere kept at 25° C.).

Figure 41A:
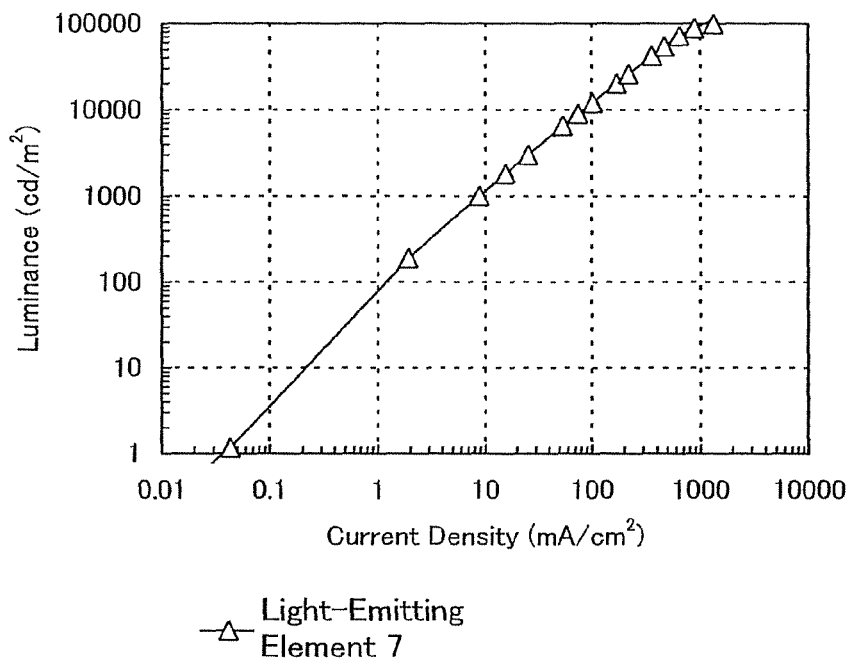
FIGS. 41A and 41B are graphs showing current density vs. luminance characteristics and voltage vs. luminance characteristics of a light-emitting element manufactured in Embodiment 5.
Figure 41B:
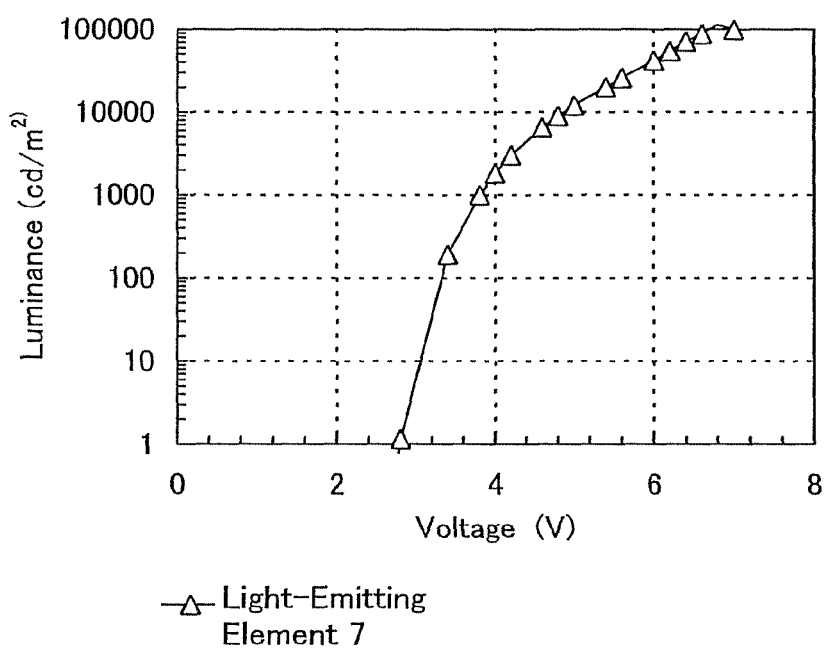
Figure 42:
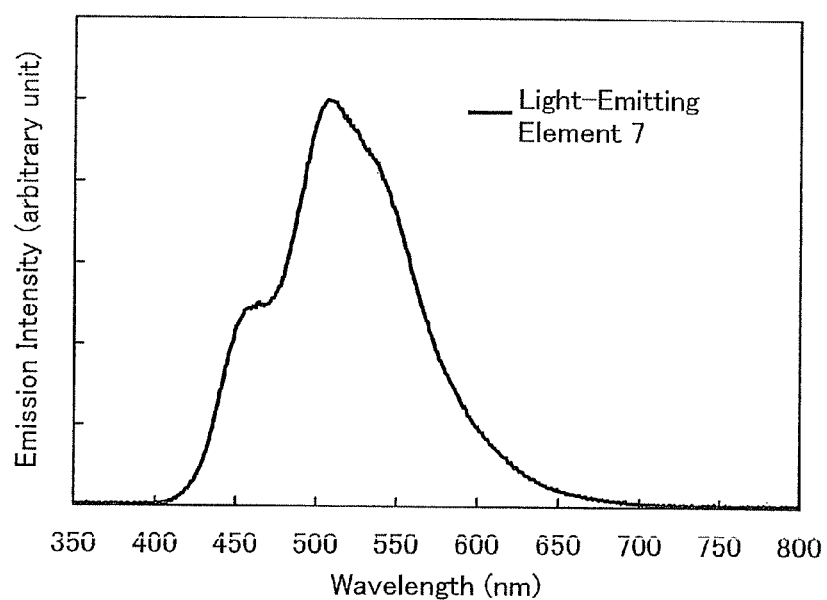
FIG. 42 is a graph showing an emission spectrum of a light-emitting element manufactured in Embodiment 5.

The current density vs. luminance characteristics of the light-emitting element 7 are shown in FIG. 41A. In addition, the voltage vs. luminance characteristics are shown in FIG. 41B. In addition, the emission spectrum at current of 1 mA is shown in FIG. 42.

A voltage of 3.8 [V] was applied to the light-emitting element 7, whereby current flowed with a current density of 8.77 [mA/cm$^2$] and light was emitted with luminance of 1000 [cd/m$^2$]. At this time, the current efficiency was 11 [cd/A], the power efficiency was 9.4 [lm/W], and the external quantum efficiency was 4.3 [%]. In addition, the CIE chromaticity coordinate was (x=0.23, y=0.41). Further, as apparent from the emission spectrum of FIG. 42, blue light emission near 460 nm and green light emission near 520 nm are obtained, and the light-emitting element 7 shows a broad emission spectrum. Thus, when a stacked-type light-emitting element in which a light-emitting unit of the light-emitting element 7 and a light-emitting unit that can obtain red light emission are stacked is manufactured, a white light-emitting element having a broad emission spectrum can be obtained.

Figure 43A:
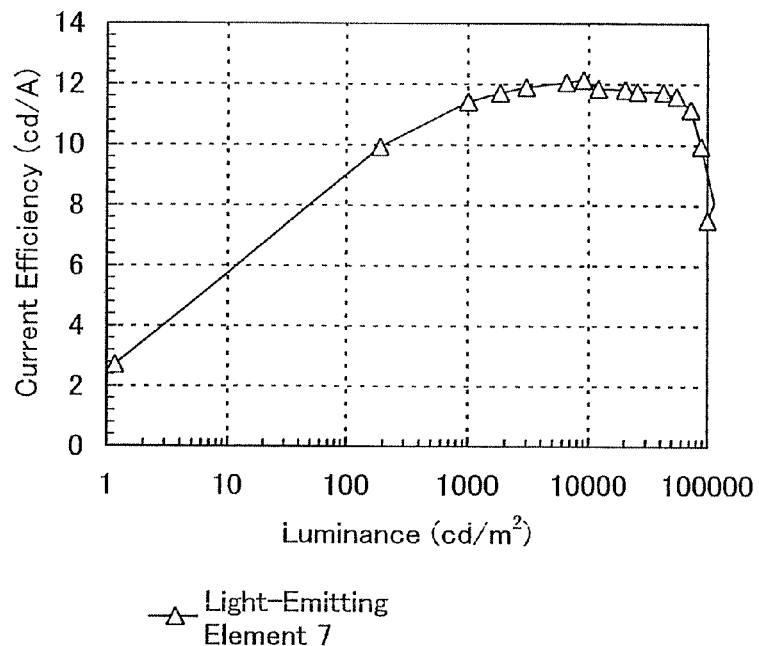
FIGS. 43A and 43B graphs showing luminance vs. current efficiency characteristics and luminance vs. power efficiency characteristics of a light-emitting elements manufactured in Embodiment 5.
Figure 43B:
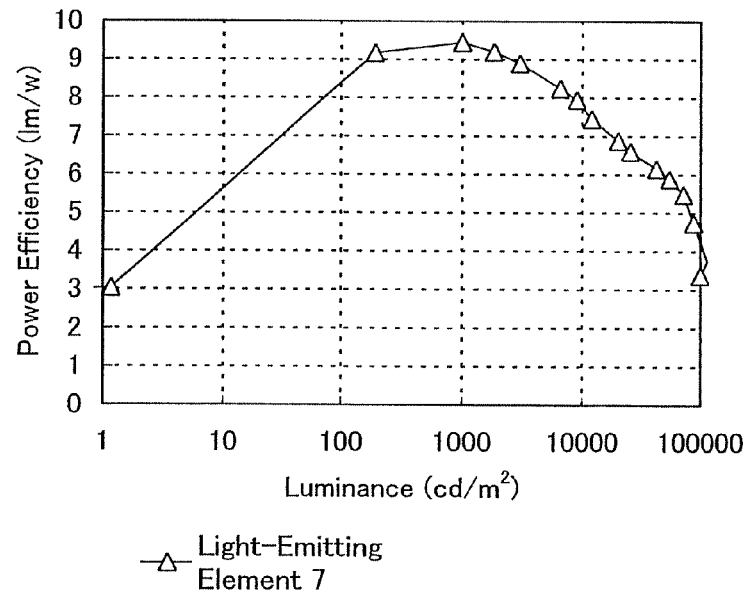

In order to evaluate luminous efficiency of the light-emitting element 7 on the graphs, luminance vs. current efficiency characteristics are shown in FIG. 43A and luminance vs. power efficiency characteristics are shown in FIG. 43B. As shown in FIG. 43A, the light-emitting element 7 of the present invention had extremely high current efficiency and power efficiency in a practical luminance region (100 [cd/m$^2$] to 10000 [cd/m$^2$]). In such a manner, it was apparent that the light-emitting element of the present invention has high luminous efficiency and accordingly consumes low power.

[Embodiment 6]

Embodiment 6 will specifically describe a manufacturing example of the light-emitting element of the present invention using N,9-diphenyl-N-(9,10-diphenyl-2-anthryl)-9H-carbazol-3-amine (abbreviation: 2PCAPA) which is a green light-emitting substance as the second light-emitting layer.

(Manufacture of Light-Emitting Element 8)

A manufacturing example of a) light-emitting element 8 will be described with reference to FIG. 11A. First, a glass substrate 2000 over which indium tin silicon oxide (ITSO) which is formed with a thickness of 110 nm as an anode 2001 was prepared. The periphery of the surface of the ITSO was covered with a polyimide film so that an area of 2 mm×2 mm of the surface was exposed. The electrode area was 2 mm×2 mm. As pretreatment for forming the light-emitting element over the substrate, the surface of the substrate was washed with water, and baked at 200° C. for 1 hour, then, UV ozone treatment was performed for 370 seconds. Then, the substrate was transferred into a vacuum evaporation apparatus whose pressure was reduced to approximately 10$^{-4}$ Pa, and vacuum baking at 170° C. for 30 minutes was performed in a heating chamber of the vacuum evaporation apparatus. After that, the substrate was cooled down for approximately 30 minutes.

Next, the glass substrate 2000 over which the anode 2001 was formed was fixed to a substrate holder provided in a film formation chamber in a vacuum evaporation apparatus so that the surface provided with the anode 2001 faced downward. Then, first, NPB and molybdenum(VI) oxide were co-evaporated over the anode 2001, whereby a hole-injecting layer 2013 which is formed of a composite material of an organic compound and an inorganic compound was formed. Resistive heating was employed for evaporation. The thickness of the hole-injecting layer 2013 was set to be 50 nm, and the evaporation rate was adjusted such that the weight ratio of NPB to molybdenum(VI) oxide was 4:1 (=NPB:molybdenum oxide). Note that a co-evaporation method is an evaporation method in which evaporation is performed using a plurality of evaporation sources in one treatment chamber at the same time.

Next, NPB was deposited to a thickness of 10 nm by an evaporation method using resistive heating to form a hole-transporting layer 2014.

Further, by co-evaporation of PCBAPA and 2PCAPA over the hole-transporting layer 2014 using resistive heating, a second light-emitting layer 2012 was formed. The evaporation rate was adjusted such that the weight ratio of PCBAPA to 2PCAPA was 1:0.02 (=PCBAPA:2PCAPA). The thickness was set to be 10 nm. Since PCBAPA is a substance having a hole-transporting property and 2PCAPA serves as a light-emitting substance in the second light-emitting layer 2012, a light-emitting layer which emits green light is obtained.

A first light-emitting layer 2011 was formed over the second light-emitting layer 2012. First, by co-evaporation of PCCPA and PCBAPA using resistive heating, a layer 2021 provided on the anode side in the first light-emitting layer 2011 was formed. The evaporation rate was adjusted such that the weight ratio of PCCPA to PCBAPA was 1:0.10 PCCPA: PCBAPA). The thickness of the layer 2021 provided on the anode side was set to be 10 nm. Next, by co-evaporation of CzPA and PCBAPA using resistive heating, a layer 2022 provided on a cathode side in the first light-emitting layer 2011 was formed. The evaporation rate was adjusted such that the weight ratio of CzPA to PCBAPA was 1:0.05 (=CzPA: PCBAPA). The thickness of the layer 2022 provided on the cathode side was set to be 20 nm. Since PCBAPA serves as a light-emitting substance in the first light-emitting layer 2011 which is formed as described above, a light-emitting layer which emits blue light is obtained. In addition, PCCPA is a first organic compound which adjusts a transporting property of the layer 2021 provided on the anode side, and CzPA is a second organic compound which adjusts a transporting property of the layer 2022 provided on the cathode side.

After that, Alq was deposited to a thickness of 10 nm and BPhen was deposited to a thickness of 20 nm by an evaporation method using resistive heating to form an electron-transporting layer 2015.

Further, by an evaporation method using resistive heating, lithium fluoride (LiF) was deposited over the electron-transporting layer 2015 to have a thickness of 1 nm to fin in an electron-injecting layer 2016.

Lastly, aluminum was deposited to have a thickness of 200 nm by an evaporation method using resistive heating to form a cathode 2002. Accordingly, the light-emitting element 8 of the present invention was manufactured.

(Characteristic Evaluation of Light-Emitting Element 8)

Sealing was performed in a glove box under a nitrogen atmosphere so that the light-emitting element 8 of the present invention which is obtained through the above-described steps was not exposed to the atmosphere, and then operation characteristics of the light-emitting element were measured. Note that the measurements were performed at a room temperature (in an atmosphere kept at 25° C.).

Figure 44A:
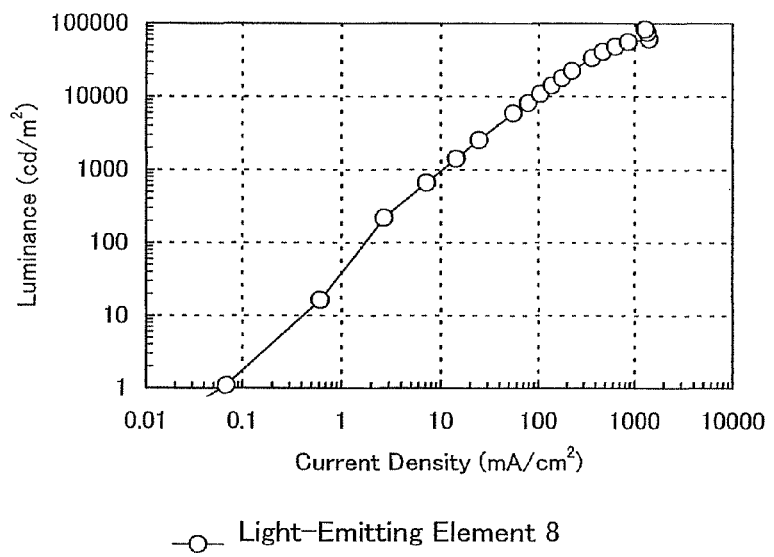
FIGS. 44A and 44B are graphs showing current density vs. luminance characteristics and voltage vs. luminance characteristics of a light-emitting element manufactured in Embodiment 5.
Figure 44B:
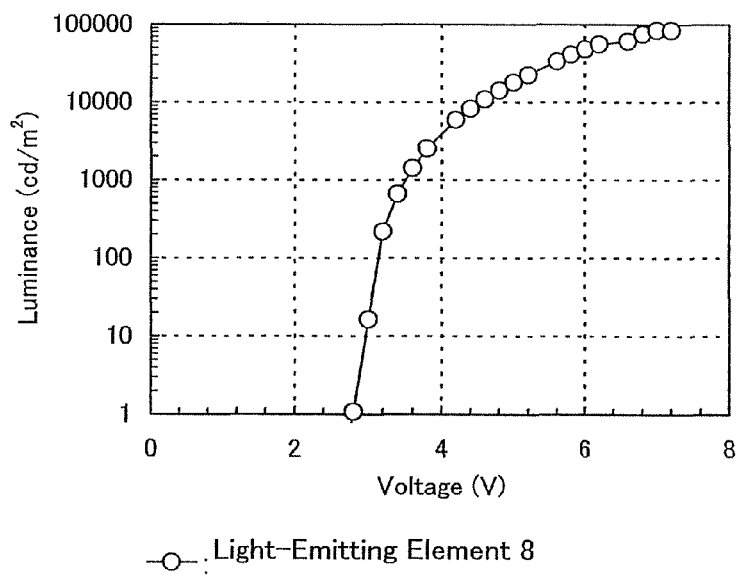
Figure 45:
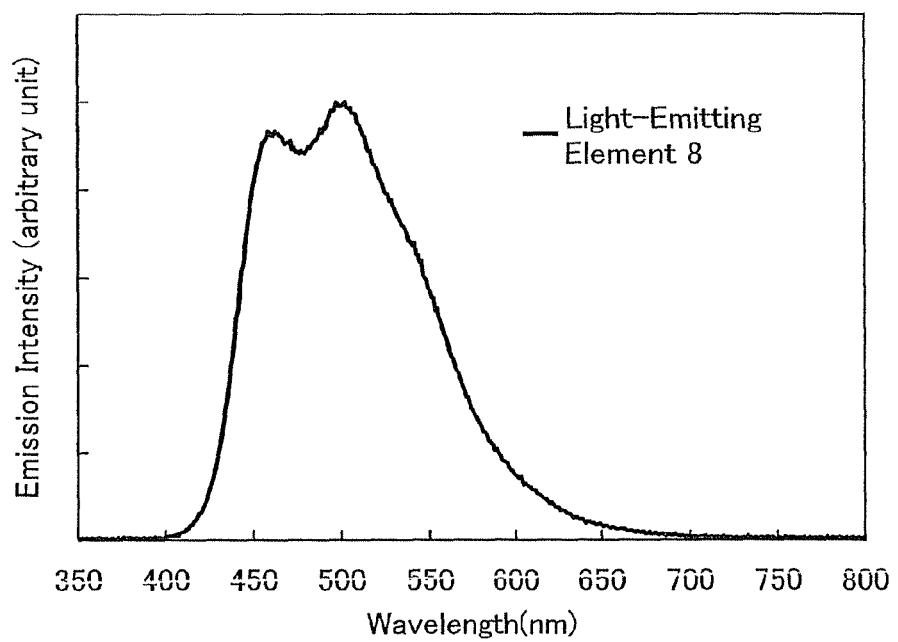
FIG. 45 is a graph showing an emission spectrum of a light-emitting element manufactured in Embodiment 6.

The current density vs. luminance characteristics of the light-emitting element 8 are shown in FIG. 44A. In addition, the voltage vs. luminance characteristics are shown in FIG. 44B. In addition, the emission spectrum at current of 1 mA is shown in FIG. 45.

A voltage of 3.4 [V] was applied to the light-emitting element 8, whereby current flowed with a current density of 7.15 [mA/cm$^2$] and light was emitted with luminance of 1000 [cd/m$^2$]. At this time, the current efficiency was 9.3 [cd/A], the power efficiency was 8.6 [lm/W], and the external quantum efficiency was 4.3 [%]. In addition, the CIE, chromaticity coordinate was (x=0.19, y=0.30). Further, as apparent from the emission spectrum of FIG. 45, blue light emission near 460 nm and green light emission near 520 nm are obtained, and the light-emitting element 8 shows a broad emission spectrum. Thus, when a stacked-type light-emitting element in which a light-emitting unit of the light-emitting element 8 and a light-emitting unit that can obtain red light emission are stacked is manufactured, a white light-emitting element having a broad emission spectrum can be obtained.

Figure 46A:
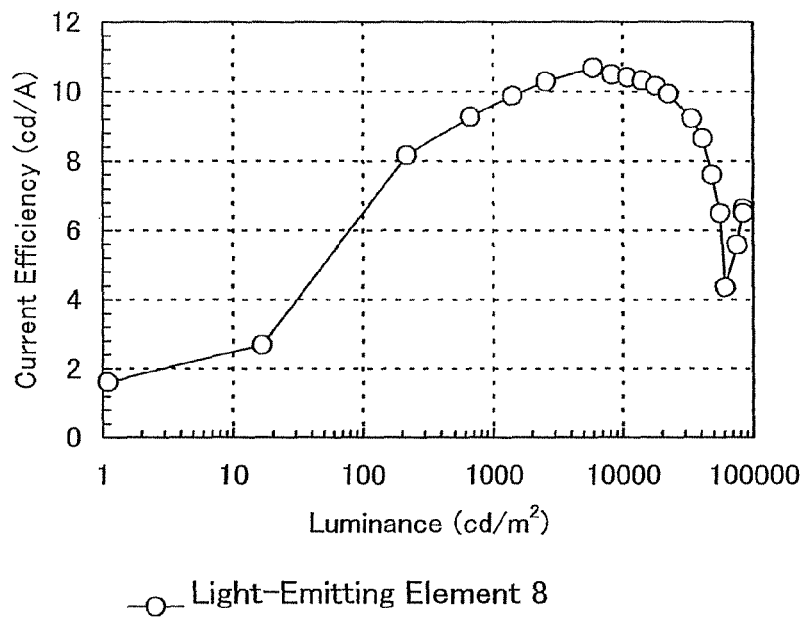
FIGS. 46A and 46B graphs showing luminance vs. current efficiency characteristics and luminance vs. power efficiency characteristics of a light-emitting element manufactured in Embodiment 6.
Figure 46B:
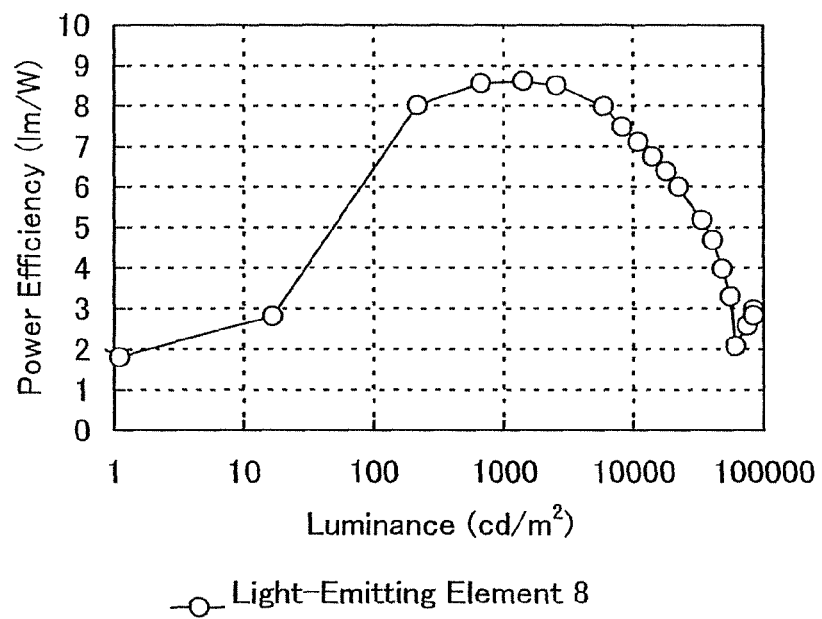

In order to evaluate luminous efficiency of the light-emitting element 8 on the graphs, luminance vs. current efficiency characteristics are shown in FIG. 46A and luminance vs. power efficiency characteristics are shown in FIG. 46B. As shown in FIG. 46A, the light-emitting element 8 of the present invention had extremely high current efficiency and power efficiency in a practical luminance region (100 [cd/m$^2$] to 10000 [cd/m$^2$]). In such a manner, it was apparent that the light-emitting element of the present invention has high luminous efficiency and accordingly consumes low power.

[Embodiment 7]

Embodiment 7 will describe materials used in the above embodiments.

SYNTHESIS EXAMPLE 1

A synthesis method of 2-(4-{N-[4-carbazol-9-yl)phenyl]-N-phenylamino}phenyl)-9,10-diphenylantracene (abbreviation: 2YGAPPA) is specifically described.

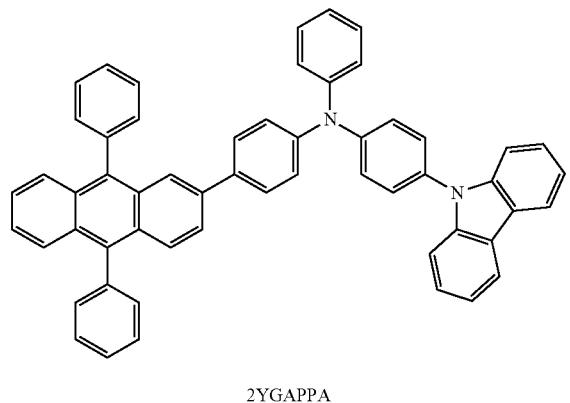

2YGAPPA

Step 1: synthesis of
2-bromo-9,10-diphenylanthracene (i) Synthesis of 2-bromo-9,10-anthraquinone A synthesis scheme of 2-bromo-9,10-anthraquinone is represented by (C-1).

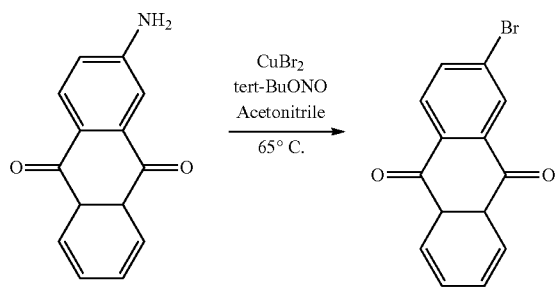

(C-1)

46 g (0.20 mol) of copper(II) bromide and 500 mL of acetonitrile were put in a 1 L three-neck flask. Further, 17 g (0.17 mol) of tert-butyl nitrite was added thereto, and the mixture was heated to 65° C. 25 g (0.11 mol) of 2-amino-9,10-anthraquinone was added to the mixture and stirred for 6 hours at the same temperature. After reaction, the reaction solution was poured into 500 mL of hydrochloric acid (3 mol/L) and this suspension was stirred for 3 hours, so that a solid substance was precipitated. The precipitation was collected by suction filtration and washed with water and ethanol while being subjected to suction filtration. The residue was dissolved in toluene and was subjected to suction filtration through Florisil (produced by Wako Pure Chemical Industries, Ltd., Catalog No. 540-00135), Celite (produced by Wako Pure Chemical Industries, Ltd., Catalog No. 531-16855), and alumina, and the filtrate was obtained. The obtained filtrate was concentrated, so that a solid substance was obtained. The obtained solid substance was recrystallized with a mixed solvent of chloroform and hexane, so that 18.6 g of a milky white powdered solid substance, 2-bromo-9,10-anthraquinone, which was the object of the synthesis, was obtained in 58% yield.

(ii) Synthesis of 2-bromo-9,10-diphenyl-9,10-dihydroanthracene-9,10-diol

A synthesis scheme of 2-bromo-9,10-diphenyl-9,10-dihydroanthracene-9,10-diol is shown in (C-2).

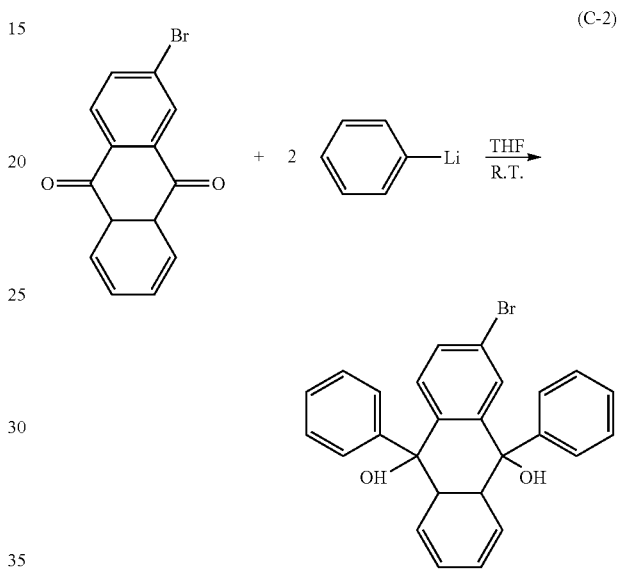

(C-2)

4.9 g (17 mmol) of 2-bromo-9,10-anthraquinone was put in a 300 mL three-neck flask, the atmosphere in the flask was substituted by nitrogen, and 100 mL of tetrahydrofuran (THF) was added thereto and dissolved well. Then, 18 mL (37 mmol) of phenyllithium was dropped into this solution and stirred at room temperature for approximately 12 hours. After reaction, the solution was washed with water, and an aqueous layer was extracted with ethyl acetate. The extracted solution and an organic layer were dried with magnesium sulfate. After drying, the mixture was subjected to suction filtration, and the filtrate was concentrated, so that 2-bromo-9,10-diphenyl-9,10-dihydroanthracene-9,10-diol (about 7.6 g), which was the object of the synthesis, was obtained.

(iii) Synthesis of 2-bromo-9,10-diphenylanthracene

A synthesis scheme (C-3) of 2-bromo-9,10-diphenylanthracene is shown in (C-3).

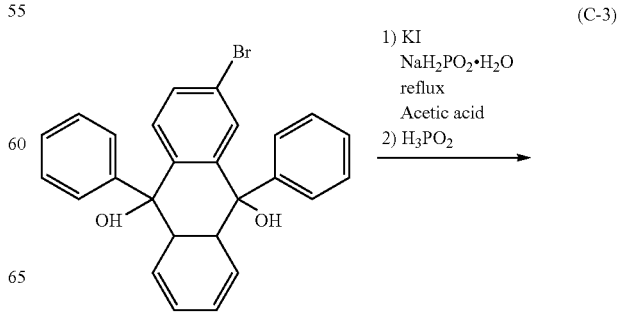

(C-3)

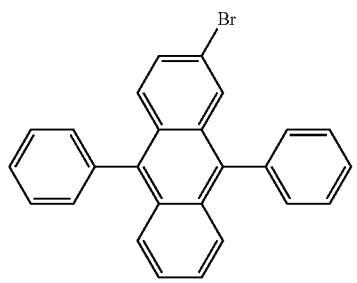

Approximately 7.6 g (17 mmol) of the obtained 2-bromo-9,10-diphenyl-9,10-dihydroanthracene-9,10-diol, 5.1 g (31 mmol) of potassium iodide, 9.7 g (92 mmol) of sodium phosphinate monohydrate, and 50 mL of glacial acetic acid were put into a 500 mL three-neck flask, and the mixture was refluxed at 120° C. for 2 hours. Then, 30 mL of 50% phosphinic acid was added to the reactive mixture, and the mixture was stirred for 1 hour at 120° C. After the reaction, the solution was washed with water, and the aqueous layer was extracted with ethyl acetate. The extracted solution and an organic layer were dried with magnesium sulfate, filtered by suction filtration and the obtained filtrate was concentrated to obtain a solid substance. The solid substance was dissolved in toluene, and the solution was filtered through Celite (produced by Wako Pure Chemical Industries, Ltd., Catalog No. 531-16855), Florisil (produced by Wako Pure Chemical Industries, Ltd., Catalog No. 540-00135), and alumina. The obtained filtrate was concentrated to obtain a solid substance, and the solid substance was recrystallized with a mixed solvent of chloroform and hexane, giving 5.1 g of 2-bromo-9,10-diphenylanthracene as a light yellow powdered solid substance which was the object of the synthesis. The yield of the two stages (ii) and (iii) was 74%.

Step 2: synthesis of 2-(4-bromophenyl)-9,10-diphenylantracene (i) Synthesis of 2-iodo-9,10-diphenylanthracene Synthesis scheme of 2-iodo-9,10-diphenylanthracene is shown in (C-4).

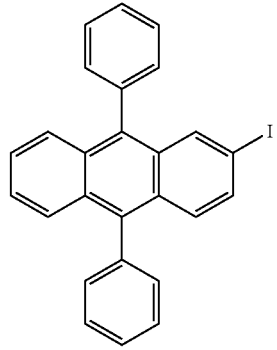

10 g (24 mmol) of 2-bromo-9,10-diphenylanthracene was put in a 500 mL three neck flask, the atmosphere in the flask was substituted by nitrogen, and then 150 mL of tetrahydrofuran (THF) was added thereto and dissolved well. This solution was stirred at −78° C. Then, 19 mL of n-butyllithium solution (1.6 mmol/L) was dropped into this solution, with a syringe and stirred for 1 hour at −78° C., so that a white solid substance was precipitated. After reaction, a solution in which 12 g (49 mmol) of iodine was dissolved into 80 mL of tetrahydrofuran was dropped into this reacted mixture using a funnel for dropping. After dropping, the mixture was stirred for 1 hour at −78° C. and for 12 hours at room temperature. After reaction, a sodium thiosulfate solution was added into the reaction solution, and was stirred for 1 hour at room temperature. Ethyl acetate was added into this mixture for extraction. An aqueous layer and an organic layer were separated, and the organic layer was washed with sodium thiosulfate and saturated brine in this order. The aqueous layer and the organic layer were separated and the organic layer was dried with magnesium sulfate. This mixture was subjected to suction filtration so that the magnesium sulfate was removed. The obtained filtrate was concentrated, so that a solid substance was obtained. Methanol was added into this solid substance and washed by ultrasonic wave irradiation, so that a solid substance was precipitated. This solid substance was collected by suction filtration, so that 9.9 g of a light yellow powdered solid substance was obtained in a yield of 90%.

(ii) Synthesis of 2-(4-bromophenyl)-9,10-diphenylanthracene

Synthesis scheme of 2-(4-bromophenyl)-9,10-diphenylanthracene is shown in (C-5).

(C-4)

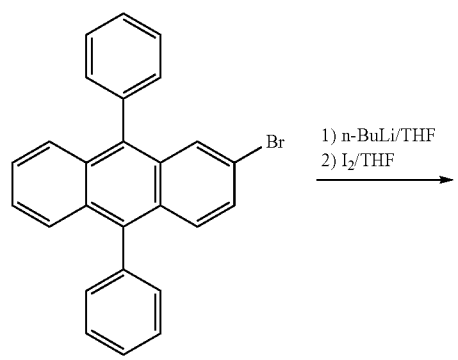

(C-5)

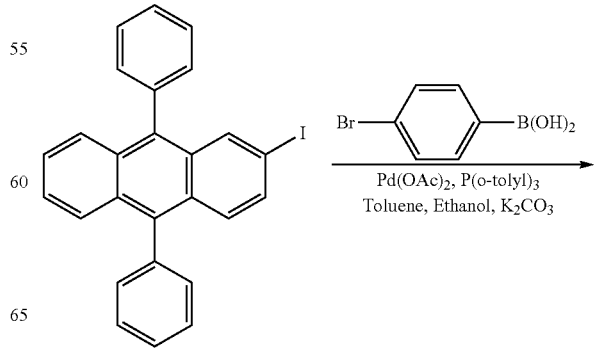

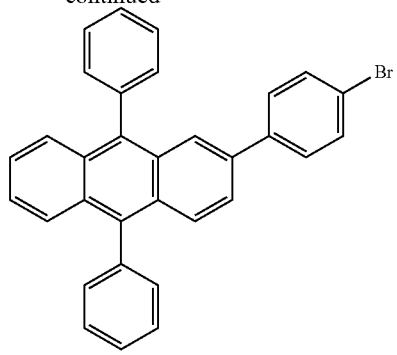

2.0 g (9.9 mmol) of 4-bromophenyl boronic acid, 0.02 g (0.089 mmol) of palladium(0) acetate, 5.0 g (11 mmol) of 2-iodo-9,10-diphenylanthracene, 0.30 g (0.99 mmol) of tris (o-tolyl)phosphine were put into a 200 mL three neck flask, and the atmosphere in the flask was substituted by nitrogen. 50 mL of toluene, 20 mL (2 mol/L) of a potassium carbonate aqueous solution, and 10 mL of ethanol were put into this mixture. This mixture was stirred at 100° C. for 8 hours to be reacted. After reaction, toluene was added into the reacted mixture, and this suspension was washed with saturated sodium hydrogen carbonate water and a saturated brine in this order. An organic layer and an aqueous layer were separated, and the organic layer was filtrated through Celite (produced by Wako Pure Chemical Industries, Ltd., Catalog No. 531-16855), alumina, and Florisil (produced by Wako Pure Chemical Industries, Ltd., Catalog No. 540-00135), by suction filtration and a filtrate was obtained. The obtained filtrate was concentrated to obtain a solid substance. Methanol was added into this solid substance and washed with ultrasonic wave irradiation, so that a solid substance was precipitated. This solid substance was collected by suction filtration, so that 4.6 g of a light yellow powdered solid substance was obtained in 87% yield. By a nuclear magnetic resonance measurement (NMR), this compound was proved to be 2-(4-bromophenyl)-9,10-diphenylanthracene.

Figure 29A:
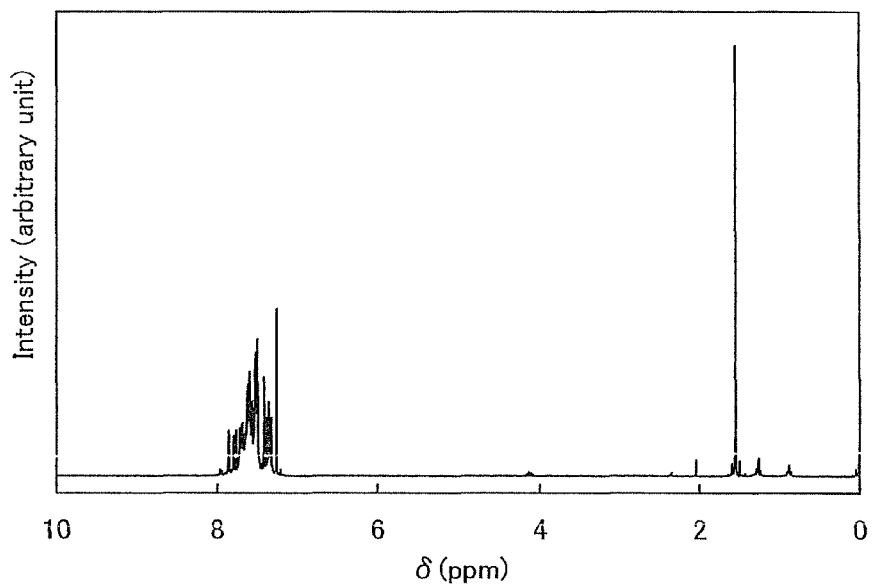
FIGS. 29A and 29B are graphs each showing a $^1$H NMR chart of 2-(4-bromophenyl)-9,10-diphenylanthracene.
Figure 29B:
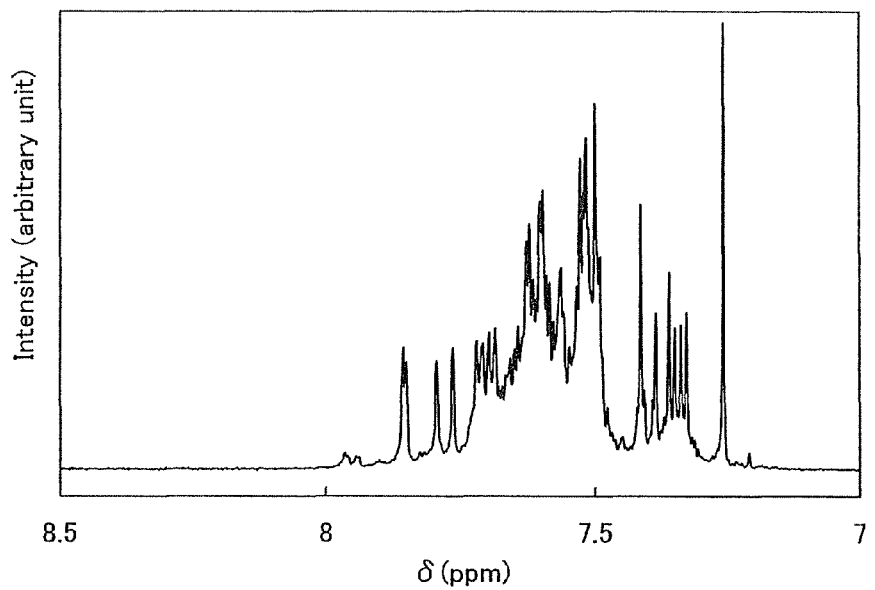

$^1$H NMR data of 2-(4-bromophenyl)-9,10-diphenylanthracene is shown below. $^1$H NMR (CDCl$_3$, 300 MHz): δ=7.33-7.36 (m, 2H), 7.40 (d, J=8.4 Hz, 2H), 7.49-7.72 (m, 15H), 7.78 (d, J=9.3 Hz, 1H), 7.85 (d, J=1.5 Hz, 1H). FIGS. 29A and 29B show $^1$H NMR charts. Note that FIG. 29B is a chart in which the range of 7.0 ppm to 8.5 ppm in FIG. 29A is enlarged.

Step 3: Synthesis of 4-(carbazol-9-yl)diphenylamine (abbreviation: YGA)

(i) Synthesis of N-(4-bromophenyl)carbazole

A synthesis scheme of N-(4-bromophenyl)carbazole is shown in (C-6).

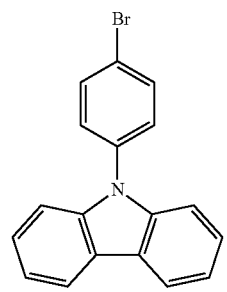

First, a synthesis method of N-(4-bromophenyl)carbazole is described. 56 g (0.24 mol) of 1,4-dibromobenzene, 31 g (0.18 mol) of carbazole, 4.6 g (0.024 mol) of copper(I) iodide, 66 g (0.48 mol) of potassium carbonate, and 2.1 g (0.008 mol) of 18-crown-6-ether were put into a 300 mL three-neck flask, and the atmosphere in the flask was substituted with nitrogen. Then, 8 mL of 1,3-dimethyl-3,4,5,6-tetrahydro-2(1H)-pyrimidinone (abbreviation: DMPU) was added, and the mixture was stirred at 180° C. for 6 hours. After the reacted mixture was cooled to room temperature, the precipitation was removed by suction filtration. The filtrate was washed with a diluted hydrochloric acid, a saturated sodium hydrogen carbonate aqueous solution, and saturated brine in this order, and an organic layer was dried with magnesium sulfate. After drying, the mixture was filtered, and the obtained filtrate was concentrated to produce an oily substance. The oily substance was purified by silica gel column chromatography (hexane: ethyl acetate=9:1). The resulting solid substance was recrystallized with a mixed solvent of chloroform and hexane, so that 21 g of N-(4-bromophenyl)carbazole as a light brown plate-like crystal, which was the object of the synthesis, was obtained in 35% yield. By the nuclear magnetic resonance measurement (NMR), this compound was proved to be N-(4-bromophenyl)carbazole.

$^1$H NMR data of this compound is shown below. $^1$H NMR (300 MHz, CDCl$_3$): δ=8.14 (d, J=7.8 Hz, 2H), 7.73 (d, J=8.7 Hz, 2H), 7.46 (d, J=8.4 Hz, 2H), 7.42-7.26 (m, 6H).

(ii) Synthesis of 4-(carbazol-9-yl)diphenylamine (abbreviation: YGA)

A synthesis scheme of 4-(carbazol-9-yl)diphenylamine (abbreviation: YGA) is shown in (C-7).

(C-6)

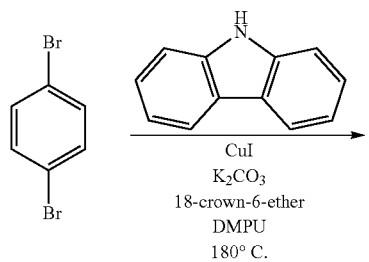

(C-7)

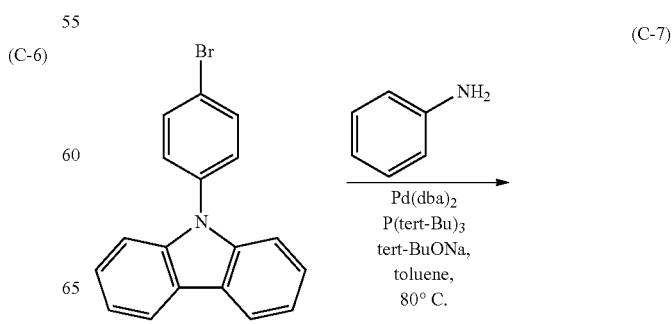

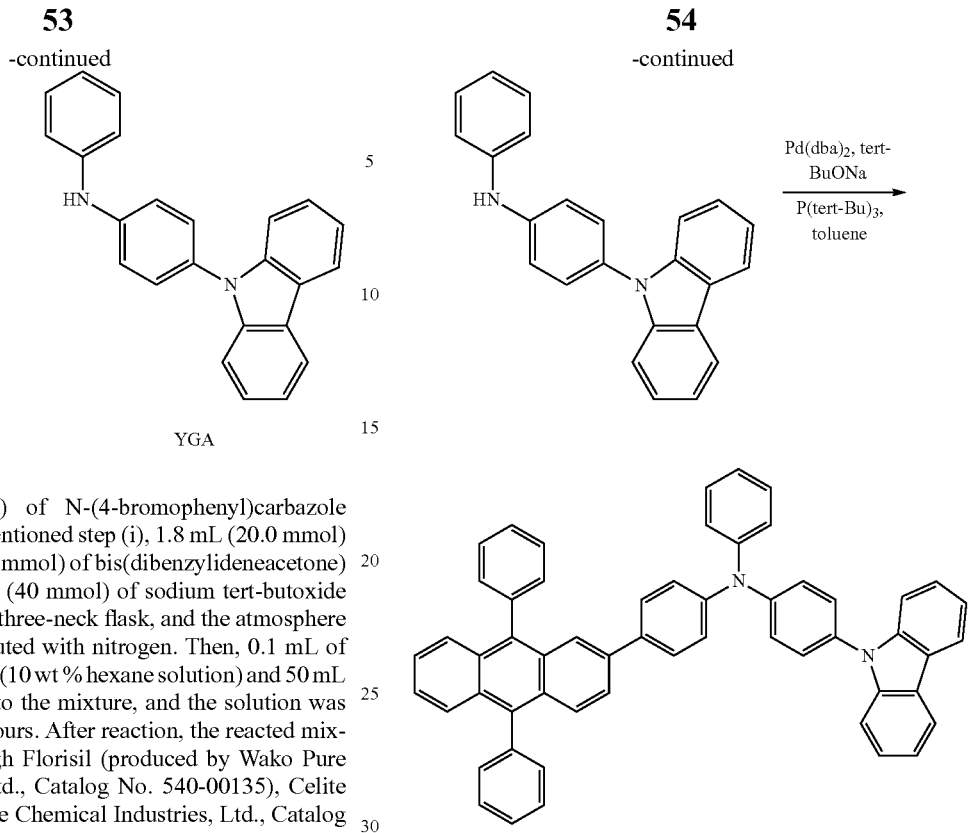

5.4 g (17.0 mmol) of N-(4-bromophenyl)carbazole obtained in the abovementioned step (i), 1.8 mL (20.0 mmol) of aniline, 100 mg (0.17 mmol) of bis(dibenzylideneacetone) palladium(0), and 3.9 g (40 mmol) of sodium tert-butoxide were put into a 200 mL three-neck flask, and the atmosphere in the flask was substituted with nitrogen. Then, 0.1 mL of tri(tert-butyl)phosphine (10 wt % hexane solution) and 50 mL of toluene were added to the mixture, and the solution was stirred at 80° C. for 6 hours. After reaction, the reacted mixture was filtered through Florisil (produced by Wako Pure Chemical Industries, Ltd., Catalog No. 540-00135), Celite (produced by Wako Pure Chemical Industries, Ltd., Catalog No. 531-16855), and alumina. The filtrate was washed with water, and then saturated brine, and dried with magnesium sulfate. The mixture was filtered, and the filtrate was concentrated to give an oily substance. The oily substance was purified by silica gel column chromatography (hexane:ethyl acetate=9:1), thereby providing 4.1 g of 4-(carbazol-9-yl)diphenylamine (abbreviation: YGA), which was the object of the synthesis, in 73% yield. By a nuclear magnetic resonance measurement (NMR), this compound was proved to be 4-(carbazol-9-yl)diphenylamine (abbreviation: YGA).

Figure 30A:
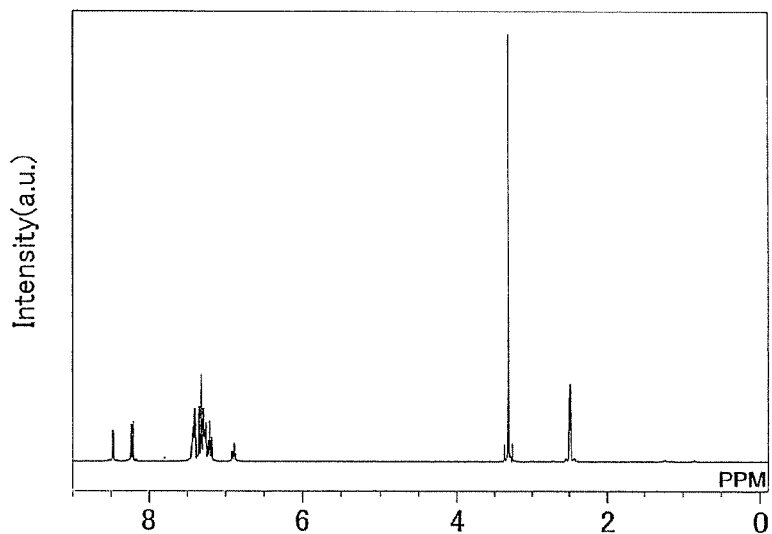
FIGS. 30A and 30B are graphs each showing a $^1$H NMR chart of 4-(carbazol-9-yl)diphenylamine (abbreviation: YGA)
Figure 30B:
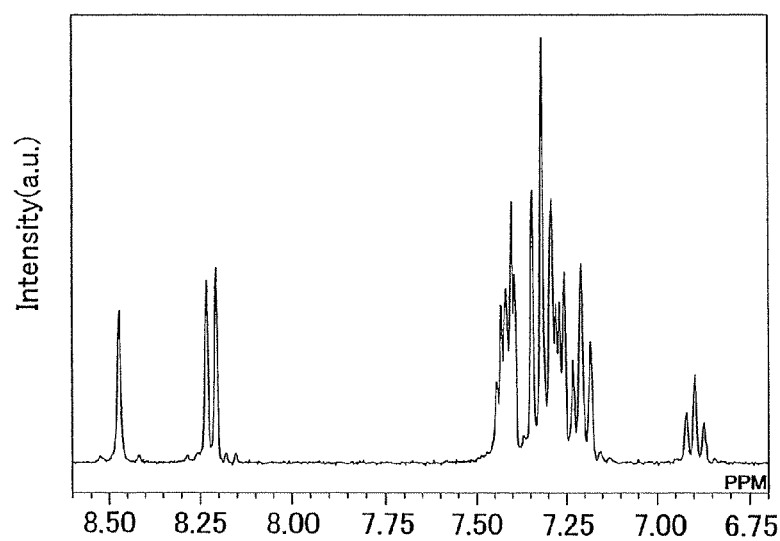

$^1$H NMR data of this compound is shown below. $^1$H NMR. (300 MHz, DMSO-$d_6$): δ=8.47 (s, 1H), 8.22 (d, J=7.8 Hz, 2H), 7.44-7.16 (m, 14H), 6.92-6.87 (m, 1H). $^1$H NMR charts are shown in FIGS. 30A and 30B. Note that the range of 6.5 ppm to 8.5 ppm in FIG. 30A is expanded and shown in FIG. 30B.

Step 4: Synthesis method of 2YGAPPA

A synthesis scheme of 2YGAPPA is shown in (C-8).

(C-8)

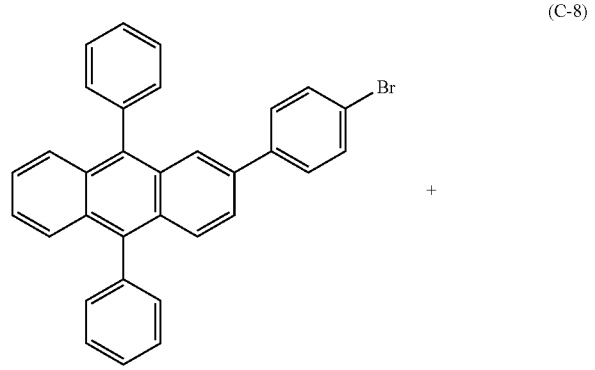

0.51 g of (1.1 mmol) of 2-(4-bromophenyl)-9,10-diphenylanthracene synthesized in Step 2, 0.20 g (2.1 mmol) of sodium tert-butoxide, 0.35 g (1.1 mmol) of 4-(carbazol-9-yl)diphenylamine (abbreviation: YGA) synthesized in Step 3, 0.02 g (0.04 mmol) of bis(dibenzylideneacetone)palladium (0) were put into a 50 mL three-neck flask, and the atmosphere in the flask was substituted by nitrogen. 10 mL of toluene and 0.02 mL of tri(tert-butyl)phosphine 10 wt % hexane solution were added into the mixture. This mixture was heated at 80° C. for 3 hours while being stirred, so that the mixture was reacted. After the reaction, toluene was added to the reacted mixture, and this suspension was subjected to suction filtration through Florisil (produced by Wako Pure Chemical Industries, Ltd., Catalog No. 540-00135), Celite (produced by Wako Pure Chemical Industries, Ltd., Catalog No. 531-16855), and alumina. The obtained filtrate was washed with water and saturated brine and magnesium sulfate was added into an organic layer for drying. The mixture was subjected to suction filtration to remove magnesium sulfate, and the obtained filtrate was concentrated to obtain a solid substance. The obtained solid substance was purified using a silica gel column chromatography (developing solvent was a mixed solvent of toluene:hexane=1:10 and developing solvent was a mixed solvent of toluene:hexane=1:5). The obtained fraction was concentrated to obtain a solid substance. The solid substance was recrystallized with a mixture solvent of dichloromethane and methanol, so that 0.51 g of a light yellow powdered solid substance was obtained in yield of 65%. By a nuclear magnetic resonance measurement (NMR), this compound was proved to be 2-(4-{N-[4-(carbazol-9-yl)phenyl]-N-phenylamino}phenyl)-9,10-diphenylanthracene (abbreviation: 2YGAPPA).

1.4 g of the obtained yellow solid substance was purified by train sublimation. The sublimation was performed under a low pressure of 7.0 Pa, the argon flow rate of 3 mL/min, at 333° C. and for 9 hours. 1.2 g of the solid substance was obtained in 86% yield.

Figure 31A:
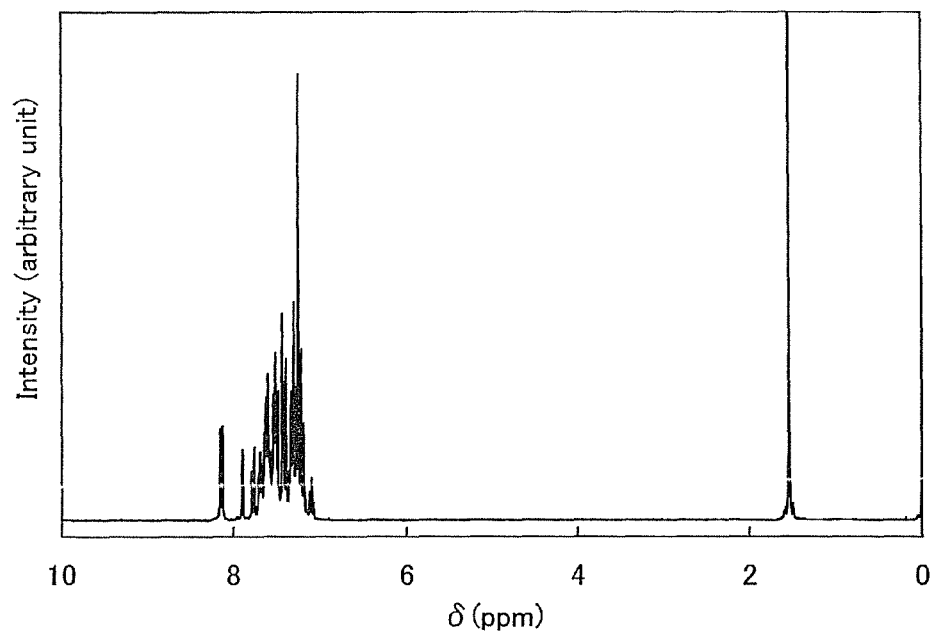
FIGS. 31A and 31B are graphs each showing a $^1$H NMR chart of 2-(4-{N-[4-carbazol-9-yl)phenyl]-N-phenylamino}phenyl)-9,10-diphenylantracene (abbreviation: 2YGAPPA)
Figure 31B:
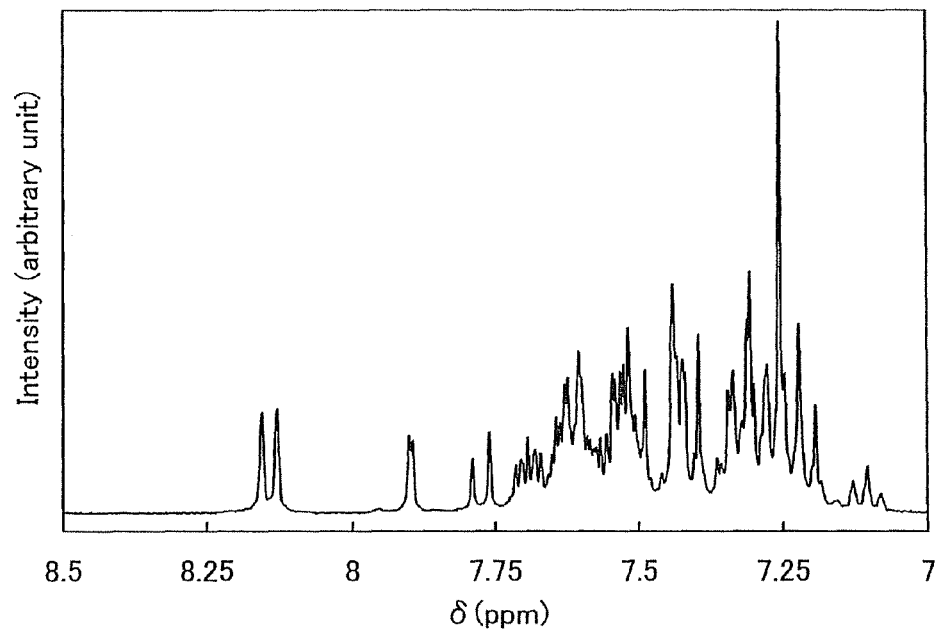

$^1$H NMR data of the obtained compound is shown below. $^1$H NMR (CDCl$_3$, 300 MHz): δ=7.06-7.15 (m, 1H), 7.17-7.74 (m, 33H), 7.78 (d, J=9.8 Hz, 1H), 7.90 (s, 1H), 8.14 (d, J=7.8 Hz, 2H). $^1$H NMR charts are shown in FIGS. 31A and 31B. Note that FIG. 31B is a chart in which the range of 7.0 ppm to 8.5 ppm in FIG. 31A is enlarged.

Figure 32:
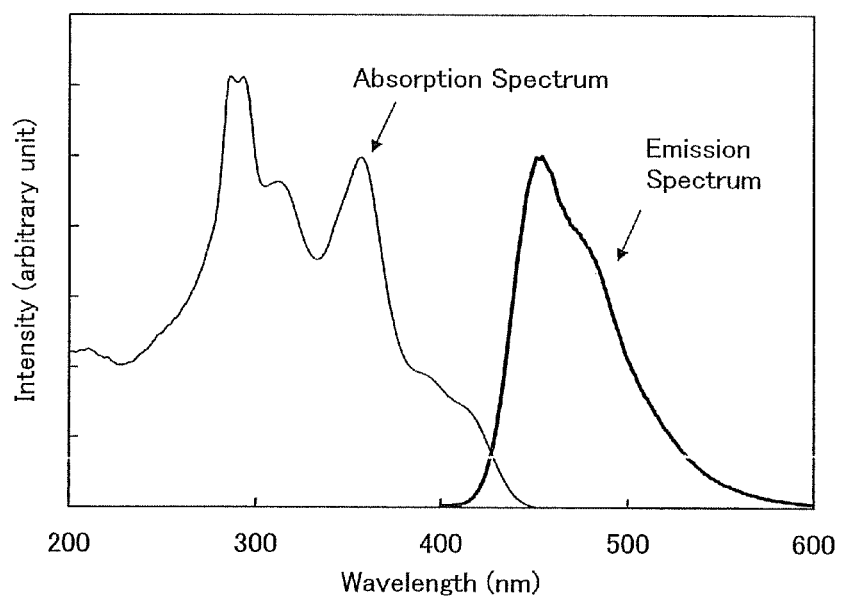
FIG. 32 is a graph showing an absorption spectrum and an emission spectrum of a toluene solution of 2-(4-{N-[4-carbazol-9-yl)phenyl]-N-phenylamino}phenyl)-9,10-diphenylantracene (abbreviation: 2YGAPPA)

FIG. 32 shows absorption spectrum and emission spectrum in a toluene solution of 2YGAPPA. An ultraviolet-visible spectrophotometer (V550, manufactured by Japan Spectroscopy Corporation) was used for measurement. The solution was put in a quartz cell and the absorption spectrum of the solution and the quartz cell was measured. The absorption spectrum of the solution which was obtained by subtracting the absorption spectrum of the quartz cell from the absorption spectrum of the solution and the quartz cell is shown in FIG. 32. In FIG. 32, the horizontal axis indicates a wavelength (nm) and the vertical axis indicates an absorption intensity (an arbitrary unit). In the case of the toluene solution, absorptions were observed at around 286 nm, 293 nm, 312 nm and 357 nm. In the case of the toluene solution, the maximum emission wavelength was 454 nm (excitation wavelength of 356 nm).

SYNTHESIS EXAMPLE 2

A synthesis method of 9-phenyl-9'-[4-(10-phenyl-9-anthryl)phenyl]-3,3'-bi(9H-carbazole) (abbreviation: PCCPA) is specifically described.

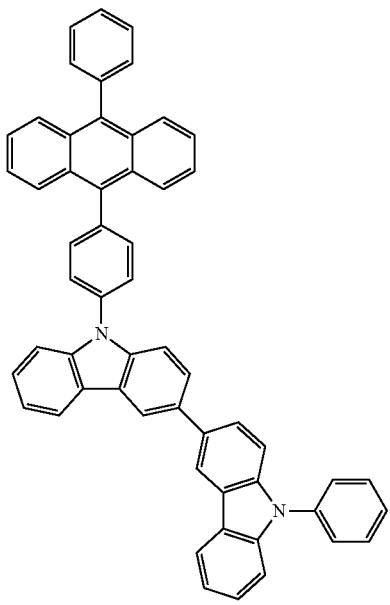

PCCPA

Step 1: Synthesis of 9-phenyl-3,3'-bi(9H-carbazole) (abbreviation: PCC)

A synthesis scheme of 9-phenyl-3,3'-bi(9H-carbazole)] (abbreviation: PCC)] is shown in (D-1).

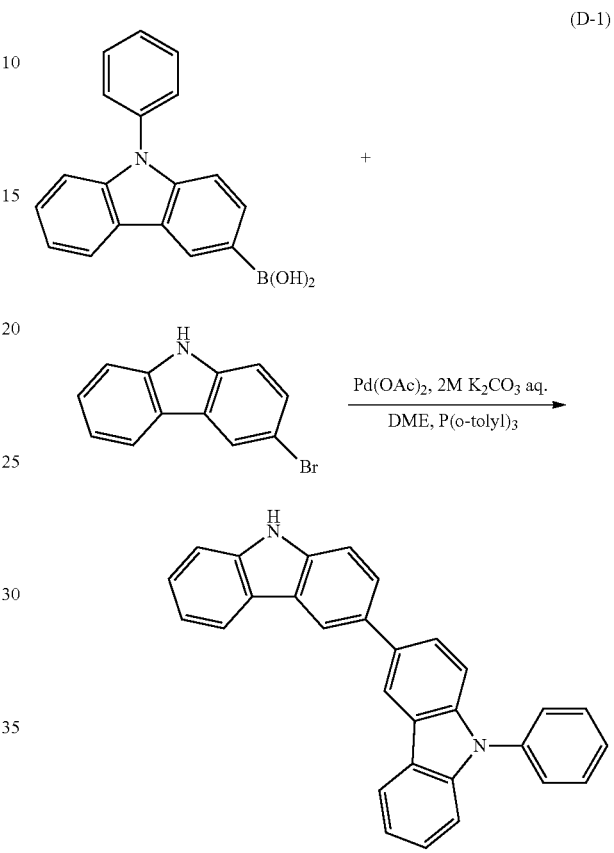

(D-1)

2.5 g (10 mmol) of 3-bromocarbazole, 2.9 g (10 mmol) of N-phenylcarbazol-3-boronic acid, and 152 mg (0.50 mmol) of tri(ortho-tolyl)phosphine were put into a 200 mL three-neck flask, and the atmosphere in the flask was substituted by nitrogen. 50 mL of dimethoxyethanol (DME) and 10 mL (2 mol/L) of an aqueous solution of potassium carbonate were added to this mixture. This mixture was stirred to be degassed while the pressure was reduced. After the degassing, 50 mg (0.2 mmol) of palladium acetate was added to the mixture. This mixture was stirred at 80° C. for 3 hours under a stream of nitrogen. After the stirring, approximately 50 mL of toluene was added to this mixture. The mixture was stirred for approximately 30 minutes and then washed with water and a saturated saline solution in this order. After the washing, an organic layer was dried with magnesium sulfate. This mixture was subjected to gravity filtration. The obtained filtrate was condensed to give an oily substance. The obtained oily substance was dissolved in toluene. This solution was subjected to suction filtration through Florisil (produced by Wako Pure Chemical Industries, Ltd., Catalog No. 540-00135), alumina, and celite (produced by Wako Pure Chemical Industries, Ltd., Catalog No. 531-16855). The obtained filtrate was concentrated to give 3.3 g of a white solid, which was the object of the synthesis, at a yield of 80%.

Figure 33:
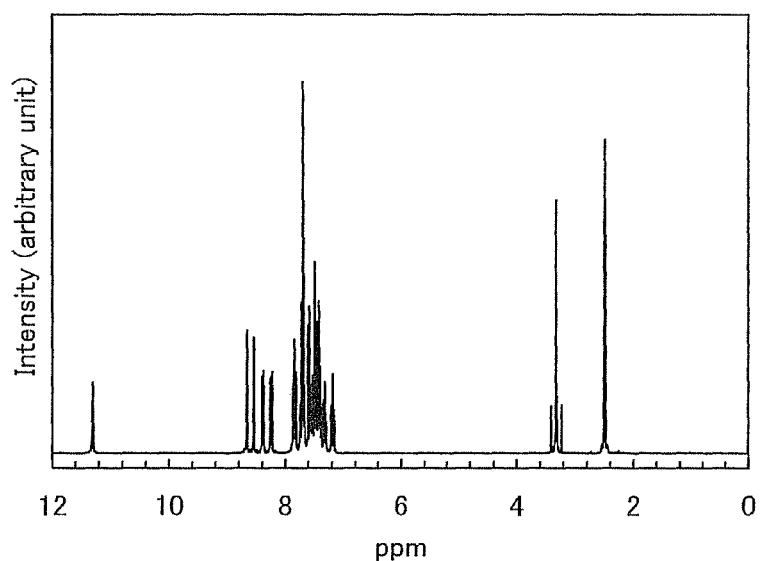
FIG. 33 is a graph showing a $^1$H NMR chart of 9-phenyl-3,3'-bi(9H-carbazole) (abbreviation: PCC)

Note that the solid obtained in the above Step 1 was analyzed by nuclear magnetic resonance measurement ($^1$H NMR). The measurement result is described below, and the $^1$H NMR chart is shown in FIG. 33. The measurement results show that PCC was obtained in this synthesis example.

$^1$H NMR (DMSO-$d_6$, 300 MHz): δ=7.16-7.21 (m, 1H), 7.29-7.60 (m, 8H), 7.67-7.74 (m, 4H), 7.81-7.87 (m, 2H), 8.24 (d, J=7.8 Hz, 1 H), 8.83 (d, J=7.8 Hz, 1H), 8.54 (d, J=1.5 Hz, 1H), 8.65 (d, J=1.5 Hz, 1H), 11.30(s, 1H).

Step 2: Synthesis of PCCPA

A synthesis scheme of PCCPA is shown in (D-2).

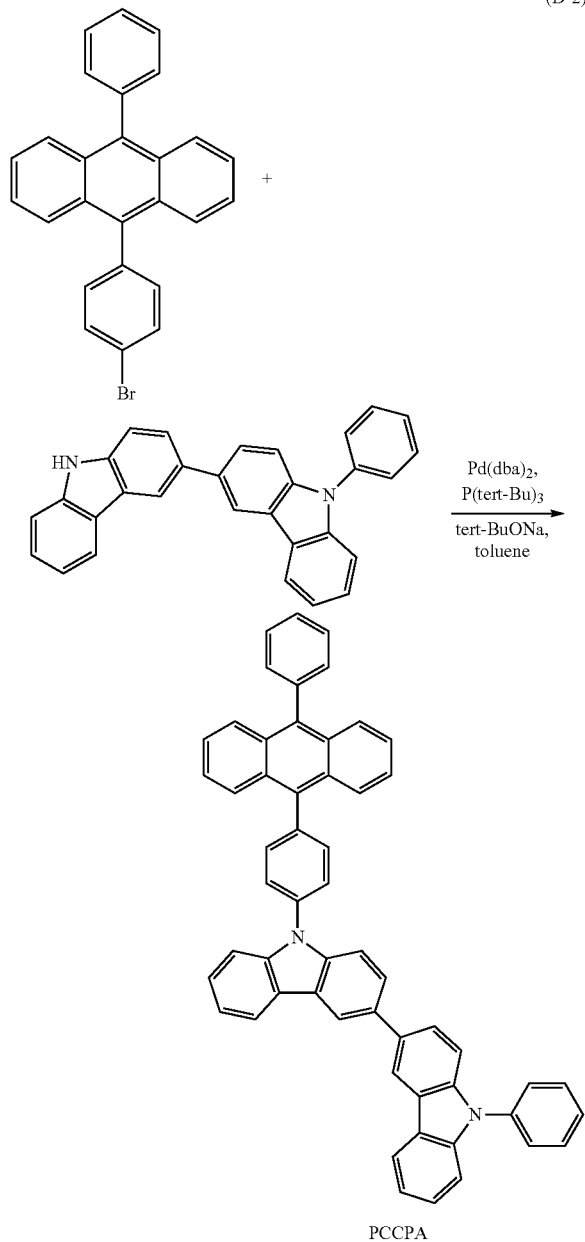

(D-2)

PCCPA 1.2 g (3.0 mmol) of 9-phenyl-10-(4-bromophenyl)anthracene, 1.2 g (3.0 mmol) of PCC, and 1.0 g (10 mmol) of sodium tert-butoxide were put into a 100 mL three-neck flask, and the atmosphere in the flask was substituted by nitrogen. 20 mL of toluene and 0.1 mL of tri(tert-butyl)phosphine (a 10 wt % hexane solution) were added to this mixture. This mixture was stirred to be degassed while the pressure was reduced. After the degassing, 96 mg (0.17 mmol) of bis(dibenzylideneacetone)palladium(0) was added to the mixture. This mixture was refluxed at 110° C. for 8 hours under a stream of nitrogen. After the reflux, approximately 50 mL of toluene was added to this mixture. The mixture was stirred for approximately 30 minutes and then washed with water and a saturated saline solution in this order. After the washing, the organic layer was dried with magnesium sulfate. This mixture was subjected to gravity filtration. The obtained filtrate was condensed to give an oily substance. The obtained oily substance was purified by silica gel column chromatography (a developing solvent was a mixed solvent of hexane:toluene=1:1). The obtained light yellow solid was recrystallized with chloroform/hexane to give 1.2 g of a light yellow powdered solid PCCPA, which was the object of the synthesis, at a yield of 54%. 2.4 g of the obtained light yellow powdered solid were sublimed and purified by train sublimation. For sublimation purification conditions, PCCPA was heated at 350 under a pressure of 8.7 Pa with a flow rate of argon gas of 3.0 mL/min. After the sublimation purification, 2.2 g of a light yellow solid PCCPA was obtained at a yield of 94%.

Figure 34:
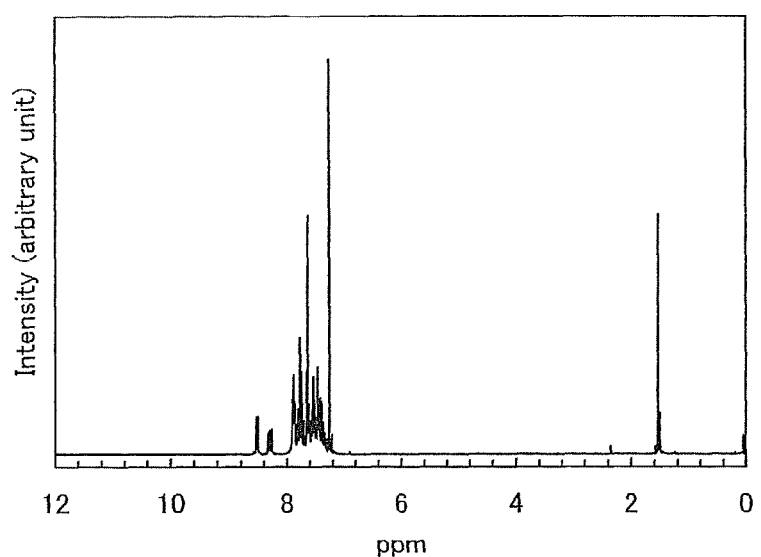
FIG. 34 is a graph showing a $^1$H NMR chart of 9-phenyl-9'-[4-(10-phenyl-9-anthryl)phenyl]-3,3'-bi(9H-carbazole) (abbreviation: PCCPA)

Note that the solid obtained in the above Step 2 was analyzed by $^1$H NMR. The measurement result is described below, and the $^1$H NMR chart is shown in FIG. 34. The measurement results show that PCCPA was obtained in this synthesis example.

$^1$H NMR (CDCl$_3$, 300 MHz): δ=7.34-7.91 (m, 32H), 8.27 (d, J=7.2 Hz, 1H), 8.31 (d, J=7.5 Hz, 1H), 8.52 (dd, J$_1$=1.5 Hz, J$_2$=5.4 Hz, 2H).

Figure 35:
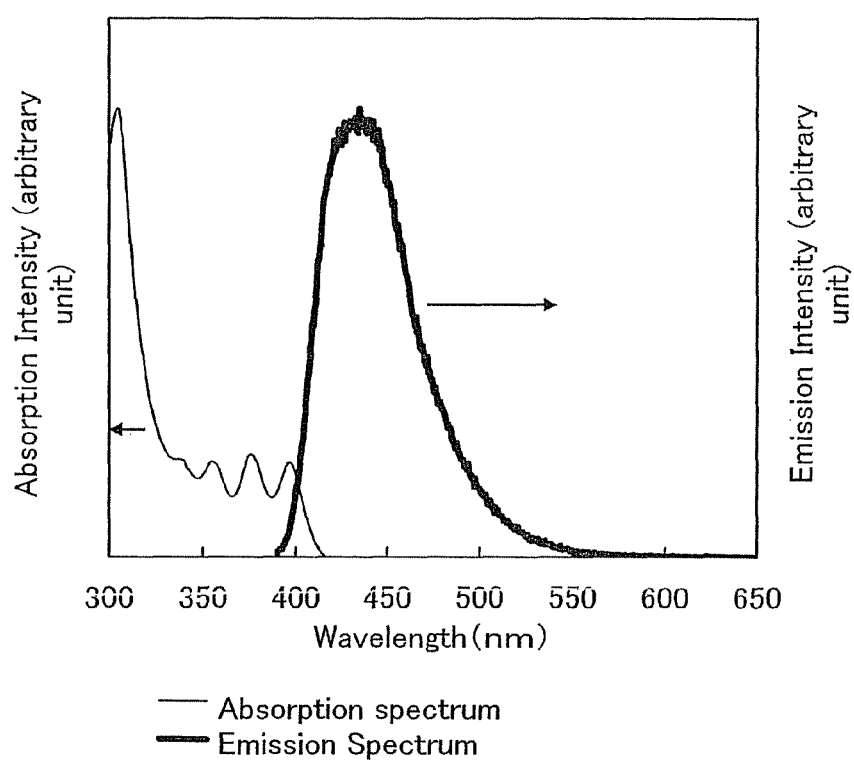
FIG. 35 is a graph showing an absorption spectrum and an emission spectrum of a toluene solution of 9-phenyl-9'-[4-(10-phenyl-9-anthryl)phenyl]-3,3'-bi(9H-carbazole) (abbreviation: PCCPA)
Figure 36:
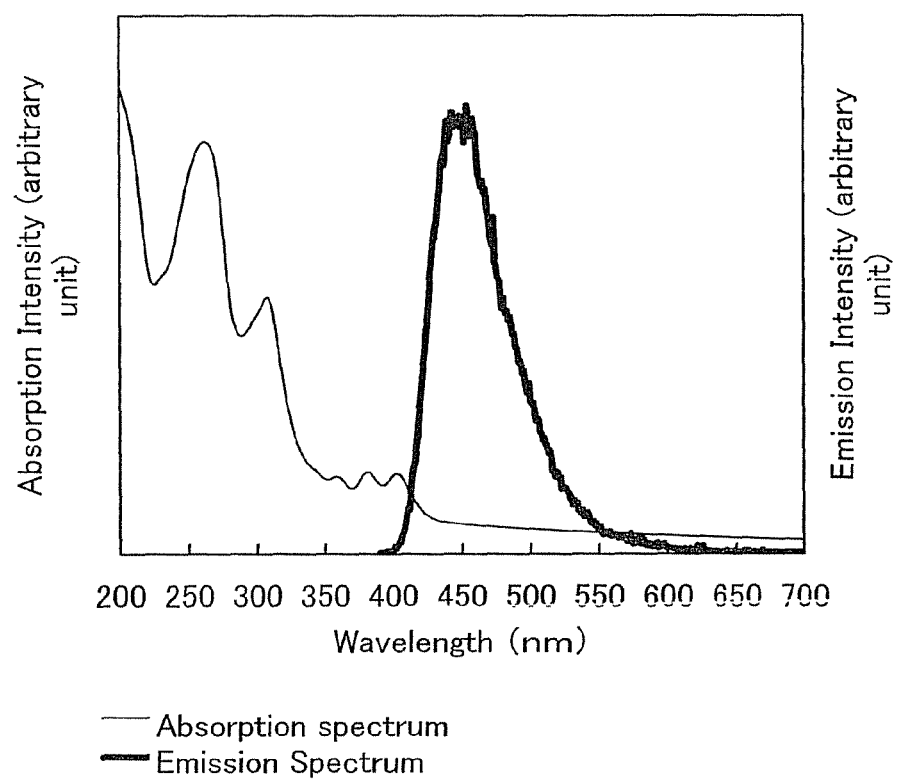
FIG. 36 is a graph showing an absorption spectrum and an emission spectrum of a thin film of 9-phenyl-9'-[4-(10-phenyl-9-anthryl)phenyl]-3,3'-bi(9H-carbazole) (abbreviation: PCCPA)

Next, an absorption spectrum of PCCPA was measured at room temperature using an ultraviolet-visible spectrophotometer (V-550, manufactured by Japan Spectroscopy Corporation) with the use of a toluene solution. An emission spectrum of PCCPA was measured at room temperature using a fluorescence spectrophotometer (FS920, manufactured by Hamamatsu Photonics Corporation) with the use of a toluene solution. The measurement results are shown in FIG. 35. Further, a thin film of PCCPA was similarly measured by film formation of PCCPA by an evaporation method. The measurement results are shown in FIG. 36. In each of FIG. 35 and FIG. 36, the horizontal axis indicates the wavelength (nm) and the vertical axis indicates a molar absorption coefficient absorption intensity (arbitrary unit) and an emission intensity (arbitrary unit).

From FIG. 35 and FIG. 36, the thin film of PCCPA has an emission peak at 454 nm, and the toluene solution thereof has an emission peak at 436 nm. Thus, it is found that PCCPA is suitable for use in a light-emitting element that emits blue light in particular.

SYNTHESIS EXAMPLE 3

A synthesis method of 4-(10-phenyl-9-anthryl)-4'-(9-phenyl-9H-carbazol-3-yl)triphenylamine (abbreviation: PCBAPA) is specifically described.

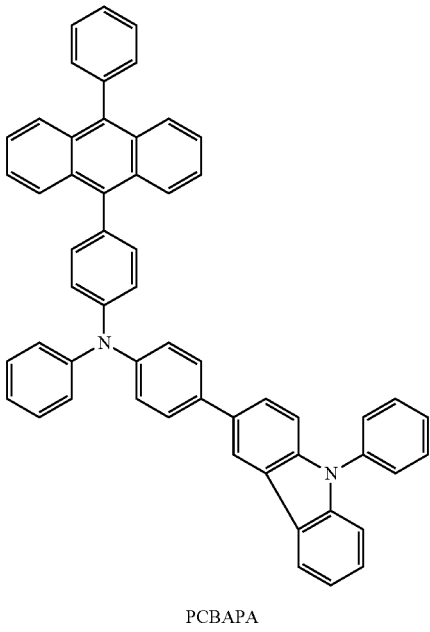

PCBAPA

Step 1: Synthesis of 9-phenyl-9H-carbazole-3-boronic acid

A synthesis scheme of 9-phenyl-9H-carbazole-3-boronic acid is shown in (E-1).

(E-1)

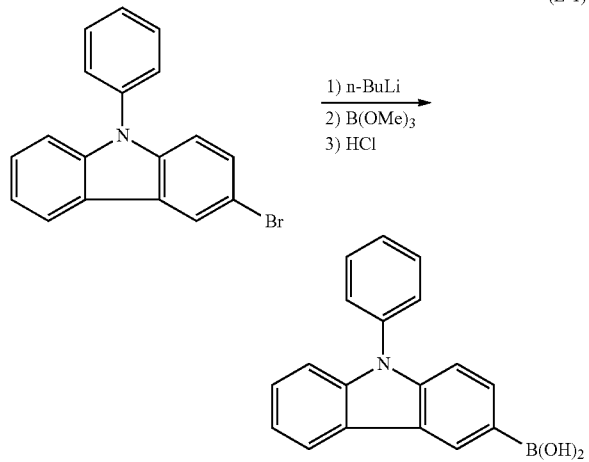

10 g (31 mmol) of 3-bromo-9-phenyl-9H-carbazole was put into a 500 mL three-neck flask, and the atmosphere in the flask was substituted by nitrogen. 150 mL of tetrahydrofuran (THF) were put into the flask, and 3-bromo-9-phenyl-9H-carbazole was dissolved therein. This solution was cooled to −80° C. 20 mL (32 mmol) of n-butyllithium (a 1.58 mol/L hexane solution) was dropped into this solution with a syringe. After the dripping was completed, this solution was stirred at the same temperature for 1 hour. After the stirring, 3.8 mL (34 mmol) of trimethyl borate were added to the solution, and the solution was stirred for approximately 15 hours while the temperature of the solution was being brought back to room temperature. After the stirring, approximately 150 mL (1.0 mol/L) of dilute hydrochloric acid were added to the solution, and then the solution was stirred for 1 hour. After the stirring, an aqueous layer of the mixture was extracted with ethyl acetate. The extract was combined with an organic layer and then washed with a saturated sodium hydrogen carbonate solution. The organic layer was dried with magnesium sulfate. After the drying, the mixture was subjected to gravity filtration. The obtained filtrate was condensed to give an oily light brown substance. The obtained oily substance was dried under reduced pressure to give 7.5 g of a light brown solid, which was the object of the synthesis, at a yield of 86%.

Step 2: Synthesis of 4-(9-phenyl-9H-carbazol-3-yl)diphenylamine (abbreviation: PCBA)

A synthesis scheme of 4-(9-phenyl-9H-carbazol-3-yl)diphenylamine (abbreviation: PCBA) is shown in (E-2).

(E-2)

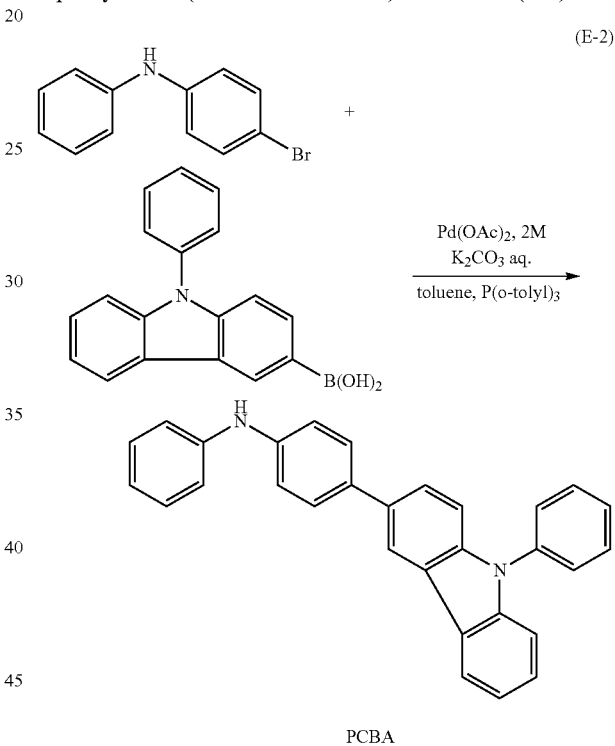

PCBA 6.5 g (26 mmol) of 4-bromo-diphenylamine, 7.5 g (26 mmol) of 9-phenyl-9H-carbazole-3-boronic acid, and 400 mg (1.3 mmol) of tri(o-tolyl)phosphine are put into a 500 mL three-neck flask, and the atmosphere in the flask was substituted by nitrogen. 100 mL of toluene, 50 mL of ethanol, and 14 mL (0.2 mol/L) of an aqueous solution of potassium carbonate were added to this mixture. Under reduced pressure, this mixture was degassed while being stirred. After the degassing, 67 mg (30 mmol) of palladium(II) acetate were added to the mixture. This mixture was refluxed at 100° C. for 10 hours. After the reflux, an aqueous layer of the mixture was extracted with toluene, and the extract was combined with an organic layer and then washed with a saturated saline solution. The organic layer was dried with magnesium sulfate. After the drying, this mixture was subjected to gravity filtration. The obtained filtrate was condensed to give an oily light brown substance. This oily substance was purified by silica gel column chromatography (a developing solvent was a mixed solvent of hexane:toluene=4:6). A white solid obtained after the purification was recrystallized with dichloromethane/hexane to give 4.9 g of a white solid, which was the object of the synthesis, at a yield of 45%.

Figure 37:
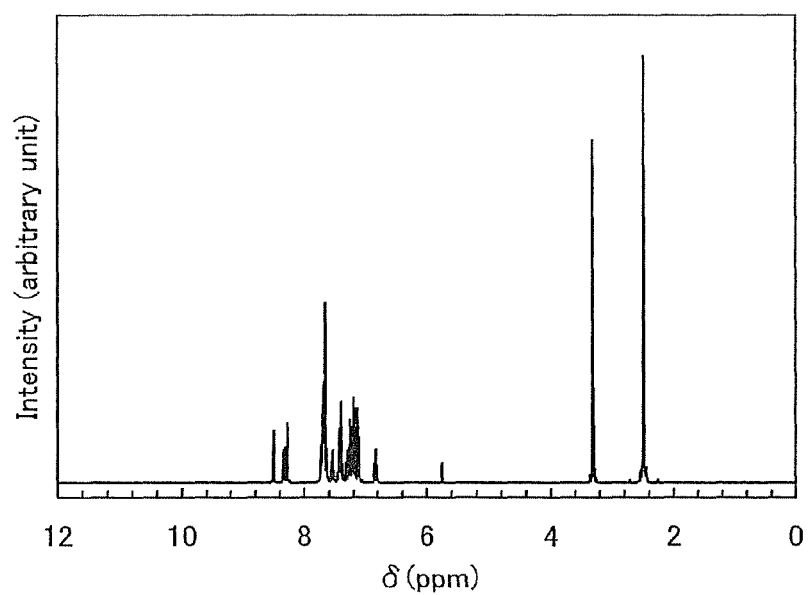
FIG. 37 is a graph showing a $^1$H NMR chart of 4-(9-phenyl-9H-carbazol-3-yl)diphenylamine (abbreviation: PCBA)

Note that the solid obtained in the above Step 2 was analyzed by nuclear magnetic resonance measurements ($^1$H NMR). The measurement results are described below, and the $^1$H NMR chart is shown in FIG. 37. The measurement results show that PCBA was obtained in this synthesis example.

$^1$H NMR (DMSO-d$_6$, 300 MHz): δ=6.81-6.86 (m, 1H), 7.12 (dd, J$_1$=0.9 Hz, J$_2$=8.7 Hz, 2H), 7.19 (d, J=8.7 Hz, 2H), 7.23-7.32 (m, 3H), 7.37-7.47 (m, 3H), 7.51-7.57 (m, 1H), 7.61-7.73 (m, 7H) 8.28 (s, 1H), 8.33 (d, J=7.2 Hz, 1H), 8.50 (d, J=1.5 Hz, 1H).

Step 3: Synthesis of PCBAPA

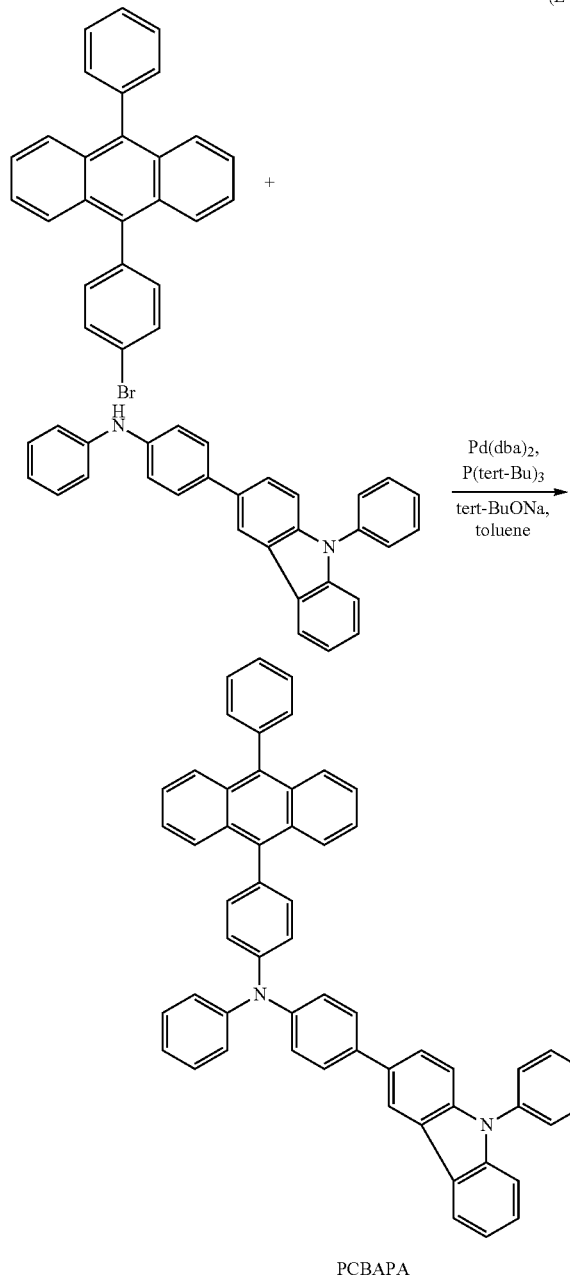

A synthesis scheme of PCBAPA is shown in (E-3). 7.8 g (12 mmol) of 9-(4-bromophenyl)-10-phenylanthracene, 4.8 g (12 mmol) of PCBA, and 5.2 g (52 mmol) of sodium tert-butoxide were put into a 300 mL three-neck flask, and the atmosphere in the flask was substituted by nitrogen. 60 mL of toluene and 0.30 mL of tri(tert-butyl)phosphine (a 10 wt % hexane solution) were added to this mixture. Under reduced pressure, this mixture was degassed while being stirred. After the degassing, 136 mg (0.24 mmol) of bis(dibenzylideneacetone)palladium(0) were added to the mixture. This mixture was stirred at 100° C. for 3 hours. After the stirring, approximately 50 mL of toluene were added to this mixture. The mixture was subjected to suction filtration through celite (produced by Wako Pure Chemical Industries, Ltd., Catalog No. 531-16855), alumina, and Florisil (produced by Wako Pure Chemical Industries, Ltd., Catalog No. 540-00135). The obtained filtrate was condensed to give a yellow solid. This solid was recrystallized with toluene/hexane to give 6.6 g of a light yellow powdered solid PCBAPA, which was the object of the synthesis, at a yield of 75%. Then, 3.0 g of the obtained light yellow powdered solid were sublimated and purified by train sublimation. For sublimation purification conditions, PCBAPA was heated at 350° C. under a pressure of 8.7 Pa with a flow rate of argon gas of 3.0 mL/min. After the sublimation purification, 2.7 g of a light yellow solid PCBAPA was obtained at a yield of 90%.

Figure 38:
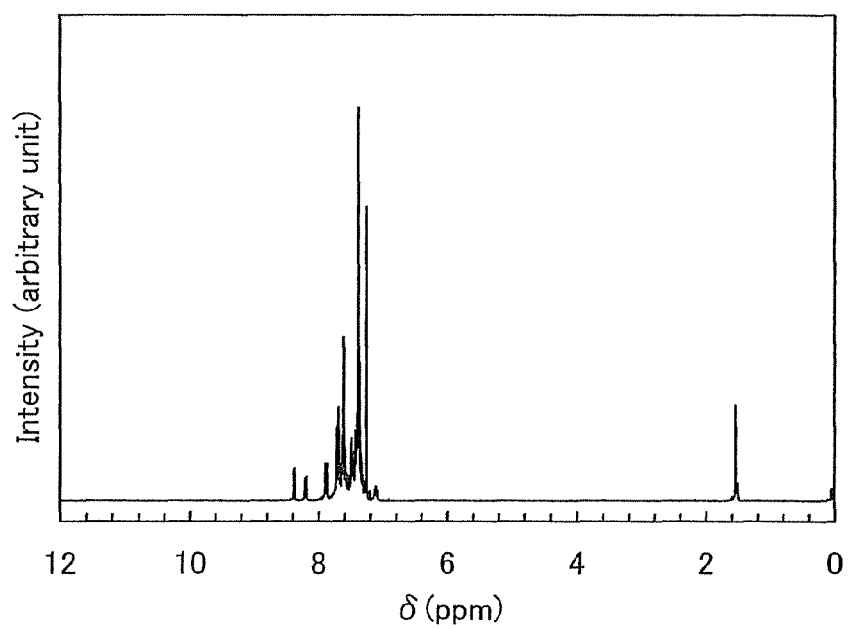
FIG. 38 is a graph showing a $^1$H NMR chart of 4-(10-phenyl-9-anthryl)-4'-(9-phenyl-9H-carbazol-3-yl)triphenylamine (abbreviation: PCBAPA)

Note that the solid obtained in the above Step 3 was analyzed by $^1$H NMR. The measurement results are described below, and the $^1$H NMR chart is shown in FIG. 38. The measurement results show that PCBAPA was obtained in this synthesis example.

$^1$H NMR (CDCl$_3$, 300 MHz): δ=7.09-7.14 (m, 1H), 7.28-7.72 (m, 33H), 7.88 (d, J=8.4 Hz, 2H), 8.19 (d, J=7.2 Hz, 1H), 8.37 (d, J=1.5 Hz, 1H).

Figure 39:
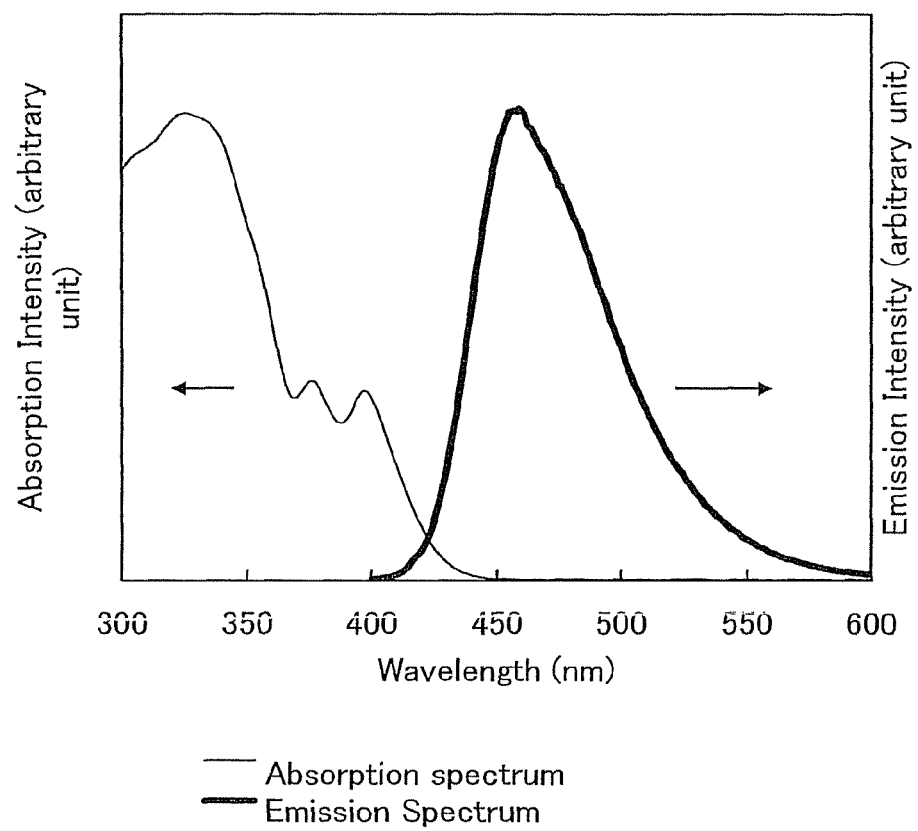
FIG. 39 is a graph showing an absorption spectrum and an emission spectrum of a toluene solution of 4-(10-phenyl-9-anthryl)-4'-(9-phenyl-9H-carbazol-3-yl)triphenylamine (abbreviation: PCBAPA)
Figure 40:
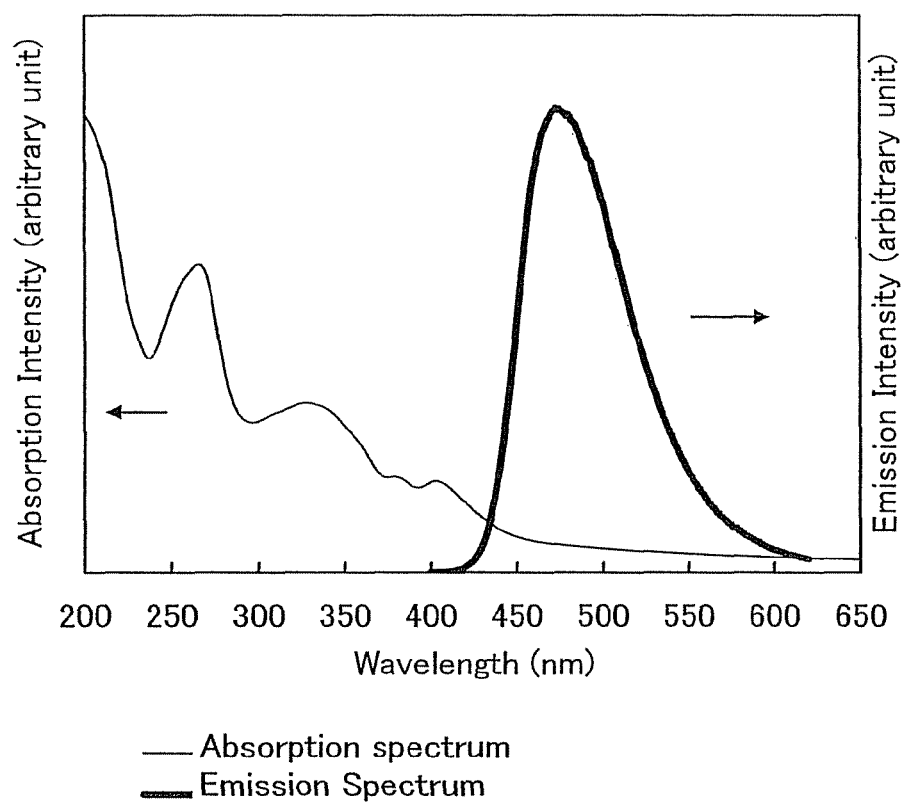
FIG. 40 is a graph showing an absorption spectrum and an emission spectrum of a thin film of 4-(10-phenyl-9-anthryl)-4'-(9-phenyl-9H-carbazol-3-yl)triphenylamine (abbreviation: PCBAPA)

Next, an absorption spectrum of PCCPA was measured at room temperature using an ultraviolet-visible spectrophotometer (V-550, manufactured by Japan Spectroscopy Corporation) with the use of a toluene solution. An emission spectrum of PCBAPA was measured at room temperature using a fluorescence spectrophotometer (FS920, manufactured by Hamamatsu Photonics Corporation) with the use of a toluene solution. The measurement results are shown in FIG. 39. Further, a thin film of PCBAPA was similarly measured by film formation of PCBAPA by an evaporation method. The measurement results are shown in FIG. 40. In each of FIG. 39 and FIG. 40, the horizontal axis indicates the wavelength (nm) and the vertical axis indicates an absorption intensity (arbitrary unit) and an emission intensity (arbitrary unit).

From FIG. 39 and FIG. 40, the toluene solution of PCBAPA has an emission peak at 459 nm, and the thin film thereof has an emission peak at 473 nm. Thus, it is found that PCBAPA emits blue light with high color purity.

The present application is based on Japanese Patent Application serial No. 2007-272227 filed with Japan Patent Office on Oct. 19, 2007, the entire contents of which are hereby incorporated by reference.

What is claimed is:
1. A method for manufacturing a light-emitting element comprising the steps of:
  forming a first layer comprising a first organic compound and a first light-emitting substance over an anode;
  forming a second layer comprising a second organic compound and the first light-emitting substance over and in contact with the first layer;

forming a third layer comprising the second organic compound and a second light-emitting substance over and in contact with the second layer; and forming a cathode over the third layer, wherein the first organic compound has a hole-transporting property, and wherein the second organic compound has an electron-transporting property.

2. The method for manufacturing the light-emitting element according to claim 1, further comprising a step of:

forming an hole injection layer comprising an organic compound having an hole transporting property and molybdenum oxide over the anode before forming the first layer.

3. The method for manufacturing the light-emitting element according to claim 1, wherein a content of the first organic compound in the first layer is greater than or equal to 50 wt. % and less than or equal to 99.9 wt. %, wherein a content of the second organic compound in the second layer is greater than or equal to 50 wt. % and less than or equal to 99.9 wt. %, and wherein a content of the second organic compound in the third layer is greater than or equal to 50 wt. % and less than or equal to 99.9 wt. %.

4. The method for manufacturing the light-emitting element according to claim 1, wherein each of the first layer, the second layer and the third layer is formed by co-evaporation method.

5. The method for manufacturing the light-emitting element according to claim 1, wherein a emission color of the first light-emitting substance and a emission color of the second light-emitting substance are complementary to each other.

6. The method for manufacturing the light-emitting element according to claim 1, wherein the first organic compound is tricyclic, tetracyclic, pentacyclic, or hexacyclic condensed aromatic compound.

7. The method for manufacturing the light-emitting element according to claim 1, wherein the first organic compound is anthracene derivative.

8. The method for manufacturing the light-emitting element according to claim 1, wherein a thickness of the second layer is greater than or equal to 1 nm and less than or equal to 20 nm.

9. The method for manufacturing the light-emitting element according to claim 1, wherein the first layer has a hole-transporting property and the second layer and the third layer have an electron-transporting property.

10. A method for manufacturing a light-emitting element comprising the steps of:

forming a first layer comprising a first organic compound and a first light-emitting substance over an anode;

forming a second layer comprising the first organic compound and a second light-emitting substance over and in contact with the first layer;

forming a third layer comprising a second organic compound and the second light-emitting substance over and in contact with the second layer; and forming a cathode over the third layer, wherein the first organic compound has a hole-transporting property, and wherein the second organic compound has an electron-transporting property.

11. The method for manufacturing the light-emitting element according to claim 10, further comprising a step of:

forming an hole injection layer comprising an organic compound having an hole transporting property and molybdenum oxide over the anode before forming the first layer.

12. The method for manufacturing the light-emitting element according to claim 10, wherein each of the first layer, the second layer and the third layer is formed by co-evaporation method.

13. The method for manufacturing the light-emitting element according to claim 10, wherein a content of the first organic compound in the first layer is greater than or equal to 50 wt. % and less than or equal to 99.9 wt. %, wherein a content of the first organic compound in the second layer is greater than or equal to 50 wt.% and less than or equal to 99.9 wt. %, and wherein a content of the second organic compound in the third layer is greater than or equal to 50 wt. % and less than or equal to 99.9 wt. %.

14. The method for manufacturing the light-emitting element according to claim 10, wherein a emission color of the first light-emitting substance and a emission color of the second light-emitting substance are complementary to each other.

15. The method for manufacturing the light-emitting element according to claim 10, wherein the first organic compound is tricyclic, tetracyclic, pentacyclic, or hexacyclic condensed aromatic compound.

16. The method for manufacturing the light-emitting element according to claim 10, wherein the first organic compound is anthracene derivative.

17. The method for manufacturing the light-emitting element according to claim 10, wherein a thickness of the second layer is greater than or equal to 1 nm and less than or equal to 20 nm.

18. The method for manufacturing the light-emitting element according to claim 10, wherein the first layer and the second layer have a hole-transporting property and the third layer has an electron-transporting property.

* * * * *

UNITED STATES PATENT AND TRADEMARK OFFICE
CERTIFICATE OF CORRECTION

PATENT NO. : 8,251,765 B2
APPLICATION NO. : 13/272715
DATED : August 28, 2012
INVENTOR(S) : Takahiro Ushikubo and Satoshi Seo It is certified that error appears in the above-identified patent and that said Letters Patent is hereby corrected as shown below:

Column 13, Line 36; Change "DMA" to --DPhPA--.

Column 14, Lines 45-46; Change "ni-MIDAB" to --ni-MTDAB--.

Column 15, Lines 21-22; Change
"bis[2-(4',6'-difluorophenyl)pyridinato-N,$C^{2'}$]iridium(III)tetrakis(1-pyrazolypborate" to
--bis[2-(4',6'-difluorophenyl)pyridinato-N,$C^{2'}$]iridium(III)tetrakis(1-pyrazoly)borate--.

Column 15, Lines 22-23; Change
"bis[2-(4',6'-difluorophenyl)pyridinato-N,$C^{2'}$]ridium(III)picolinate" to
--bis[2-(4',6'-difluorophenyl)pyridinato-N,$C^{2'}$]iridium(III)picolinate--.

Column 15, Lines 37-38; Change
"bis[2-(3',5'-bistrifluoromethylphenyl)-pyridinato-N,$C^{2'}$]iridium(M)picolinate" to
--bis[2-(3',5'-bistrifluoromethylphenyl)-pyridinato-N,$C^{2'}$]iridium(III)picolinate--.

Column 18, Lines 66-67; Change
"3-[N-(1-naphthyl)-N-(9-phenylcarbazol-3-ypamino]-9-phenylcarbazole" to
--3-[N-(1-naphthyl)-N-(9-phenylcarbazol-3-yl)amino]-9-phenylcarbazole--.

Column 19, Line 32; Change "nz-MTDAB" to --m-MTDAB--.

Column 19, Line 49; Change "2,5,8,11-tetra(tert-butyl]perylene" to
--2,5,8,11-tetra(tert-butyl)perylene--.

Column 19, Lines 49-50; Change "nentacene" to --pentacene--.

Column 25, Line 22; Change "foamed over" to --formed over--.

Signed and Sealed this
Twenty-seventh Day of November, 2012

David J. Kappos
*Director of the United States Patent and Trademark Office*

CERTIFICATE OF CORRECTION (continued)
U.S. Pat. No. 8,251,765 B2

Column 25, Line 44; Change "foamed over" to --formed over--.

Column 34, Line 1; Change "polymide film" to --polyimide film--.

Column 34, Line 3; Change "for fanning" to --for forming--.

Column 41, Line 13; Change "to for in" to --to form--.

Column 44, Line 2; Change "which is Mimed of" to --which is formed of--.

Column 45, Line 32; Change "example of a)" to --example of a--.

Column 46, Line 32; Change "to fin in" to --to form--.